United States Patent
Budhraja et al.

(10) Patent No.: US 7,233,843 B2
(45) Date of Patent: Jun. 19, 2007

(54) REAL-TIME PERFORMANCE MONITORING AND MANAGEMENT SYSTEM

(75) Inventors: Vikram S. Budhraja, Los Angeles, CA (US); James D. Dyer, La Mirada, CA (US); Carlos A. Martinez Morales, Upland, CA (US)

(73) Assignee: Electric Power Group, LLC, Pasadena, CA (US)

(*) Notice: Subject to any disclaimer, the term of this patent is extended or adjusted under 35 U.S.C. 154(b) by 0 days.

(21) Appl. No.: 10/914,789

(22) Filed: Aug. 9, 2004

(65) Prior Publication Data

US 2005/0033481 A1 Feb. 10, 2005

Related U.S. Application Data

(60) Provisional application No. 60/527,099, filed on Dec. 3, 2003, provisional application No. 60/493,526, filed on Aug. 8, 2003.

(51) Int. Cl.
*G06F 19/00* (2006.01)
*G06F 15/173* (2006.01)

(52) U.S. Cl. .................................. 700/291; 709/224

(58) Field of Classification Search ........ 709/217–219, 709/223–225, 249; 700/83, 286, 291, 297; 702/60–62, 179–185; 703/18; 715/965, 715/969

See application file for complete search history.

(56) References Cited

U.S. PATENT DOCUMENTS

| | | | |
|---|---|---|---|
| 6,055,163 A * | 4/2000 | Wagner et al. ................. 363/37 |
| 6,516,326 B1 * | 2/2003 | Goodrich et al. ......... 707/104.1 |
| 6,553,418 B1 * | 4/2003 | Collins et al. ............... 709/224 |
| 6,653,821 B2 * | 11/2003 | Kern et al. ..................... 322/7 |
| 6,681,154 B2 * | 1/2004 | Nierlich et al. ............. 700/286 |
| 6,728,601 B2 * | 4/2004 | Garcia et al. ............... 700/286 |
| 6,732,019 B2 * | 5/2004 | Spool et al. ................. 700/291 |
| 6,751,562 B1 | 6/2004 | Blackett et al. |
| 6,771,058 B2 * | 8/2004 | Lapinksi et al. ......... 324/117 R |
| 6,778,882 B2 * | 8/2004 | Spool et al. ................. 700/295 |
| 6,801,940 B1 * | 10/2004 | Moran et al. ................ 709/224 |
| 6,912,889 B2 * | 7/2005 | Staphanos et al. ......... 73/23.31 |

(Continued)

OTHER PUBLICATIONS

Power World Corporation, "Power Systems, Transmission Systems, Analysis, Visualization and Expertise." (Product Brochure), no date.

(Continued)

*Primary Examiner*—M. N. Von Buhr
(74) *Attorney, Agent, or Firm*—Christie, Parker & Hale, LLP.

(57) ABSTRACT

A real-time performance monitoring system for monitoring an electric power grid. The electric power grid has a plurality of grid portions, each grid portion corresponding to one of a plurality of control areas. The real-time performance monitoring system includes a monitor computer for monitoring at least one of reliability metrics, generation metrics, transmission metrics, suppliers metrics, grid infrastructure security metrics, and markets metrics for the electric power grid. The data for metrics being monitored by the monitor computer are stored in a data base, and a visualization of the metrics is displayed on at least one display computer having a monitor. The at least one display computer in one said control area enables an operator to monitor the grid portion corresponding to a different said control area.

24 Claims, 41 Drawing Sheets

U.S. PATENT DOCUMENTS

| | | | |
|---|---|---|---|
| 6,983,640 B1* | 1/2006 | Staphanos et al. | 73/23.31 |
| 7,105,946 B2* | 9/2006 | Akiyama et al. | 307/16 |
| 2001/0040446 A1* | 11/2001 | Lapinksi et al. | 324/126 |
| 2002/0036430 A1* | 3/2002 | Welches et al. | 307/18 |
| 2002/0103655 A1* | 8/2002 | Boies et al. | 705/1 |
| 2002/0134083 A1* | 9/2002 | Staphanos et al. | 60/698 |
| 2002/0190527 A1* | 12/2002 | Kern et al. | 290/40 B |
| 2003/0098683 A1* | 5/2003 | Lapinksi et al. | 324/117 R |
| 2003/0174070 A1* | 9/2003 | Garrod et al. | 340/870.07 |
| 2003/0193405 A1* | 10/2003 | Hunt et al. | 340/870.02 |
| 2004/0095237 A1* | 5/2004 | Chen et al. | 340/506 |
| 2004/0158360 A1* | 8/2004 | Garland et al. | 700/286 |
| 2004/0158417 A1* | 8/2004 | Bonet | 702/57 |
| 2004/0236620 A1* | 11/2004 | Chauhan et al. | 705/9 |
| 2005/0021742 A1* | 1/2005 | Yemini et al. | 709/224 |
| 2005/0072220 A1* | 4/2005 | Staphanos et al. | 73/116 |
| 2005/0188745 A1* | 9/2005 | Staphanos et al. | 73/23.31 |

OTHER PUBLICATIONS

Thomas J. Overbye, et al., "Human Factors Analysis of Power System Visualizations," Proceedings of the 34th Hawaii International Conference on System Sciences—2001, pp. 1-6.

Douglas A. Wiegmann, et al., "Human Factors Aspects of Power System Voltage Visualizations," Proceedings of the 35th Hawaii International Conference on System Sciences—2002, 6 pages.

AVS Advanced Visual Systems; www.avs.com/overview.html, 2 pages, 2004.

C. H. Wells, et al., "Real time Grid Stability Calculations at Entergy," pp. 1-7, no date.

Ioni Fernando, et al., "Real Time Online Evaluation of Small Signal System Damping Applied to Power System Stabilizer Commissioning and Testing," International Conference on Power Systems Transients—IPST 2003 in New Orleans, USA, pp. 1-6.

Psymetrix Limited, "Stability Analysis & Blackout Prevention—Eastern USA Blackout 2003," 2 pages, 2003.

Psymetrix Limited, "Power System Security Management—Technical Briefing," 2 pages, 2003.

Tom Anderson, et al., "Validation of On-Line Power System Dynamics Measurements," pp. 4-9, IEEE 1999.

J. Bertsch, et al., "Experiences with and Perspectives of the System for Wide Area Monitoring of Power Systems (Ref. Nr. 103)," pp. 5-9, no date.

Douglas A. Voda, "Keeping Tabs, Utilities Adopting Wide Area Monitoring Systems," Energy, pp. 9-11, no date.

ABB Switzerland, Edition Feb. 2004, 34 pages.

Brian Johnson, "PCT International Search Report," Aug. 4, 2005.

* cited by examiner

REAL-TIME PERFORMANCE MONITORING AND MANAGEMENT SYSTEM

CROSS-REFERENCE TO RELATED APPLICATION(S)

This application claims priority to and the benefit of U.S. Provisional Patent Application No. 60/493,526 filed Aug. 8, 2003 and U.S. Provisional Patent Application No. 60/527,099 filed Dec. 3, 2003, the entire contents of both of which are incorporated herein by reference.

STATEMENT REGARDING FEDERALLY SPONSORED RESEARCH OR DEVELOPMENT

This invention was made partially with government support under Department of Energy Contract # DE-AC03-76SF00098, Subcontract # 6508899. The Government has certain rights in this invention.

FIELD OF THE INVENTION

The present invention relates generally to a monitoring and management platform, and more particularly to a real-time performance monitoring and prediction system that has wide applicability to various industries and processes.

BACKGROUND

In various industries, the ability to monitor, track, predict and/or act in real-time is desirable. These industries include electric power, gas pipeline, water systems, transportation, chemicals and processes, infrastructure protection, security monitoring and others.

By way of example, in the electric power industry, power is typically supplied to customers in a four stage process of generation, transmission, distribution and end use. FIG. 1A illustrates a typical process of generation, transmission and distribution of electricity. As illustrated in FIG. 1A, the electricity is generated competitively by a number of power plants. The electricity is then transmitted through a number of transmission lines that are regulated by the Federal Energy Regulatory Commission (FERC). These transmission lines, which may be located in different states, are typically owned by the utility or transmission companies, and controlled by regional Independent System Operators (ISOs), Regional Transmission Organizations (RTOs) or utility companies that may be private or public. The generation and transmission of electricity are usually managed by regional entities that monitor the grid operations, market operations, security and other aspects of the electric power system.

The transmitted electricity is typically distributed through state or locally regulated distribution companies. The transmission and distribution systems utilize a number of devices for management and control of the electric system, including dynamic voltage support, remedial action schemes, capacitors, storage and flow control devices. The electricity is distributed to the customers as the end users, or consumers of electricity. Some of the customers may also have micro-grids of their own. The demand placed by these customers also needs to be managed.

Due to the enormous task at hand, there are a number of organizations responsible for overseeing these power generation, transmission and distribution activities. For example, there are over 3,000 utilities, thousands of generators, 22 Reliability Coordinators, and 153 Control Areas (CAs) in the United States for monitoring and control of generation, transmission and distribution of electricity. While all these different entities at various different levels are involved in generation, transmission and distribution of electricity as well as monitoring and control in a power grid, there is no single integrated system that can be used to monitor and manage the electric power grid in real-time across all of the different elements of the power system. For example, there is no information management system for the power grid, which is integrated across multiple business systems, companies and Control Areas to manage the security, timeliness, accuracy or accessibility of information for grid operations, reliability, market operations and system security. Analogous issues may be apparent in other industries.

SUMMARY

In an exemplary embodiment according to the present invention, a real-time performance monitoring, management and prediction platform is provided. Systems based on the platform may be used to manage processes in various industries, based on current monitoring tools as well as tools that are under development, for example, in smart, switchable networks. Systems based on the platform preferably include visualization features that enable managers and operators in various industries to: measure key system operating and market metrics; monitor and graphically represent system performance, including proximity to potential system faults; track, identify and save data on abnormal operating patterns; and predict system response in near real-time by means of simulations and predictive analysis.

In one exemplary application of the present invention, a power grid monitoring and management system is provided. The power grid monitoring and management system includes a technology platform for real-time performance monitoring application for the electric power grid. The power grid monitoring and management system in one exemplary embodiment may also be referred to as a Grid Real-Time Performance Monitoring and Prediction Platform (Grip-3P™). The Grid-3P platform is designed to enable monitoring of a range of electric grid parameters, including metrics for reliability, markets, generation, transmission, operation, and security. The visualization features enable display of information geographically and graphically; in real time; and enables operators to define display levels—local or wide area, control area, interconnection or other user defined manner. This technology is being used to develop and implement real-time performance monitoring applications at Reliability Coordinator and Independent System Operator (ISO) locations, including the following applications: Area Control Error (ACE)-Frequency Real-Time Monitoring System; Control Area and Supplier's Performance for Automatic Generation Control and Frequency Response Services System; VAR-Voltage Management and Monitoring System; and Monitoring Applications based on Synchronized Phasor Measurements.

Examples of electric grid system components and metrics that could be monitored include electric interconnections, generators, voltage levels, frequency, market prices, congestion, market power metrics, demand forecasts, and other system components and metrics.

Another feature of the Grid-3P platform is the concept of multi-panel displays that allow: real-time monitoring of key metrics; display of history and performance tracking of key metrics; performing sensitivity evaluations and assessments of key metrics under alternative scenarios, and developing predictions or near term forecasts of performance; and initiating actions, such as providing e-mail notification for alerting operators about abnormal conditions and the need to take action.

The power grid monitoring and management system may operate in a web environment, client-server, dedicated server, and/or secure proprietary network. In addition, the power grid monitoring and management system may allow interactive historical data collection and to present the collected data in tabular and/or specialized data-visuals. Further, the power grid monitoring and management system may be used to create interactive data reports from grid performance historical data saved in data-servers.

In an exemplary embodiment according to the present invention, a real-time performance monitoring system monitors an electric power grid having a plurality of grid portions, each said grid portion corresponding to one of a plurality of control areas. A monitor computer monitors at least one of reliability metrics, generation metrics, transmission metrics, suppliers metrics, grid infrastructure security metrics, and markets metrics for the electric power grid. A database stores the metrics being monitored by the monitor computer, and at least one display computer has a monitor for displaying a visualization of the metrics being monitored by the monitor computer. Said at least one display computer in one said control area enables an operator to monitor a said grid portion corresponding to a different said control area.

In another exemplary embodiment according to the present invention, a method of monitoring a performance of an electric power grid in substantially real-time is provided. The electric power grid has a plurality of grid portions, each said grid portion corresponding to one of a plurality of control areas. A monitor computer is used to monitor at least one of reliability metrics, generation metrics, transmission metrics, suppliers metrics, grid infrastructure security metrics, and markets metrics for the electric power grid. The metrics being monitored by the monitor computer is stored in a database, and a visualization of the metrics being monitored by the monitor computer is displayed on a monitor of at least one display computer. Said at least one display computer in one said control area enables an operator to monitor a said grid portion corresponding to a different said control area.

These and other aspects of the invention will be more readily comprehended in view of the discussion herein and accompanying drawings, in which like reference numerals designate like elements.

DETAILED DESCRIPTION

Figure 1A:
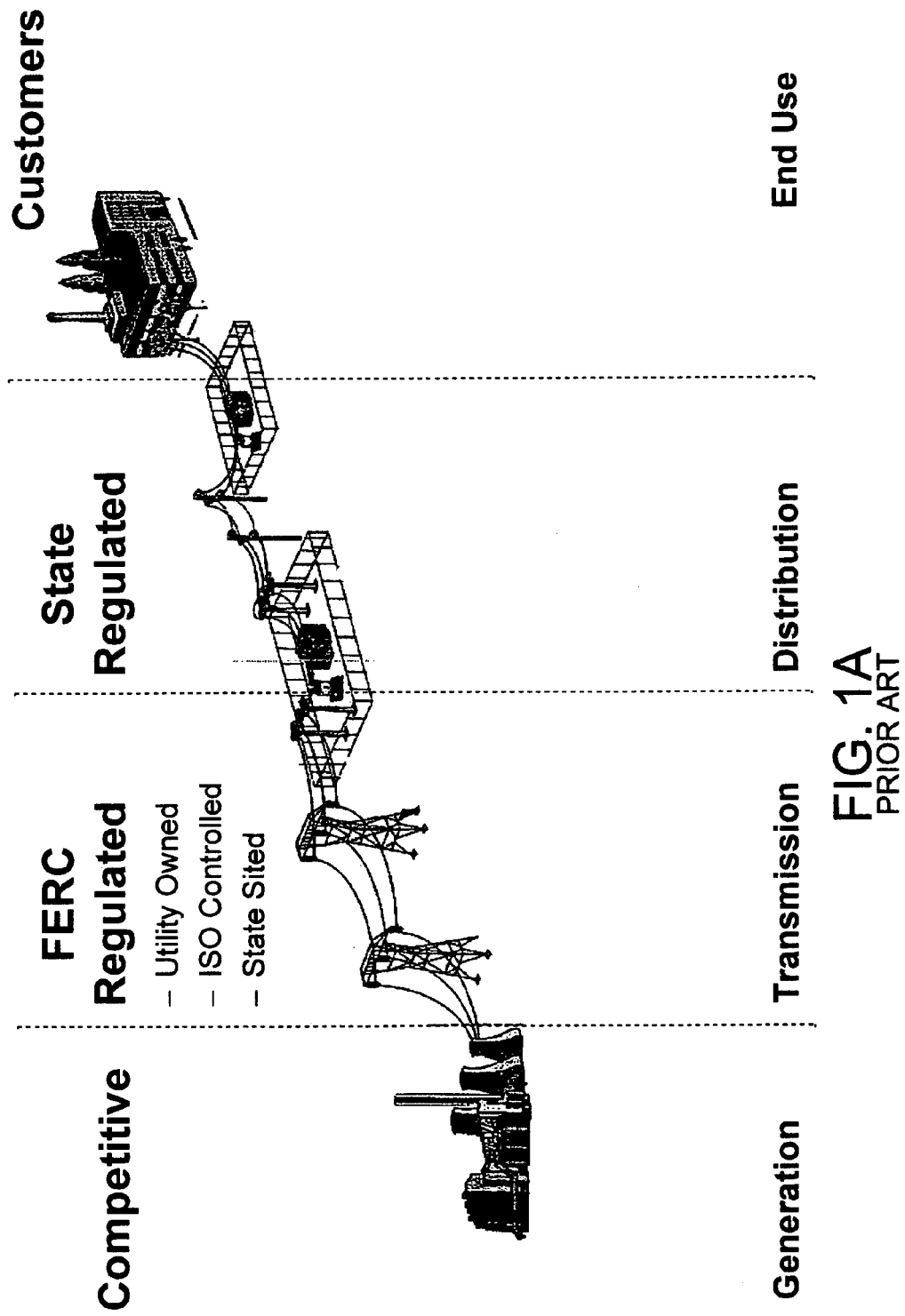
FIG. 1A illustrates a typical process of generation, transmission and distribution of electricity.
Figure 1B:
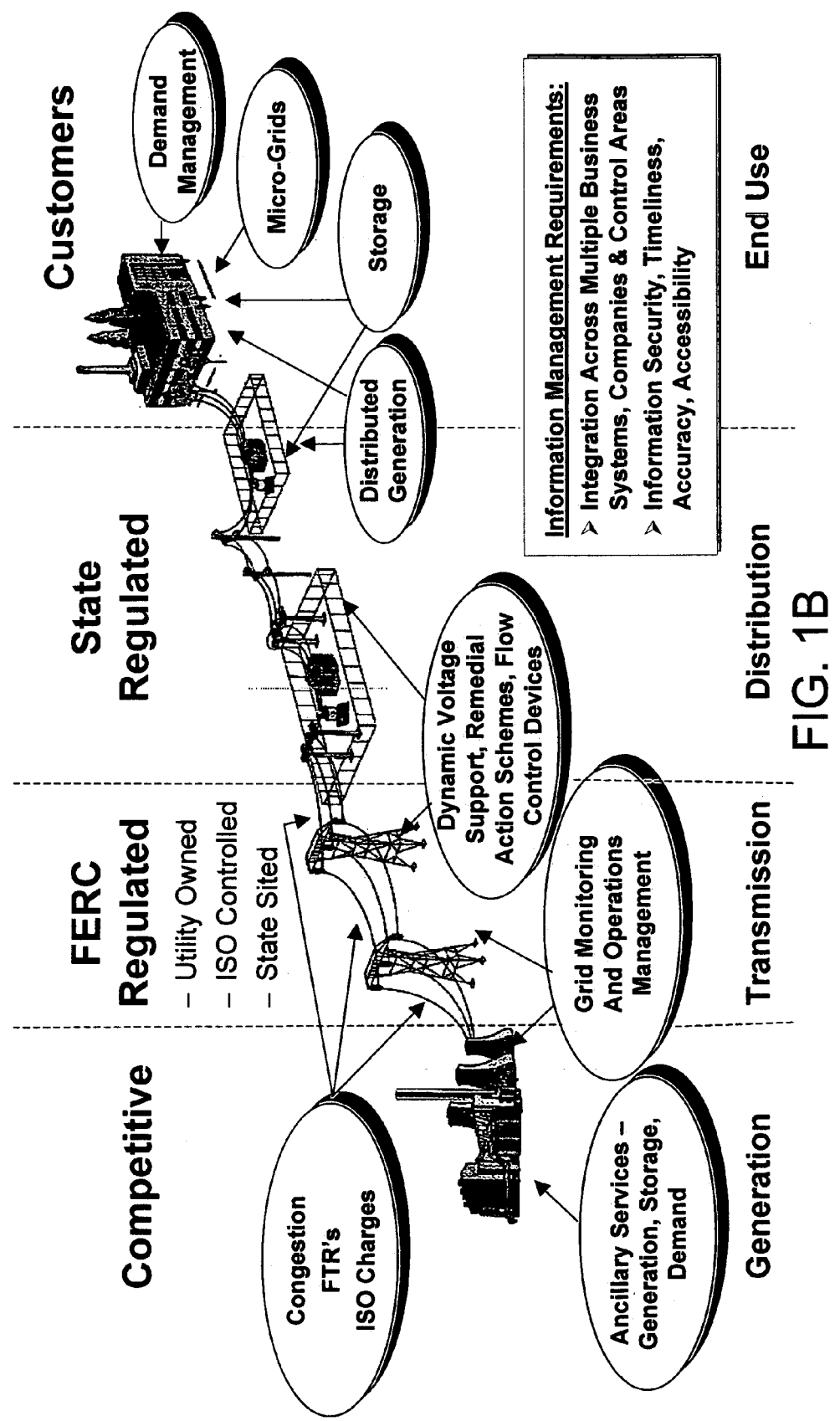
FIG. 1B illustrates a process of generation, transmission and distribution of electricity, and a set of exemplary information management requirements according to the present invention.

Referring to FIG. 1B, a set of exemplary information management requirements for the present invention may include: integration across multiple business system, companies and CAs; and information security, timeliness, accuracy, and accessibility.

Figure 2A:
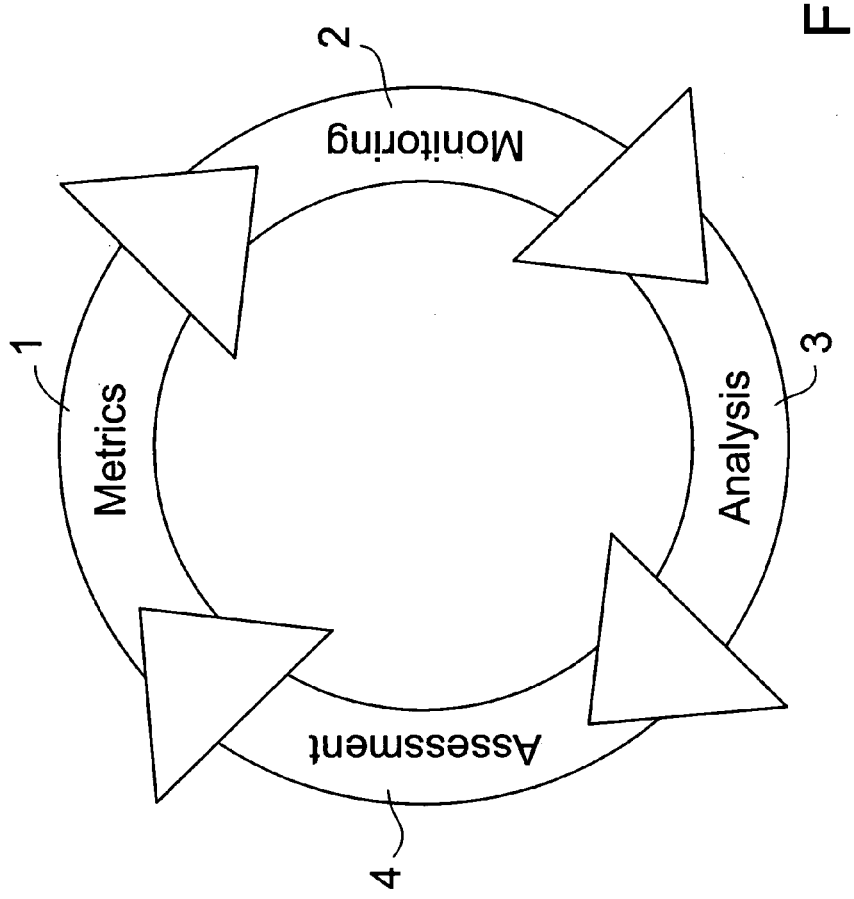
FIG. 2A is a block diagram that illustrates an exemplary performance management strategy according to the present invention.

Referring to FIG. 2A, an exemplary performance management strategy according to the present invention contemplates identification of key metrics 1, monitoring 2, analysis 3 and assessment 4. Utilizing the platform and system described herein, the strategy may be beneficially employed for a wide variety of industries and processes, including without limitation, electric power, gas pipeline, water systems, transportation, chemicals and processes, infrastructure protection, security monitoring and others.

According to an exemplary embodiment of the present invention, a wide area reliability monitoring center (WARMC) provides a visibility to system conditions across control area boundaries, improves reliability management capability, and/or prevents future blackouts. The WARMC provides Reliability Coordinator and Control Area operators with a wide area perspective of grid operations real-time, beyond its immediate area of responsibility. The WARMC may additionally have other functions and applications including new functions and applications to be developed, and may serve as a center that supports grid reliability for an entire Interconnection (e.g., Eastern Interconnection (EI)), for example.

In recent years, the functional disaggregation of electric utilities has resulted in gaps in the overall grid reliability management in terms of who (Control Areas, Reliability Coordinators, ISO/RTOs) has visibility of key system parameters with apparently no one having the full picture. By way of example, blackouts, such as the Aug. 14, 2003 blackout in the United States and Canada, may have been caused by a lack of situational awareness caused by inadequate reliability tools and backup capabilities. Further, deficiencies in control area and reliability coordinator capabilities to perform assigned reliability functions may also have led to blackouts.

During the blackouts, the operators may have been unaware of the vulnerability of the system to the next contingency. The reasons for this may include one or more of inaccurate modeling for simulation, no visibility of the loss of key transmission elements, no operator monitoring of stability measures (e.g., reactive reserve margin, power transfer angle), and no reassessment of system conditions following the loss of an element and readjustment of safe limits. The wide area real time monitoring for reliability management of the present invention is adapted to the changing industry structure and helps to reduce or prevent blackouts.

The wide area reliability monitoring functions of the present invention may be integrated with existing operations and provide system operators and Reliability Coordinators with tools for monitoring not only their own Control Areas but also adjacent Control Areas and the Interconnection. The integration of the real time wide area monitoring for reliability management with existing control, communications, and monitoring infrastructure is shown in FIG. 2B, for example.

Figure 2B:
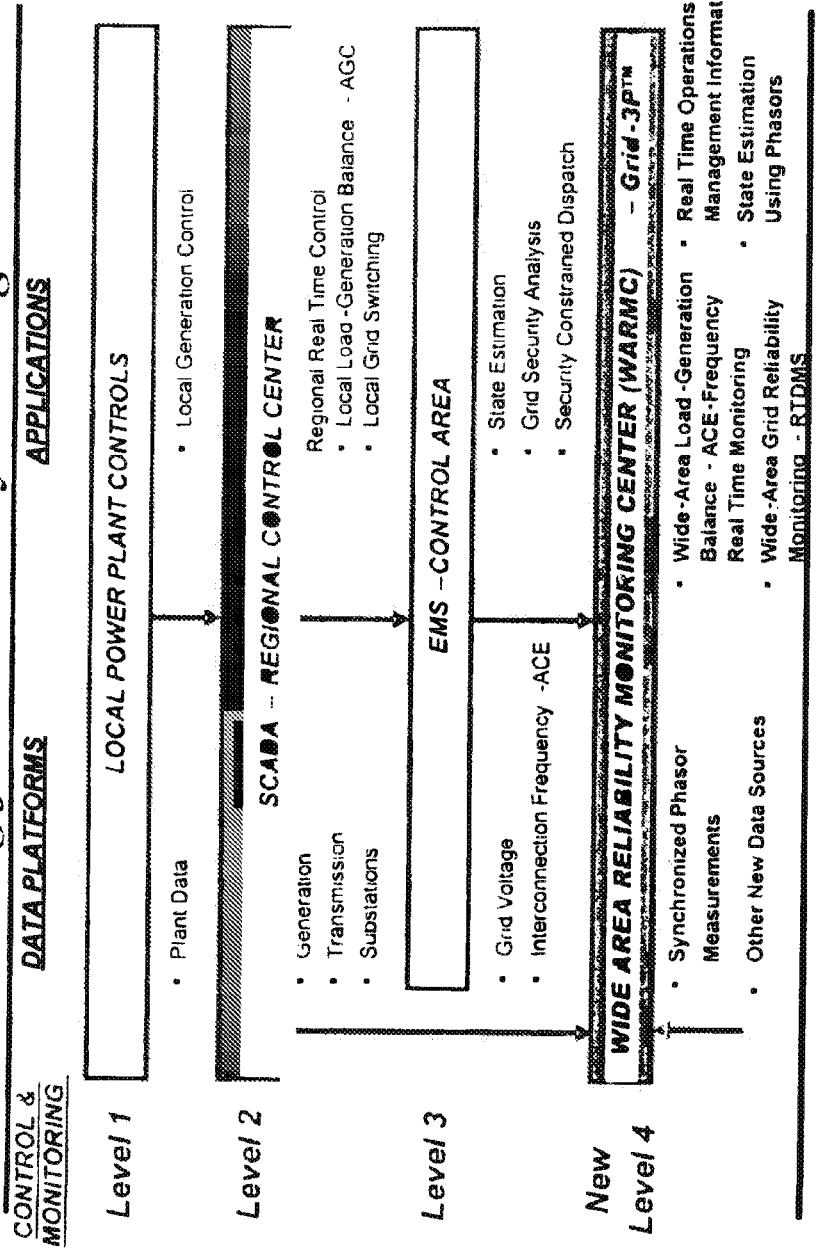
FIG. 2B illustrates a process of controlling generation, transmission and distribution of electricity with an integration of real time wide area monitoring for reliability management.

As shown in FIG. 2B, operators currently have access to databases or platforms and perform control and monitoring functions at three levels: 1) Level 1-local power plant controls using plant data to control local generation of power; 2) Level 2-SCADA (regional control center) using generation, transmission and substations data to control regional and local substations, which involves controlling local load-generation balance-AGC and local grid switching in real-time; and 3) Level 3-EMS for Control Area operations including use of state estimation, grid security analysis and security constrained dispatch, using grid voltage and interconnection frequency-ACE data.

The WARMC according to an exemplary embodiment of the present invention introduces a new Level 4, which utilizes existing SCADA data as well as time synchronized data from phasors or other sources and/or other new data sources for wide area monitoring. As shown in FIG. 2B, the WARMC provides one or more of the following applications: 1) Wide-Area Load-Generation Balance-ACE-Frequency real-time monitoring; 2) Wide-Area Grid Dynamics and Reliability monitoring-RTDMS; 3) real time operations management information; and 4) state estimation using phasors. The WARMC may have one or more of other monitoring, management information reporting, state estimation, and controls applications.

The WARMC provides a wide area monitoring and reliability management capability that extends across control area boundaries. The WARMC may include one or more of monitoring applications, connectivity with other Interconnection entities, improved phasor and PDC hardware, and secure and redundant communication networks for data exchange. The WARMC may enable RTOs, Independent Transmission Owners (TOs), North American Electrical Reliability Council (NERC), other Interconnection stake holders, and/or the like to monitor key reliability metrics impacting their respective areas and provide the capability to monitor and manage an entire Interconnection grid (e.g., Eastern Interconnection grid).

By way of example, the WARMC may provide one or more of the following functions or capabilities: 1) wide area system visibility; 2) data connectivity to key RTOs and reliability management organizations; 3) time synchronized data in real time; 4) monitoring of key grid reliability metrics for an Interconnection (e.g., Eastern Interconnection); 5) real time performance monitoring and reporting; 6) enhanced state estimation; 7) fast simulation and modeling; and 7) smart grid with automated controls.

Figure 2C:
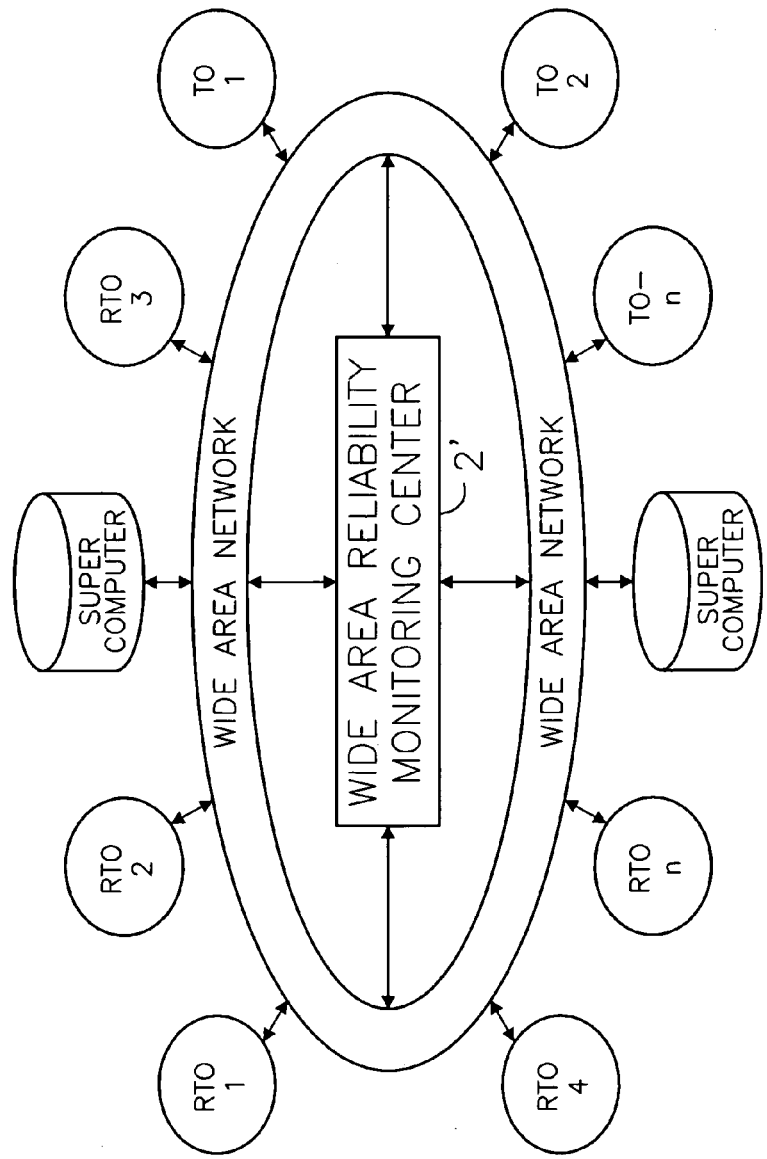
FIG. 2C illustrates an infrastructure for a wide area reliability monitoring center (WARMC) of FIG. 2B.

The WARMC may be fully automated, such that it will compile critical high speed data, process it, provide Interconnection (e.g., EI) reliability authorities with reliability information on the health of the Interconnection and, as required, may enable/disable remedial actions schemes (RAS) and may re-configure the grid. The WARMC may be linked through secure, reliable and redundant communications to key RTOs, transmission owners, utilities, and control area operators. The conceptual framework for an WARMC infrastructure is shown in FIG. 2C. As can be seen in FIG. 2C, the WARMC 2' is coupled via a wide area network to a number of RTOs 1-*n,* one or more super computers and a number of TOs 1-*n.*

The WARMC should have access to critical real-time and historical operating data from all regions of an Interconnection (e.g., EI) to perform one or more of real time monitoring, post disturbance assessments, analyses for future enhancements and modeling to support a smart grid with automatic controls.

By way of example, the WARMC may have the necessary infrastructure, support systems and data to provide meaningful information for TOs, RTOs, and Reliability Coordinators to effectively perform one or more of the following: 1) validate the next-days operating plan and ensure the bulk power system can be operated reliably in anticipated normal and contingency conditions; 2) perform wide area monitoring, tracking and management of real-time grid operations; 3) anticipate and respond to changing conditions and flows; and 4) simulate "what if" scenarios.

The WARMC may also have capabilities to perform post disturbance assessment functions including one or more of: 1) evaluating compliance with NERC/Reliability Regional Standards; 2) Providing feedback to the pre-planning (day-ahead) process; 3) and validating model representation of expected grid performance. The WARMC may also define enhancements to the grid by, for example, assessing constraints, bottlenecks and vulnerabilities that will have a negative impact on grid reliability.

Figure 3:
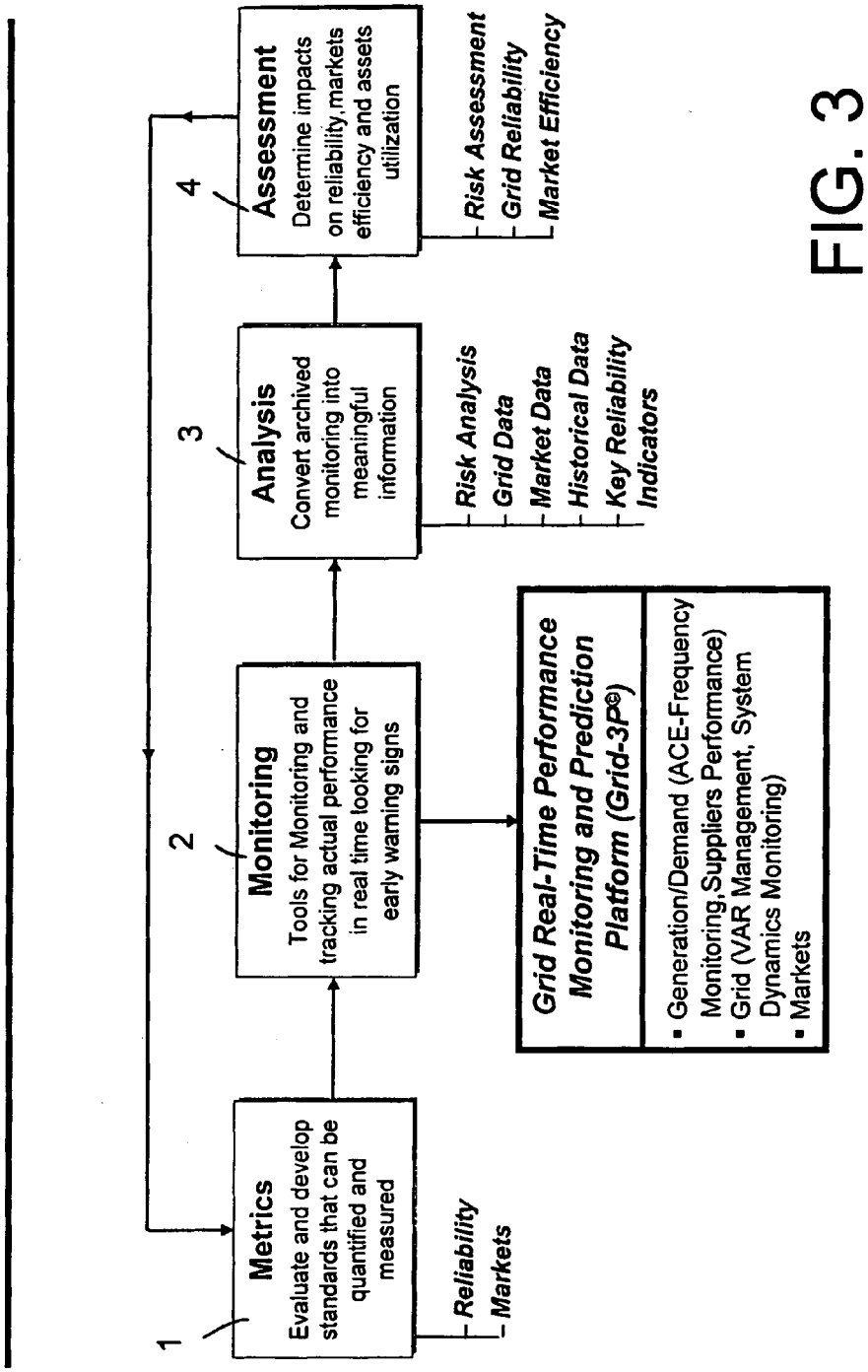
FIG. 3 is a block diagram that illustrates an exemplary performance management process according to the present invention.

Referring now to FIG. 3, the identification and use of key metrics 1 involves the evaluation and development of standards that may be quantified and measured. Metrics exist for a particular industry and different areas of a particular industry. For example, there may be metrics relating to reliability and others relating to markets, in which the metrics for each subcategory may overlap. Monitoring 2 contemplates the use of tools, whether they exist now or become available in the future, for tracking actual performance in real-time with a goal, among others, of looking for early warning signs. Analysis 3 contemplates converting archived monitoring information into meaningful information. Such data includes without limitation, risk analysis, grid data, depending on the particular industry or process being monitored, market data, historical data, and key reliability indicators. Assessment 4 contemplates the determination of impacts on reliability, markets, efficiency and asset utilization. Examples, which may change depending on the particular industry or process being assessed, include risk assessment, grid reliability and market efficiency. The desired assessment may modify the parameters or metrics that are monitored to achieve the desired results.

In one exemplary application of the present invention, the Grid-3P system, based upon a real-time performance and prediction platform for power grid monitoring and management, includes monitoring of generation/demand, grid data and markets as more particularly set forth herein. By way of example, the WARMC discussed above may be based on the Grid-3P system.

The reliability applications may include one or more of real-time monitoring of voltage/volt-ampere reactive (VAR), Area Control Error (ACE)/Frequency, Area Interchange Error (AIE)/Schedules, and/or other grid attributes and performance metrics. The generation applications may include suppliers and Control Area responses to Automatic Generation Control (AGC), frequency response and ancillary services, ramping response, and/or other metrics. The grid infrastructure security application may include one or more of system vulnerability, exposure (in terms of population, cities, etc.) and/or other metrics. Market applications may include one or more of generation market power, price spikes and/or other metrics.

In another exemplary embodiment according to the present invention, the power grid monitoring and management system enables one or more of real-time monitoring, historical tracking, prediction (near real-time forecasting up to 6-hours or what if sensitivity analysis), and actions (notification, system re-dispatch, mitigation measures, etc.) In other embodiments, the forecasting may be performed for more than six (6) hours.

In still another exemplary embodiment according to the present invention, the power grid monitoring and management system provides displays that utilize data and information that are user-defined and may or may not be algorithmically correlated with other displays.

In a further exemplary embodiment according to the present invention, data monitoring may be in real-time or near real-time for monitoring purposes. For example, real-time may be 1-4 seconds snapshot or up to 5 to 10 minute snap shots.

In yet further exemplary embodiment according to the present invention, the power grid monitoring and management system may be utilized to create a standalone monitoring system or be integrated with Security Control and Data Acquisition (SCADA), Energy Management System (EMS), PMUs-PDCs (phasor measurement units-phasor data concentrators) or other control power systems. The SCADA is a system of remote control and telemetry used to monitor and control transmission systems. In other words, the power grid monitoring and management system utilizes data from or is integrated with at least one of SCADA, EMS, PMUs-PDCs and another control power system.

In a still further exemplary embodiment according to the present invention, the power grid monitoring and management system may be used with standard monitoring and control applications and/or end-user defined customer applications.

Figure 4:
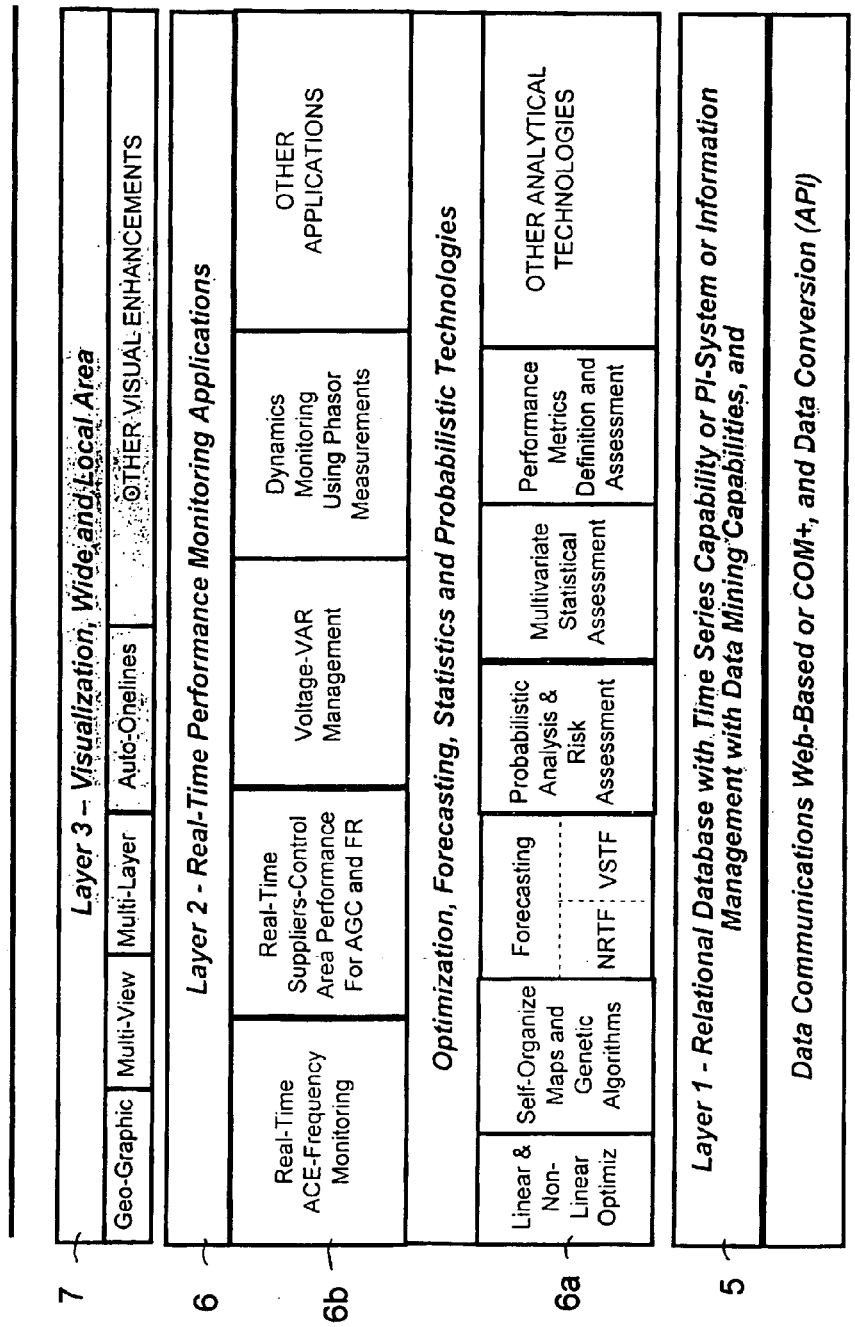
FIG. 4 is a block diagram that illustrates an exemplary multi-layered platform for performance monitoring and management according to the present invention.

Referring to FIG. 4, the platform incorporates a multi-layered approach to performance monitoring and management. Layer 1 (5), the data layer, incorporates conventional relational databases with time series capability (for real-time monitoring and synchronization), a data archival system and/or information management with data mining capabilities. Further, layer 1 includes web-based data communications, COM+ databases and data conversion APIs. One purpose of Layer 1 is to read data from conventional databases that gather the data in real-time, and to communicate the data in real-time.

Layer 2 (6), which uses analytical algorithms for massaging the data accumulated in the databases of layer 1, includes two sublayers (6a and 6b), one focusing on optimization, forecasting, statistics and probabilistic technologies, and other on real-time performance monitoring. Within layer 2a (6a), the platform includes tools and algorithms for linear and non-linear optimizing, self-organize maps and generic algorithms, forecasting, probabilistic analysis and risk assessment, multivariate statistical assessment, performance metrics definition and assessment, and other analytical technologies that may become available. Within layer 2b (6b), the system includes real-time ACE-frequency monitoring, real-time suppliers control area performance for AGC and FR, voltage VAR management, dynamics monitoring using phasor measurements and other applications that may become available.

Dynamic monitoring using phasor analysis is particularly important in systems where monitoring data at subtransient levels may be useful. By way of example, existing power systems have dynamic behavior on the order of milliseconds. Traditional sampling, however, occurred at 4 second intervals. New monitoring techniques enable sampling up to 20-30 times per seconds or more. The present system, using dynamic phasor analysis, is capable of analyzing data gathered at subtransient intervals, synchronizing the data to other system parameters based on the time series capability of layer 1, and presenting the data for visualization in an organized and logical manner in layer 3.

Deployment of phasor technology over wide areas is useful for supporting reliable region-wide and inter-regional transfers of electricity without facing transient reliability conditions. An objective of real time dynamics performance monitoring using phasors is to provide grid operators with phasor data in real-time so that they can obtain a more accurate picture of the actual health of the grid. The information allows them to verify that they are operating within the transient boundaries of safe operation, as determined by off-line planning studies, as well as whether the operating guidelines provided by these studies remains valid. Such real-time data provided by phasor or other real time monitoring technologies also supports creation of an automatic, switchable grid that can sense and respond automatically to warning signs of grid emergencies.

Layer 3 (7) uses a novel visualization system that includes a multi-layer view for geo-graphic, wide and local areas. Such a system that allows local or wide area visualization provides significant benefits for understanding the effect of national or neighboring areas on local areas or interest, such as local utilities. In yet another exemplary embodiment according to the present invention, the power grid monitoring and management system is flexible to include one or more dynamic geographic displays and several data or text panels in one or more windows for monitoring, tracking, prediction, and actions or mitigations. Further, by synchronizing data from various sources and presenting it as such, the system enables the user to visualize a wide array of phenomena that may have an impact at a given time on the area or process of interest. The system further provides auto-onelines for tracing the path of electricity, water or other resources through the system. These diagrams allow the user to visualize potential sources of faults or other aspects of the system that may lead to system faults, and to take appropriate action prior to such a fault.

In an exemplary application of the present invention, new methods, tools and technologies are provided to protect and enhance the reliability of the U.S. electric power system by providing a real-time performance monitoring platform. The power grid monitoring and management system of the present invention, for example, includes a platform for performing real-time monitoring of frequency of electricity, customer usage ("load") and/or the amount of power being generated ("generation"). What may also be monitored is the difference between load and generation, and its effect on the frequency of the system.

In the exemplary embodiment, the system includes a series of modular, but integrated, computer-based, real-time data-to-information engines and graphic-geographic visualization tools that have served as a platform to develop reliability applications to assist operating authorities, business entities or companies, e.g., Independent System Operators (ISOs), Regional Transmission Organizations (RTOs), Reliability Coordinators and Control Area Dispatchers in their management of grid reliability, which may use different business systems. For North American Electric Reliability Council (NERC), these applications include the ACE-Frequency and AIE real-time monitoring systems.

The ACE may be defined as an instantaneous difference between net actual and scheduled interchange (i.e., energy transfers that cross control area boundaries), taking into account the effects of frequency bias including a correction for meter error. An AIE survey may be used to determine the Control Areas' interchange error(s) due to equipment failures or improper scheduling operations or improper AGC performance, where AGC may refer to equipment that automatically adjusts a Control Area's generation from a central location to maintain its interchange schedule plus frequency bias. The ACE and AIE monitoring systems together may be referred to as a Compliance Monitoring System (CMS). The CMS may also include one or more other components.

The ACE-Frequency and AIE real-time monitoring system applications enable NERC Reliability Coordinators to monitor ACE-Frequency performance and compliance with performance operational guides within their jurisdictions, and also allow NERC staff and subcommittees to analyze and assess control data to improve reliability tracking and performance. The ACE-Frequency real-time monitoring system, for example, translates raw operational control data into meaningful operations performance information for end users. Should an abnormal interconnection frequency occur, a real-time interconnection abnormal frequency notification (AFN) may be automatically issued via e-mail and/or beepers describing the date, time and magnitude of the frequency abnormality to specific operational authorities, NERC Resource Subcommittee members and NERC Staff.

The notification recipients using the ACE-Frequency monitoring system functionality can quickly assess the abnormality's root cause by drilling down from wide-area to local-area visualization displays that include appropriate information and analysis graphs to easily identify and assess those Control Area(s) out of compliance and potential originators of the notified interconnection frequency abnormality. A Control Area may be defined as an electrical system bounded by interconnection (tie-line) metering and telemetry. The Control Area controls generation directly to maintain its interchange schedule with other Control Areas and contributes to frequency regulation of the Interconnection. Interconnection may refer to any one of the bulk electric system networks in North America: Eastern, Western and ERCOT, and may also refer to Quebec electric system network. When not capitalized, it may also refer to facilities that connect two systems or Control Areas.

Figure 5:
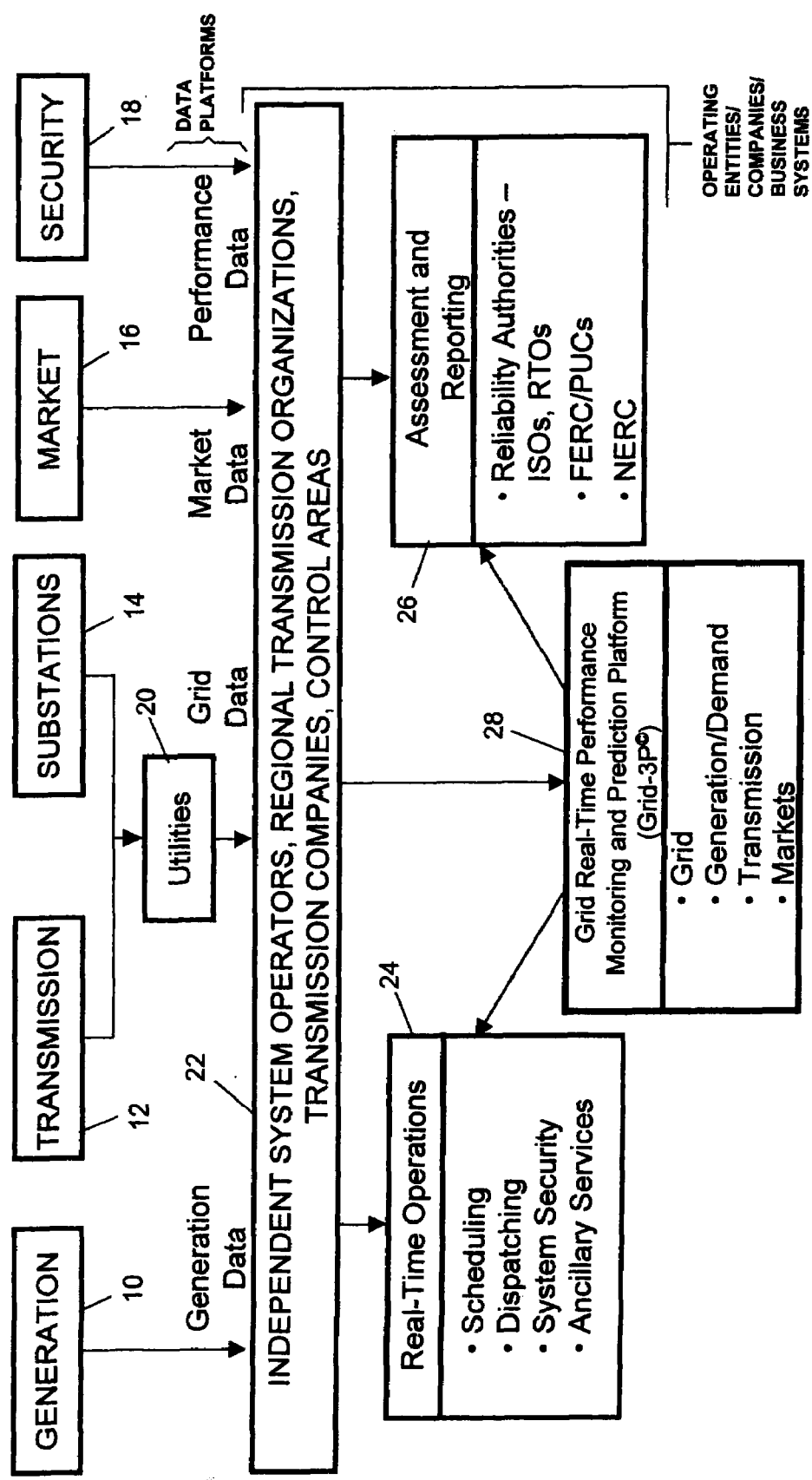
FIG. 5 is a block diagram that illustrates the integration into power generation, transmission and distribution of the power grid monitoring and management system in an exemplary embodiment according to the present invention.

FIG. 5 is a block diagram that illustrates the integration into power generation, transmission and distribution of the power grid monitoring and management system in an exemplary embodiment according to the present invention. The top part of FIG. 5 illustrates that the current business model is segmented into generation, transmission, distribution, markets and security. It can be seen here that the vertically integrated business model historically used by utilities has evolved to a segmented market dispersed among separate entities.

The power grid monitoring and management system has been developed to serve as the base for the development of reliability applications for real-time monitoring, tracking and prediction for the reliability performance of Control Areas, generation, grid, markets, and security. Control Area's ACE, interconnection's frequency and interchange data on top of the power grid monitoring and management system provide a common tool to be utilized by NERC Reliability Coordinators, Control Area Dispatchers, and Transmission Dispatchers. The bottom of FIG. 2 also shows that reliability applications developed using the power grid monitoring and management system may serve as complement for traditional SCADA/EMS systems and for the periodic reporting requested by NERC for post performance.

As can be seen in FIG. 5, various different data are provided by generation 10, utilities 20 (transmission 12 and substations 14), market 16 and security 18. These data, such as generation data, grid data, market data and performance data are provided to one or more various different organizations 22 such as, for example, ISOs, RTOs, transmission companies, Control Areas and the like.

One or more of these organizations perform real-time operations 24 such as scheduling, dispatching, system security, ancillary services and the like. Also, one or more of these organizations perform assessment and reporting 26 such as reports to reliability authorities such as ISOs, RTOs, FERC/PUCs and NERC.

As illustrated in FIG. 5, the power grid monitoring and management system in the described exemplary embodiment provides an infrastructure for integrating the monitoring and control of real-time operations, assessment and reporting provided by various different entities using data provided by still other various different organizations.

Figure 6:
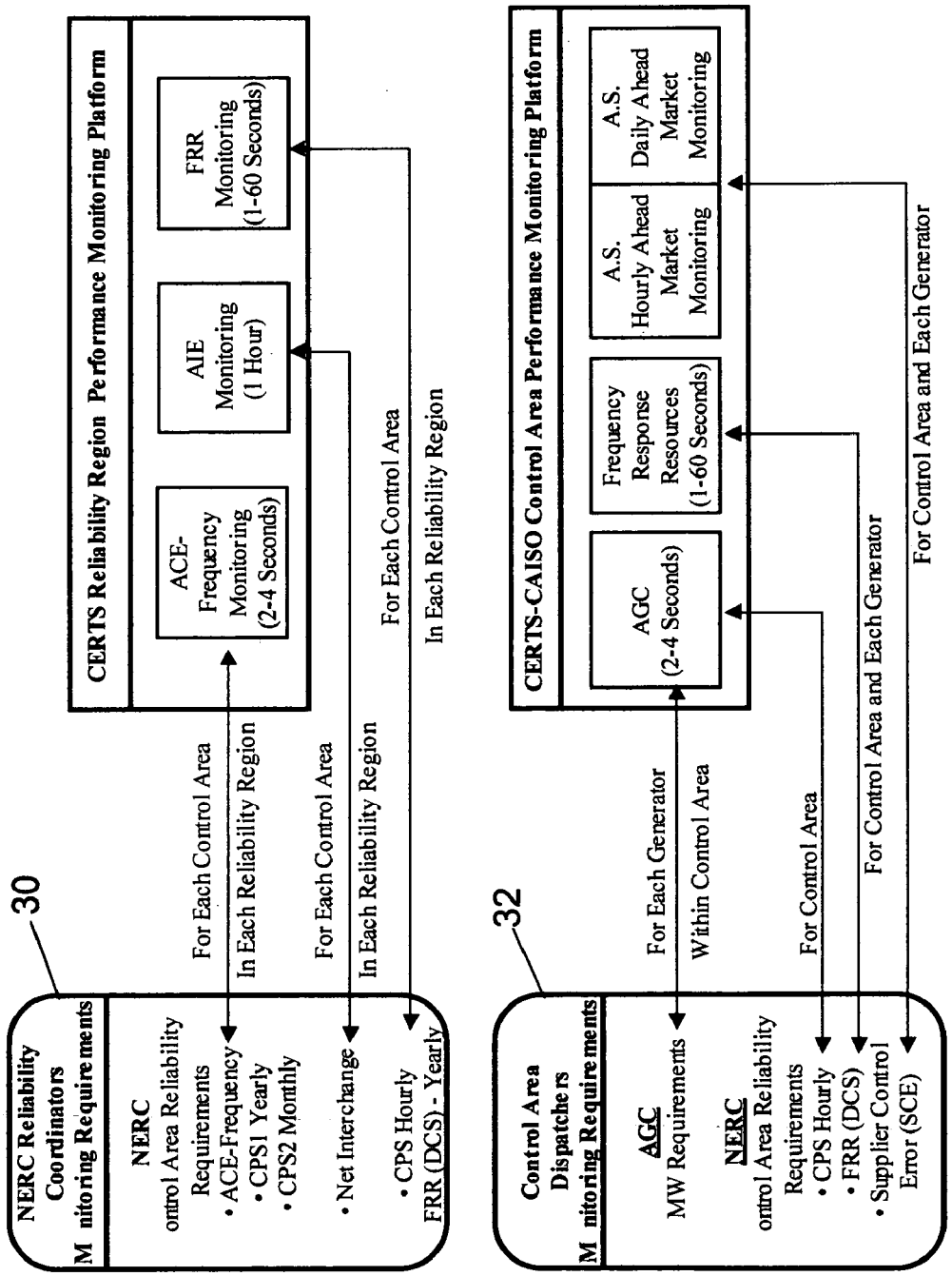
FIG. 6 illustrates a power grid monitoring and management system of FIG. 5 and includes the major reliability applications for real-time reliability monitoring for NERC Reliability Coordinators and Control Area Dispatchers.

FIG. 6, for example, shows an expansion of the power grid monitoring and management system 28 from FIG. 2 and includes the major reliability applications for real-time reliability monitoring for NERC Reliability Coordinators and Control Area Dispatchers. The top part FIG. 3 shows the applications target for Reliability Coordinators, ACE-frequency, AIE and control performance standards (CPS). The bottom part of FIG. 6 shows the applications target to Control Area Dispatchers, performance compliance of Control Areas, suppliers to AGC, FRR and ancillary services markets.

As can be seen in box 30, NERC Reliability Coordinators monitor several requirements, including ACE-Frequency, to maintain and enhance the reliability of their jurisdictions. The ACE-Frequency Monitoring System, shown in the upper applications box (Reliability Region Performance Monitoring Platform) 34, provides applications for each Coordinator within each of their Reliability Regions. Reliability Coordinators utilize those applications to monitor performance and compliance within their Regions and notify the appropriate Control Area Dispatchers as abnormalities occur. Control Area Dispatchers pinpoint problem sources by monitoring the response performance of their Control Area and suppliers to AGC monitoring system, frequency response resources and ancillary services.

For example, in one exemplary embodiment, the power grid monitoring and management system may be described in reference to performance monitoring, tracking and short term prediction of California Independent System Operator (CAISO) Control Area and suppliers response to AGC, frequency response reserves (FRR) and ancillary services application as shown in box 36 (Control Area Performance Monitoring Platform) to support Control Area Dispatchers Monitoring Requirements (32). This application represents further progress towards grid reliability technologies and management tools that present real-time performance, tracking and predictive information across several spheres of grid operating and reliability concerns.

Figure 7:
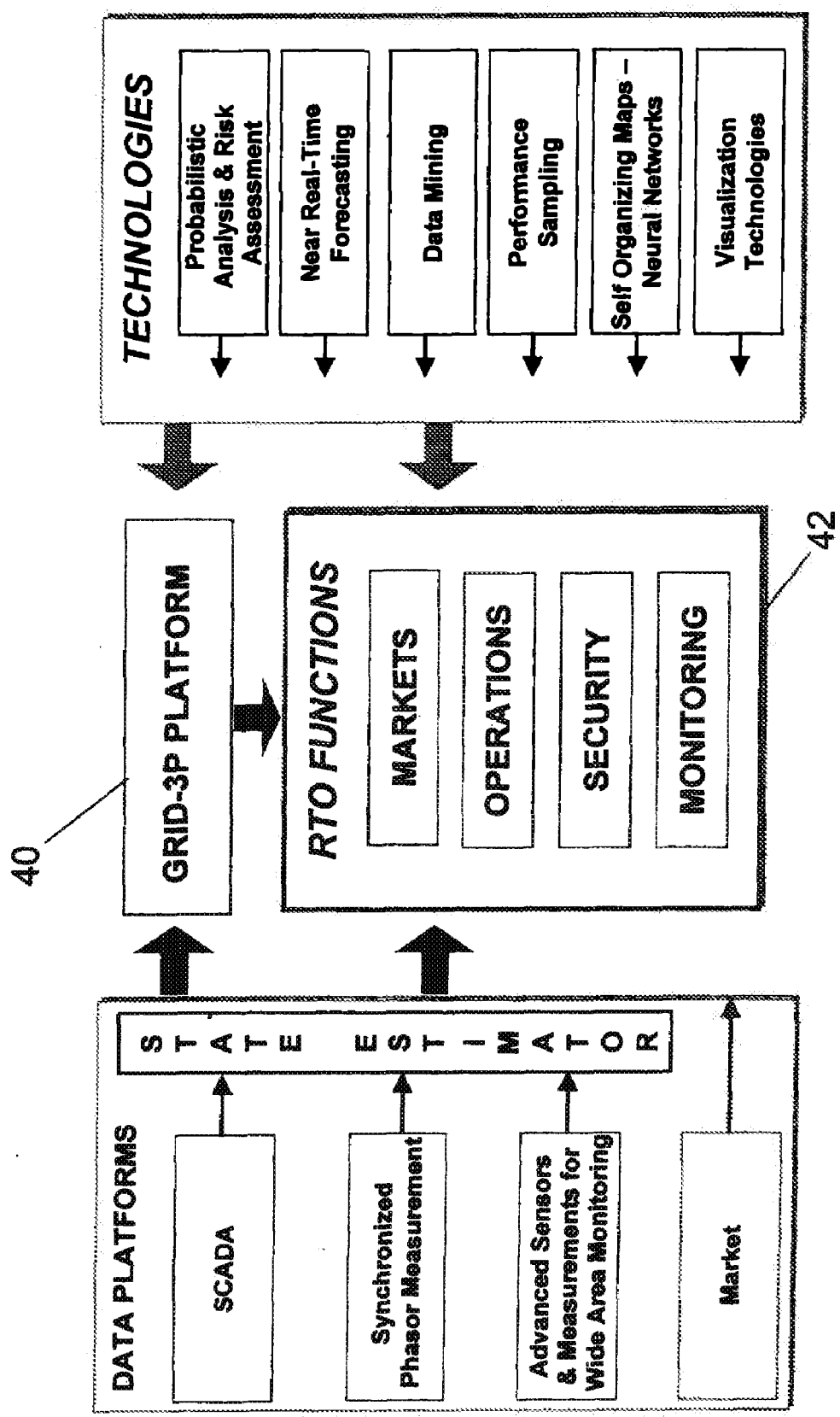
FIG. 7 illustrates an application of the power grid monitoring and management system for utilization by RTOs to monitor markets, operations, security, and other functions.

FIG. 7 illustrates an application of the power grid monitoring and management system 40 in an exemplary embodiment according to the present invention. The power grid monitoring and management system includes a platform to support RTO functions (42) such as markets, operations, security and reliability monitoring.

Figure 8:
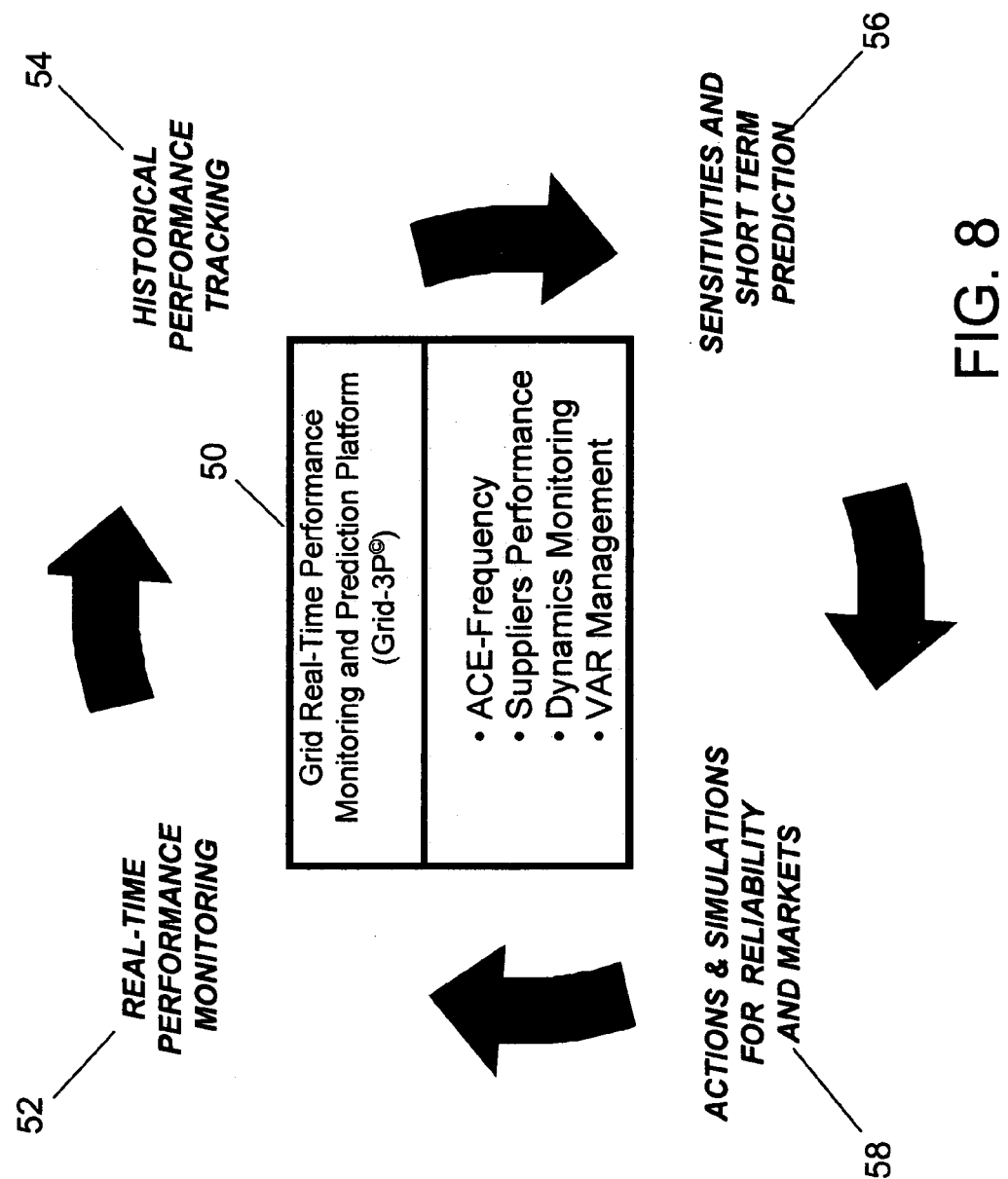
FIG. 8 illustrates an application of the power grid monitoring and management system in an exemplary embodiment according to the present invention.

FIG. 8 illustrates functions of the power grid monitoring and management system 50 in an exemplary embodiment according to the present invention. The power grid monitoring and management system 50 includes a platform for performing one or more of real-time performance monitoring 52, historical performance tracking 54, sensitivities and short term prediction 56, and action & simulations for reliability and markets 58.

As part of the real-time performance monitoring 52, the power grid monitoring and management system may monitor one or more of voltage/VAR, ACE-Frequency, transmission congestion, generator performance for AGC and frequency response and market prices/spikes.

For historical performance tracking 54, the power grid monitoring and management system may track one or more of Interconnection, Generator, Region/Zone/Substation as well as market.

As part of sensitivities and short term prediction 56, the power grid monitoring and management system may predict/handle one or more of system demand, generator response, voltage sensitivities, distance from collapse and short term predictions.

The actions and simulations 58 performed by the power grid monitoring and management system may include one or more of notifications, reserves & ancillary services, capacitor dispatch, generation re-dispatch, VAR management and automatic mitigation.

Figure 9:
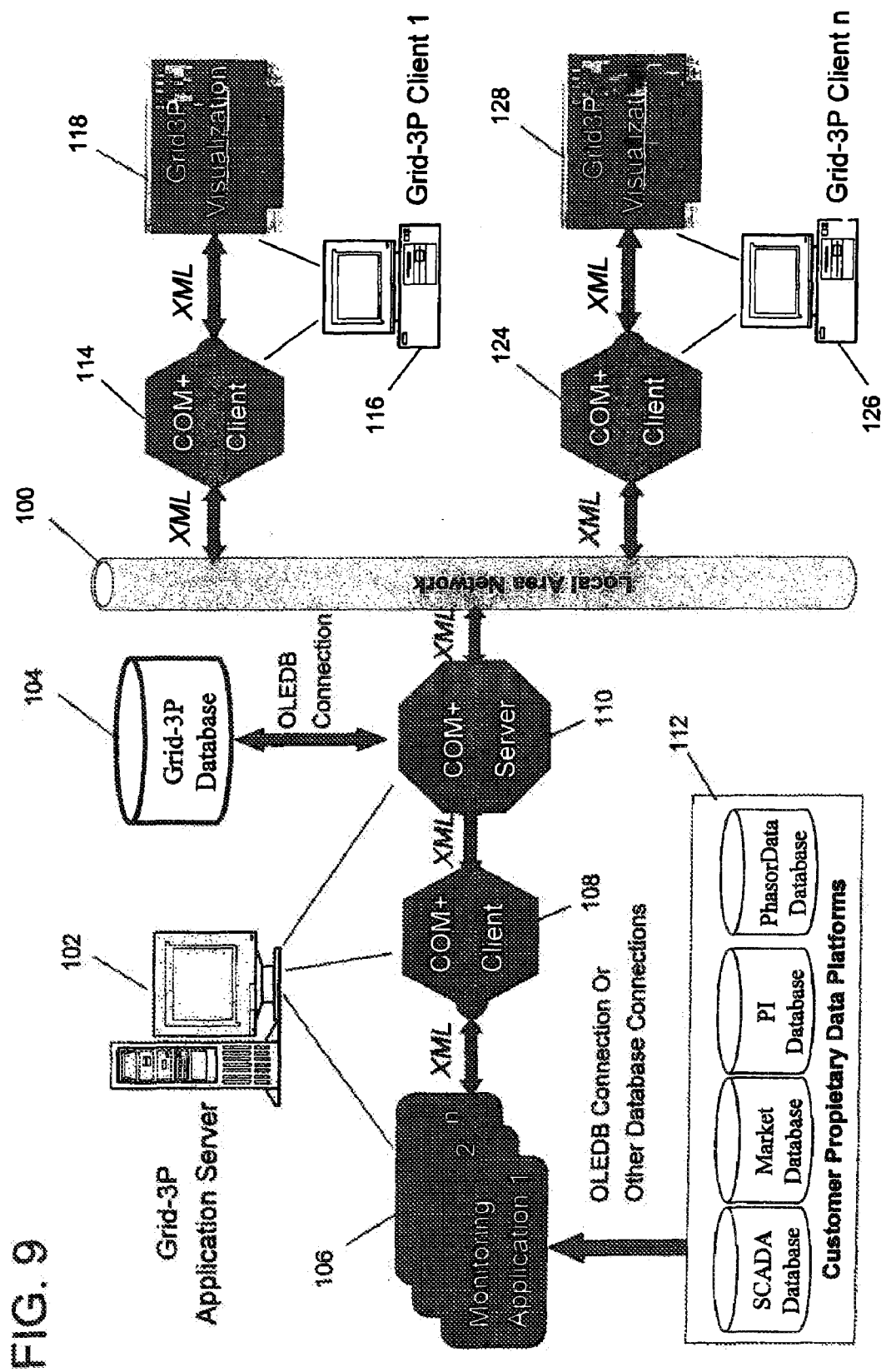
FIG. 9 is a local area network (LAN) based hardware and software architecture for the power grid monitoring and management system in an exemplary embodiment according to the present invention.

FIG. 9 is a local area network (LAN) 100 based hardware and software architecture for the power grid monitoring and management system in an exemplary embodiment according to the present invention. The architecture includes a number of clients 114, 124 that interface with a server 110 over the LAN 100. The server and clients, for example, may be COM+ server and clients, and the communications may take place using XML language.

Each client 114, 124 interfaces with the power grid monitoring and management system client 116 and 126, respectively. The display of the power grid monitoring and management system 118 and 128 are used to provide visual indication of monitoring and tracking to the user.

The server 110 is coupled to a power grid monitoring and management system database 104, for example, over an OLEDB connection. The server 110 is also connected to a power grid monitoring and management system application server 102 and a client 108. The communication between the server 110 and the client 108, for example, is performed using XML language. Further, the client 108 communicates with one or more monitoring applications 106 using the XML language. The one or more monitoring applications 106 also interface with the power grid monitoring and management system application server 102. The monitoring applications are connected over OLEDB connection and/or other data base connections to customer proprietary databases or data platforms 112. The customer proprietary database or data platform 112 may include one or more of SCADA (Supervisory Content and Data Acquisition) database, market database, PI database and Phasor Data database. The LAN-based architecture may have different configurations in other embodiments.

Figure 10:
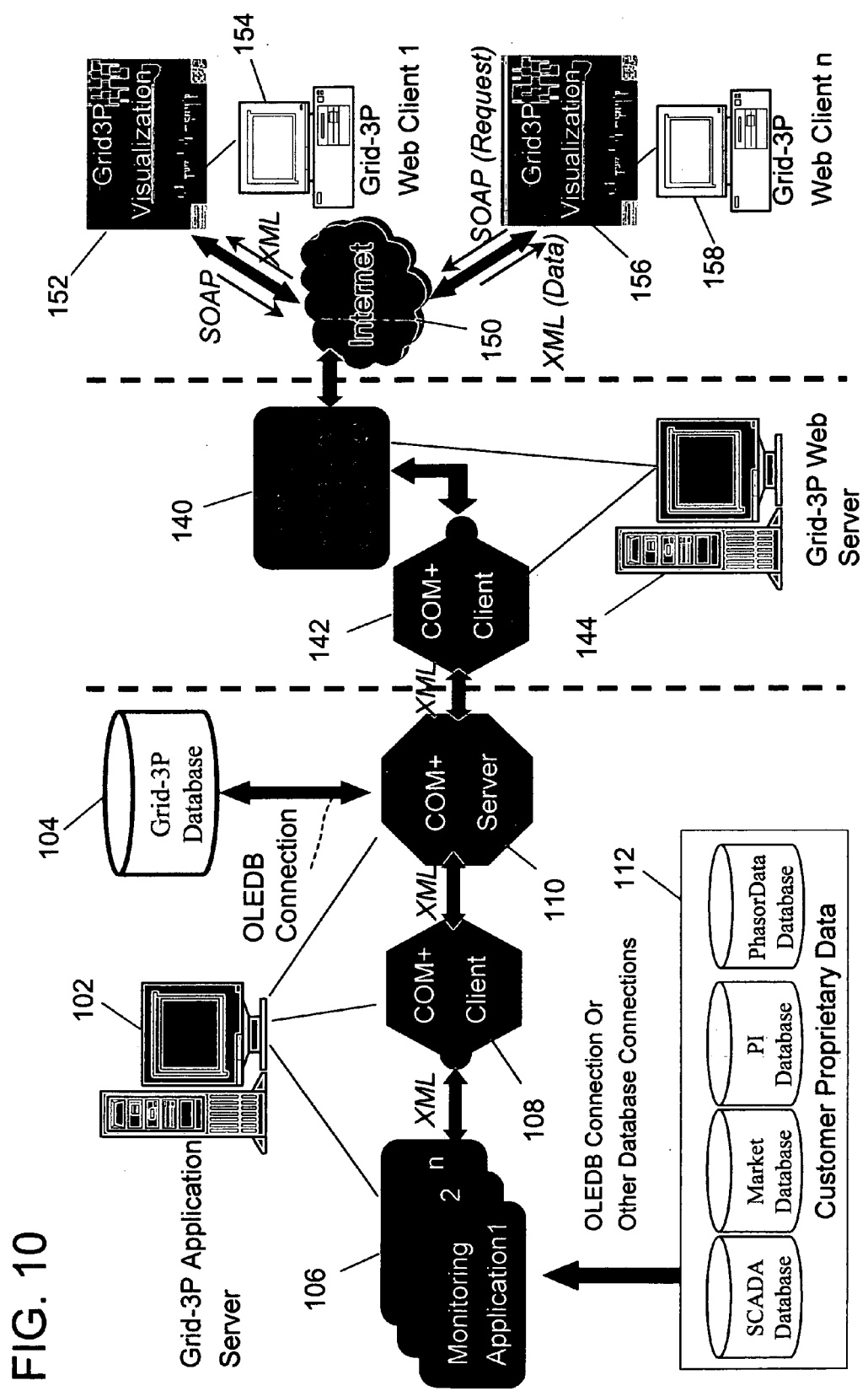
FIG. 10 is a web-based hardware and software architecture for the power grid monitoring and management system in another exemplary embodiment according to the present invention.

FIG. 10 is a web-based hardware and software architecture for the power grid monitoring and management system in another exemplary embodiment according to the present invention. On the power grid monitoring and management system application server side, the configuration is identical to that of the LAN-based hardware and software architecture. The server 110, however, communicates with another client (which may be a COM+ client) 142 using the XML language. The client 142 is coupled with an Internet Information Server (IIS) 140. A power grid monitoring and management system web server 144 also communicates with the client 142 and the IIS 140. The IIS 140 communicates over the Internet 150 using XML language and Simple Object Application Protocol (SOAP) protocol with the visualization programs 152 and 156, respectively, for visual communication with users on web clients 154 and 158, respectively. The web-based architecture may also have different configurations in other embodiments.

For example, in both the architectures of FIGS. 9 and 10, only two clients are shown on the client side. In practice, however, there may be more than two clients. Further, the power grid monitoring and management system application server 102 may be coupled to both the LAN-based clients and web-based clients over the LAN and the Internet, respectively. Further, the Internet may be replaced or complemented by an Intranet or any other similar proprietary or non-proprietary networks.

Figure 11:
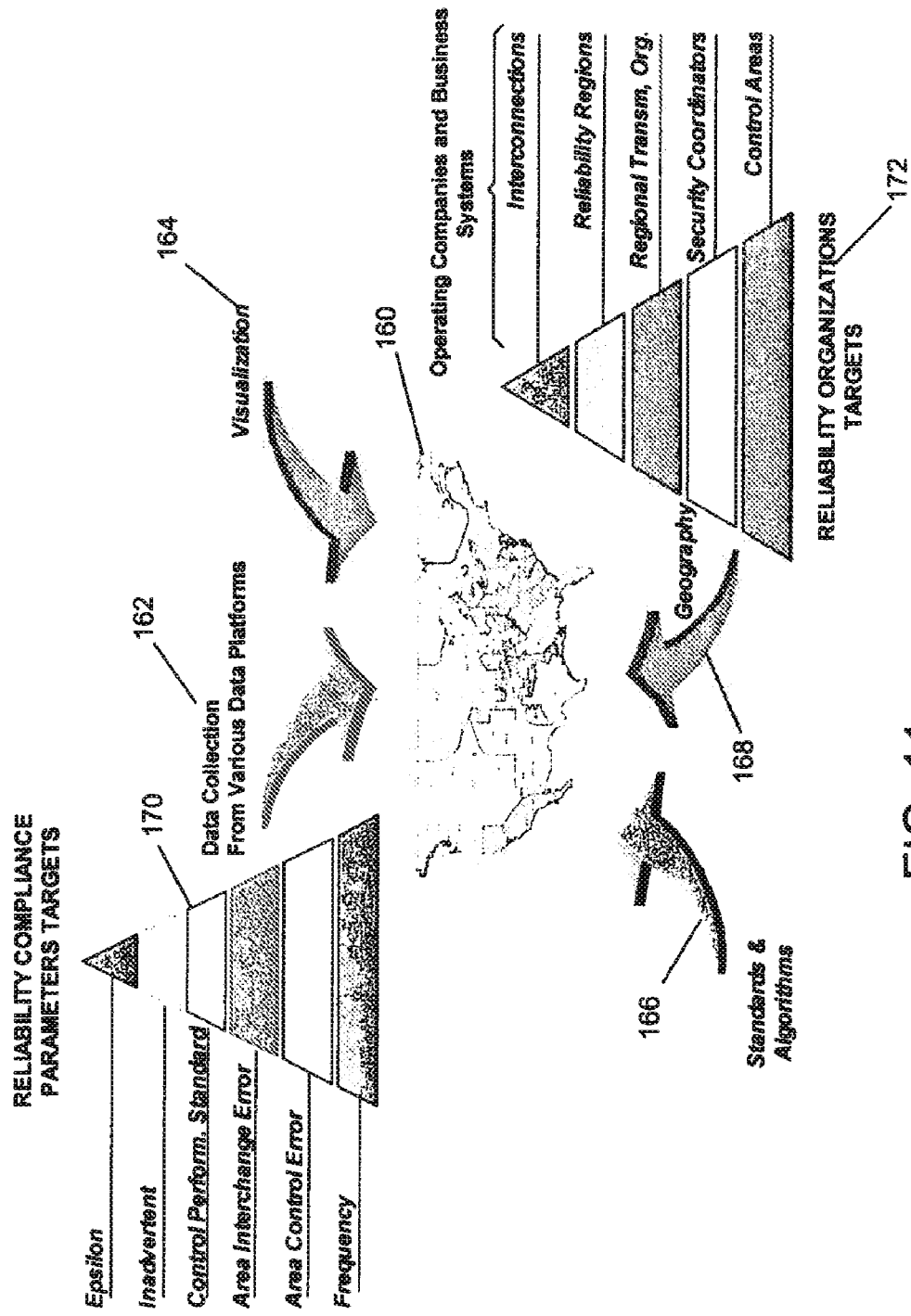
FIG. 11 illustrates the architecture of an ACE-Frequency real-time monitoring application using the power grid monitoring and management system in an exemplary embodiment according to the present invention.

FIG. 11 illustrates the architecture of an ACE-Frequency real-time monitoring application 160 using the power grid monitoring and management system in an exemplary embodiment according to the present invention. The ACE-Frequency monitoring system receives ACE and frequency data from the nation's Control Areas (Data Collection 162), calculates performance parameters (e.g., reliability compliance parameters 170) for each reliability jurisdiction and compares those performance parameters to NERC reliability compliance guides (Standards & Algorithms 166). The results of these comparisons are then displayed graphically and (Visualization 164) on a geographical map (Geography 168) for use by each of the Reliability Organization from each of the layers, depicted in the lower, right pyramid 172. The tiers of the pyramid comprise the control areas, reliability coordinators, reliability transmission organizations, reliability regions, and Interconnections.

Figure 12:
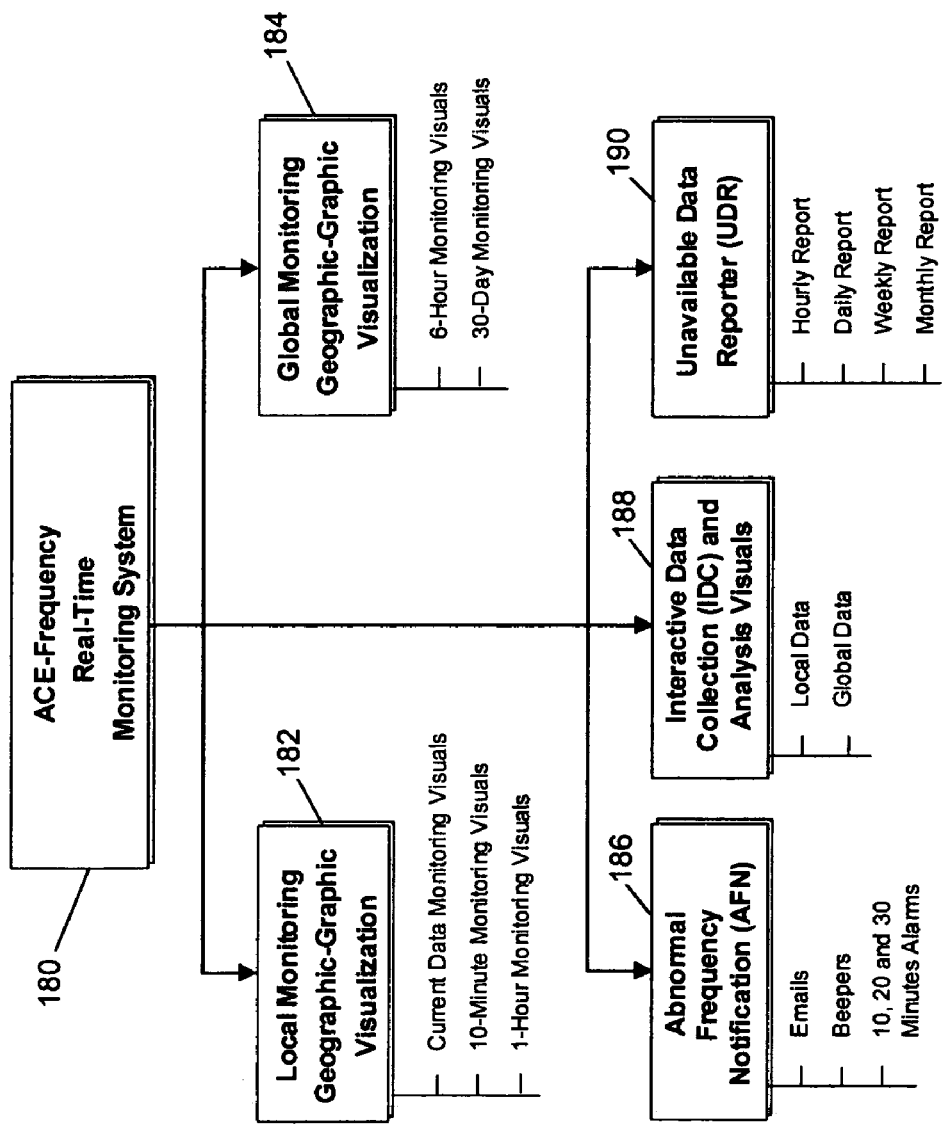
FIG. 12 illustrates five major functional components of the NERC ACE-Frequency real-time monitoring system in an exemplary embodiment according to the present invention.

FIG. 12 illustrates five major functional components of the NERC ACE-Frequency real-time monitoring system 180 in an exemplary embodiment according to the present invention: Local Monitoring 182, Global Monitoring 184, Abnormal Frequency Notification (AFN) 186, Interactive Data Collection (IDC) 188 and Unavailable Data Reporting (UDR) 190. Following are description of each one of the major functional components.

The first is the Local Monitoring Geographic-Graphic Visualization 182. In the described exemplary embodiment, most of the ACE-Frequency visualization is geographic-graphic oriented and covers different time windows from current time to 30-days. The local-visualization option covers from current time to 1-hour, and it offers to end users three different views of Control Area ACE and Interconnection frequency data displayable in the three-panel window visualization.

The second is the Global Monitoring Geographic-Graphic Visualization 184. In the described exemplary embodiment, this option uses the Epsilon performance parameter as an indicator of the frequency performance for each of the interconnections. For example, it shows the performance parameter for two time windows, 6-hours and 30-days. It also uses a power grid monitoring and management system three-panel window visualization as will be described below.

The third is the AFN 186. The real-time AFN is a real-time monitoring component of the ACE-Frequency Monitoring System. The AFN is designed for real-time monitoring of abnormal interconnection frequencies, and to automatically issue e-mails to specific NERC Resources Subcommittee members and NERC staff when predefined abnormal frequency performance criteria are met. E-mail recipients may, for example, use the ACE-Frequency monitoring system capabilities to assess root causes of the abnormal frequencies when notified. The input data to the AFN may be provided by Control Areas to NERC over a secure connection using NERCnet, XML, and/or SOAP technologies.

The fourth is the IDC function 188. Via the IDC functionality, NERC subcommittees, NERC staff, and operating engineers can interactively define the historical window of time and the specific control-performance parameter they need to analyze and assess frequent disturbances. Once data is collected from the NERC data server, the users can use equivalent reliability coordinator visualization and/or save the data in comma-delimited files.

The fifth is the DRG function. The DRG offers the capability to interactively identify and report Control Area data transfer performance. Users can select hourly, daily, weekly, and/or monthly reports and select the specific data they want to assess for availability.

It has been demonstrated by Control Area Dispatchers that the more effective operational displays are those that follow a hierarchical approach to present operational data for current time and other key windows of time. The power grid monitoring and management system visualization model in an exemplary embodiment of the present invention encompasses displays at high and low levels to meet the varying needs of different reliability application users. Thus, in the described exemplary embodiment, monitoring applications are developed for wide-area and local area users using the power grid monitoring and management system.

Figure 13:
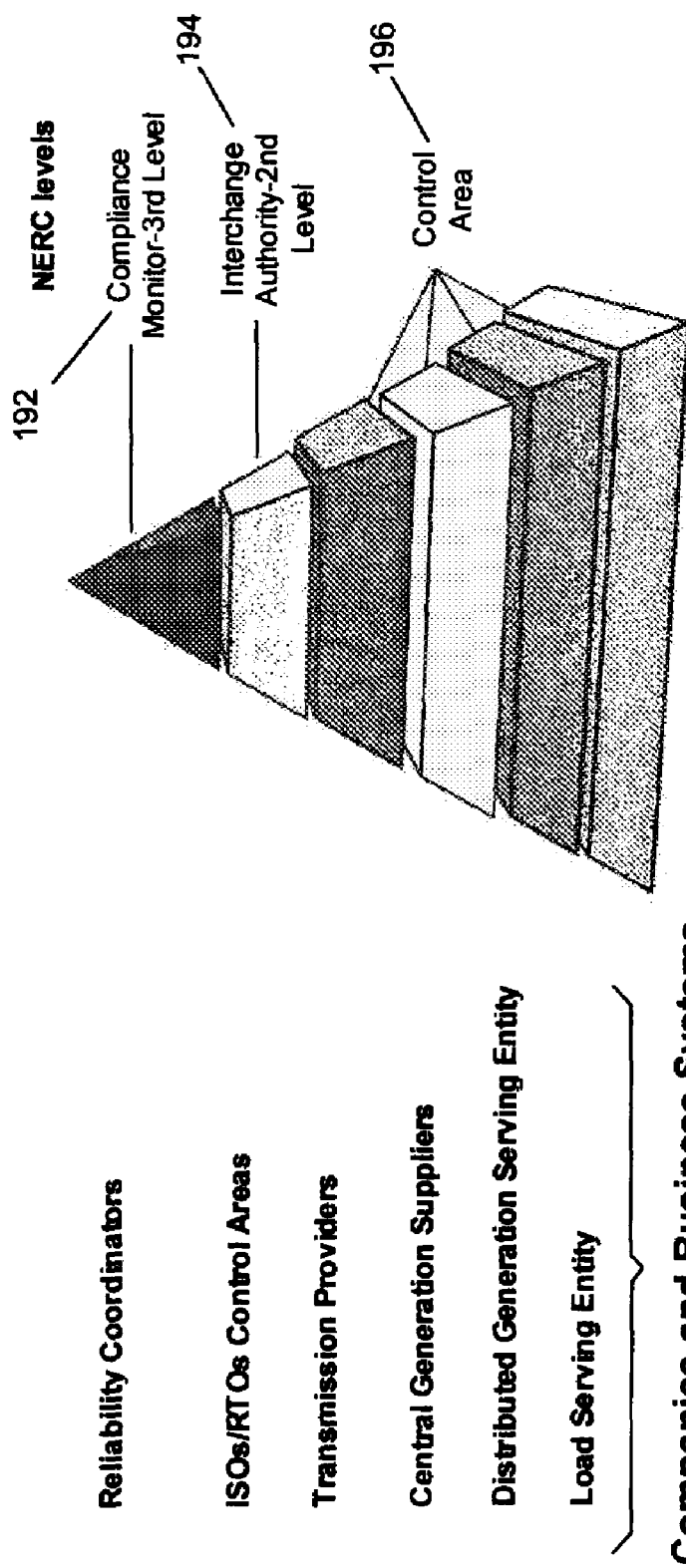
FIG. 13 illustrates reliability functional levels and visualization hierarchy in an exemplary embodiment according to the present invention.
Figure 14:
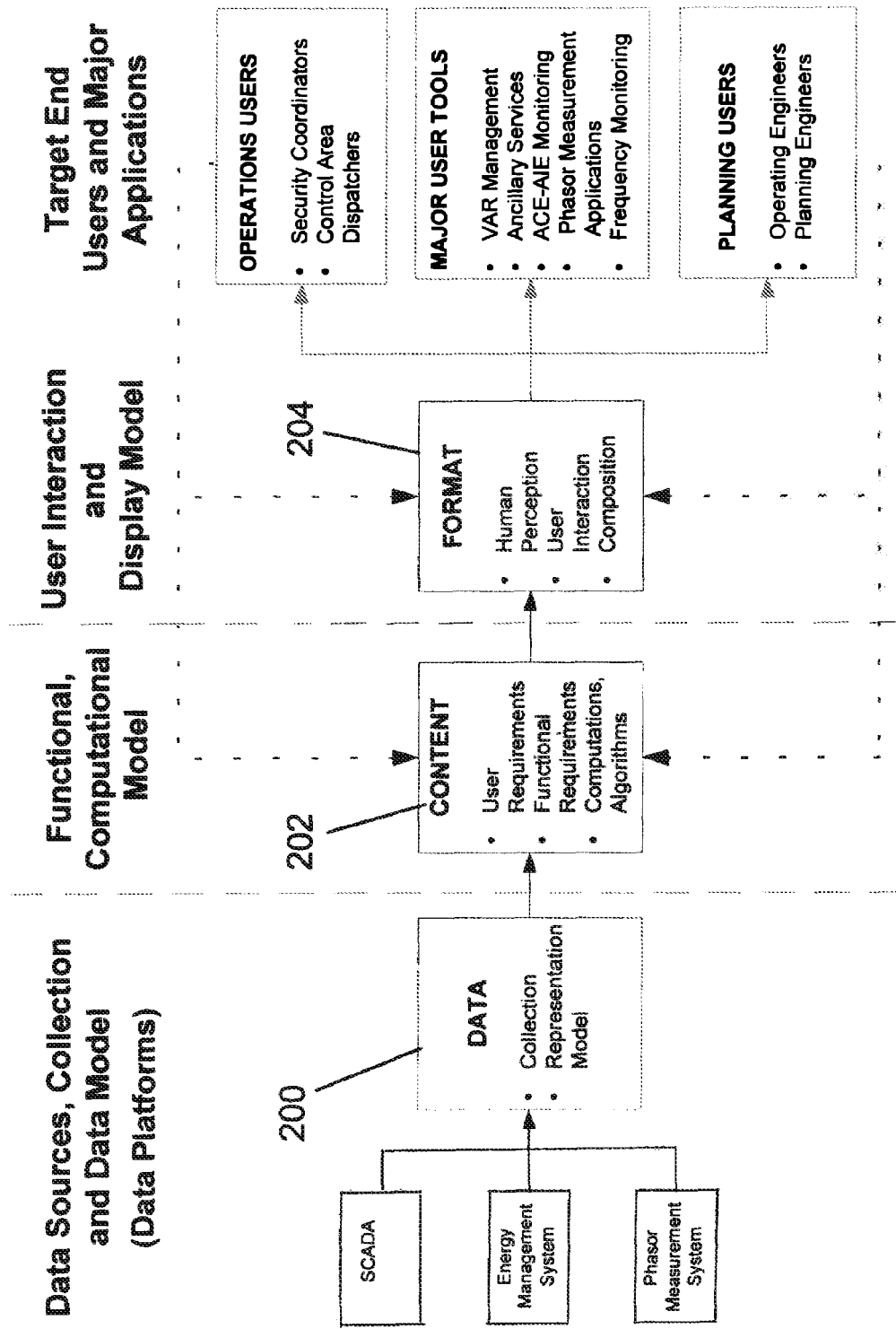
FIG. 14 illustrates an integrated visualization model in an exemplary embodiment according to the present invention.

FIG. 13 illustrates reliability functional levels and visualization hierarchy in an exemplary embodiment according to the present invention, and FIG. 14 illustrates an integrated visualization model in an exemplary embodiment according to the present invention.

The hierarchal structure in FIG. 13 shows that it is desirable for the Reliability Coordinators to have a wide-area view of their jurisdictions for reliability compliance monitoring 192. Also, it is desirable for the ISOs and RTOs to have the ability to assess performance and trends (194) of their Control Areas. In turn, it is desirable for Control Areas to have local area information 196 to pinpoint specific suppliers reliability performance issues. The ACE-Frequency tool allows Reliability Coordinators to monitor ACE-Frequency performance and compliance for each of their jurisdictions using wide-control-area graphic-geographic visualization.

For the definition and design of the ACE-Frequency graphic-geographic visuals for each of the visualization layers shown in FIG. 13, the data collection 200, computational and display (or visualization) models 202, 204 from the power grid monitoring and management system shown in the first three vertical segments on FIG. 14 may be used. For the NERC ACE-Frequency real-time monitoring system, about 123 Control Areas transmit ACE and frequency data to a data server located at NERC (data collection).

The data is processed and performance parameters are calculated in the computational engines (computational model) of the power grid monitoring and management system. The design and deployment of each of the displays follows the three steps (i.e., human factors, user interaction and composition) illustrated in the display model section 204 on FIG. 14.

Figure 15:
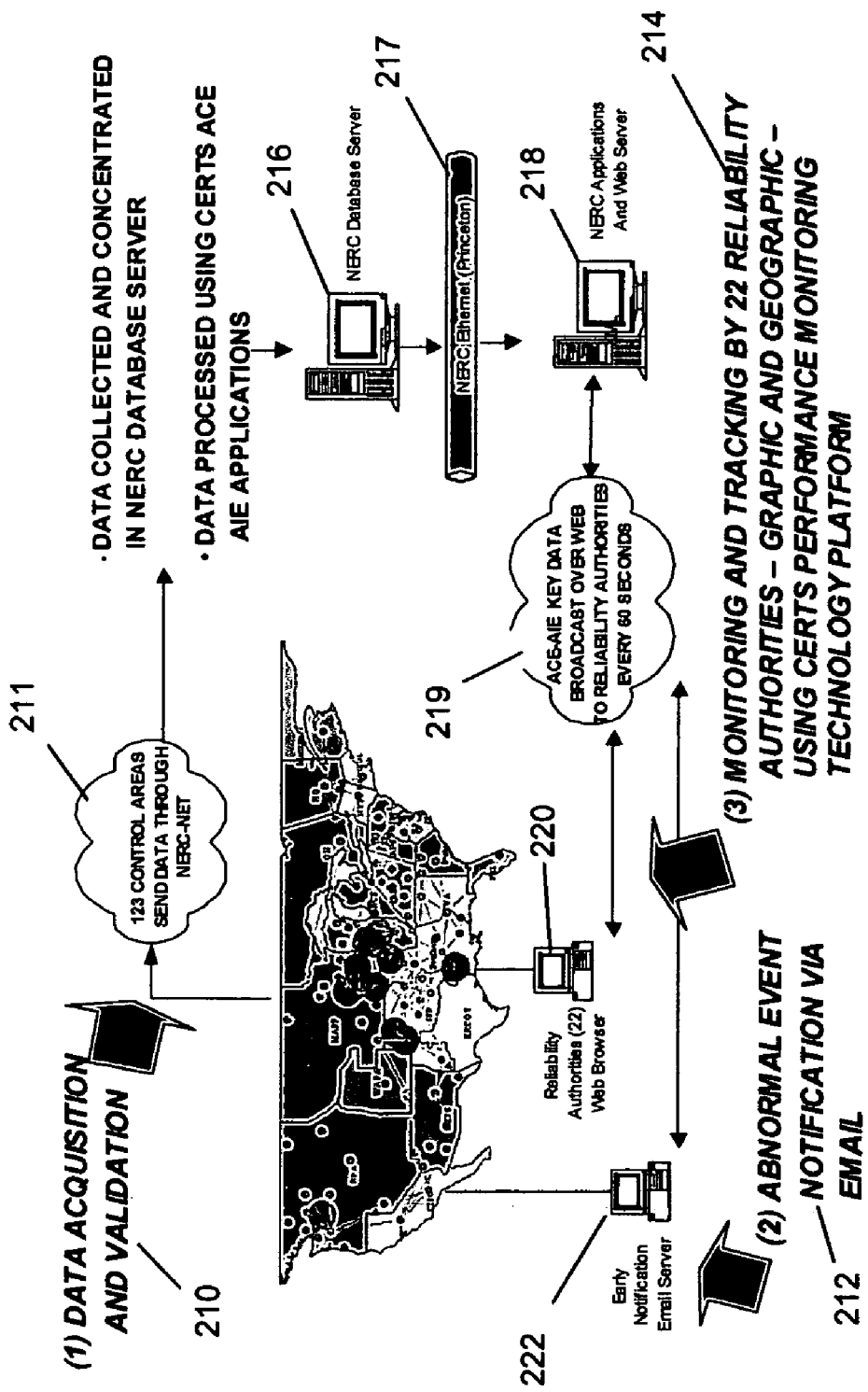
FIG. 15 illustrates an ACE-Frequency real-time monitoring architecture of the power grid monitoring and management system in an exemplary embodiment according to the present invention.

FIG. 15 illustrates an ACE-frequency real-time monitoring architecture of the power grid monitoring and management system in an exemplary embodiment according to the present invention. For example, input data is provided by Control Areas to NERC over a secure connection using NERCnet 211 during data acquisition and validation 210. The data may have been sent, for example, by one or more (up to all) of 123 Control Areas. The received data is archived (i.e., collected and concentrated) in one or more NERC database servers 216. The data may also be processed using ACE and/or AIE applications. Output results go, for example, via XML, and SOAP technologies to a browser base clients.

The archived data may also be provided to NERC applications and web server 218. The NERC applications and web server communicate with an early notification e-mail server 222 and/or Reliability Authorities web browser 220 over the Internet. For example, The NERC applications and web server may broadcast ACE-AIE key data to the Reliability Authorities every 60 seconds. The early notification e-mail server 222 may be used to notify abnormal events via e-mail 212. The monitoring and tracking by 22 Reliability Authorities may include graphic and geographic displays using the performance monitoring technology platform of the power grid monitoring and management system of the present invention.

Figure 16:
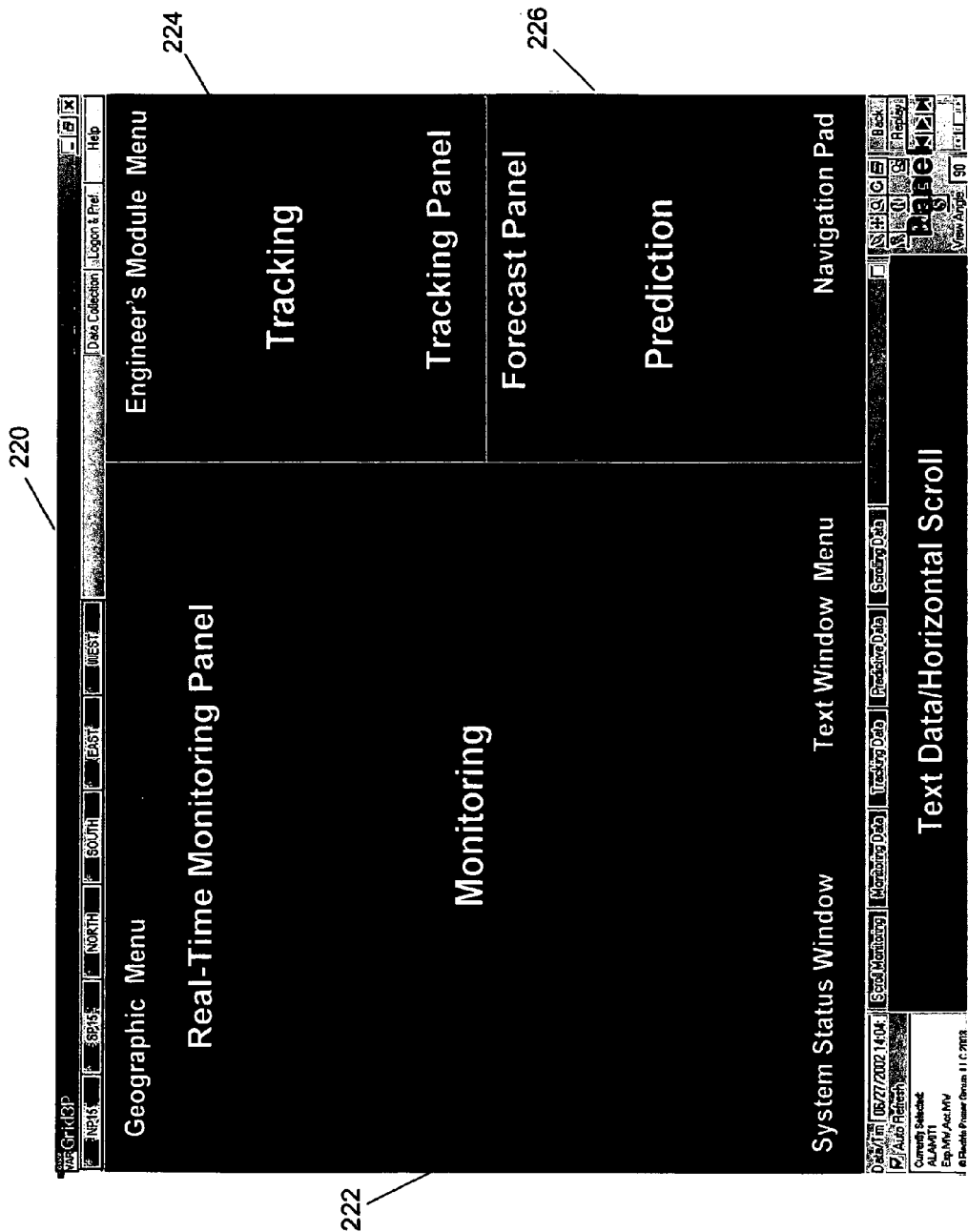
FIG. 16 is a screen shot that illustrates a multiple view architecture of a display of the power grid monitoring and management system in an exemplary embodiment according to the present invention.

FIG. 16 is a screen shot 220 that illustrates a multiple view architecture of a display of the power grid monitoring and management system in an exemplary embodiment according to the present invention. The screen shot includes a real-time monitoring panel 222 used for graphical monitoring, a tracking panel 224 used for displaying tracking information, and a forecast panel 226 used for displaying prediction. The screen shot 220 also includes a text data/horizontal scroll panel 228 for viewing/scrolling text data.

In an exemplary embodiment according to the present invention, the CMS of the power grid monitoring and management system provides to Security Coordinators the tools to monitor each Control Area (CA) within their area of responsibility. Using the CMS, each Control Area will be reporting their ACE and AIE. For example, each of the Control Areas may report in one-minute intervals its ACE, frequency and AIE data through the NERCnet to the NERC Web Server. This data may be matched to the ACE/Frequency validation Matrix, the ACE-CMS database and presented back to each Security Coordinator utilizing the CMS. The compliance monitoring (reliability compliance) may also include CPS monitoring and inadvertent monitoring.

Therefore, the Security Coordinator will have the ability to view the CA performance using the graphic geographic visualization for Interconnections, Reliability Regions, Reliability Authority, Control Area and RTOs. Within these graphic displays the local hourly ACE may be presented in 2D and/or 3D. The power grid monitoring and management system also allows the user to display the ACE over different periods of time. These periods of time may range from the last scan to a thirty day history. The selection of all the Control Areas to an individual Control Area may be available to the user. In the described exemplary embodiment, there are three basic views for use in viewing these areas. An interactive replay of historical data may also be available. The replay element may, for example, allow for 24 hour, 48 hour, 7 day and 30-day replays.

The exemplary CMS presents the user with several different graphics. The Cave diagram is one of those graphic that is used as a tool to represent frequency/ACE, frequency/CPS1 and Epsilon1/calendar. The CPS1 pertains to a limit, which is a constant derived from a targeted frequency bound reviewed and set as necessary by the NERC Performance Subcommittee. Over a year, the average of the clock-minute averages of a Control Area's ACE divided by $-10\beta$ ($\beta$ is control area frequency bias) times the corresponding clock-minute averages of interconnection's frequency error must be less than this limit to comply with CPS1. To comply with CPS2, the average ACE for each of the six ten-minute periods during the hour (i.e., for the ten-minute periods ending at 10, 20, 30, 40, 50 and 60 minutes past the hour) must be within specific limits, referred to as $L_{10}$. An Epsilon ($\epsilon$) is a constant derived from the targeted frequency found. It is the targeted root mean square (RMS) of one-minute average frequency error from a schedule based on frequency performance over a given year.

Figure 17:
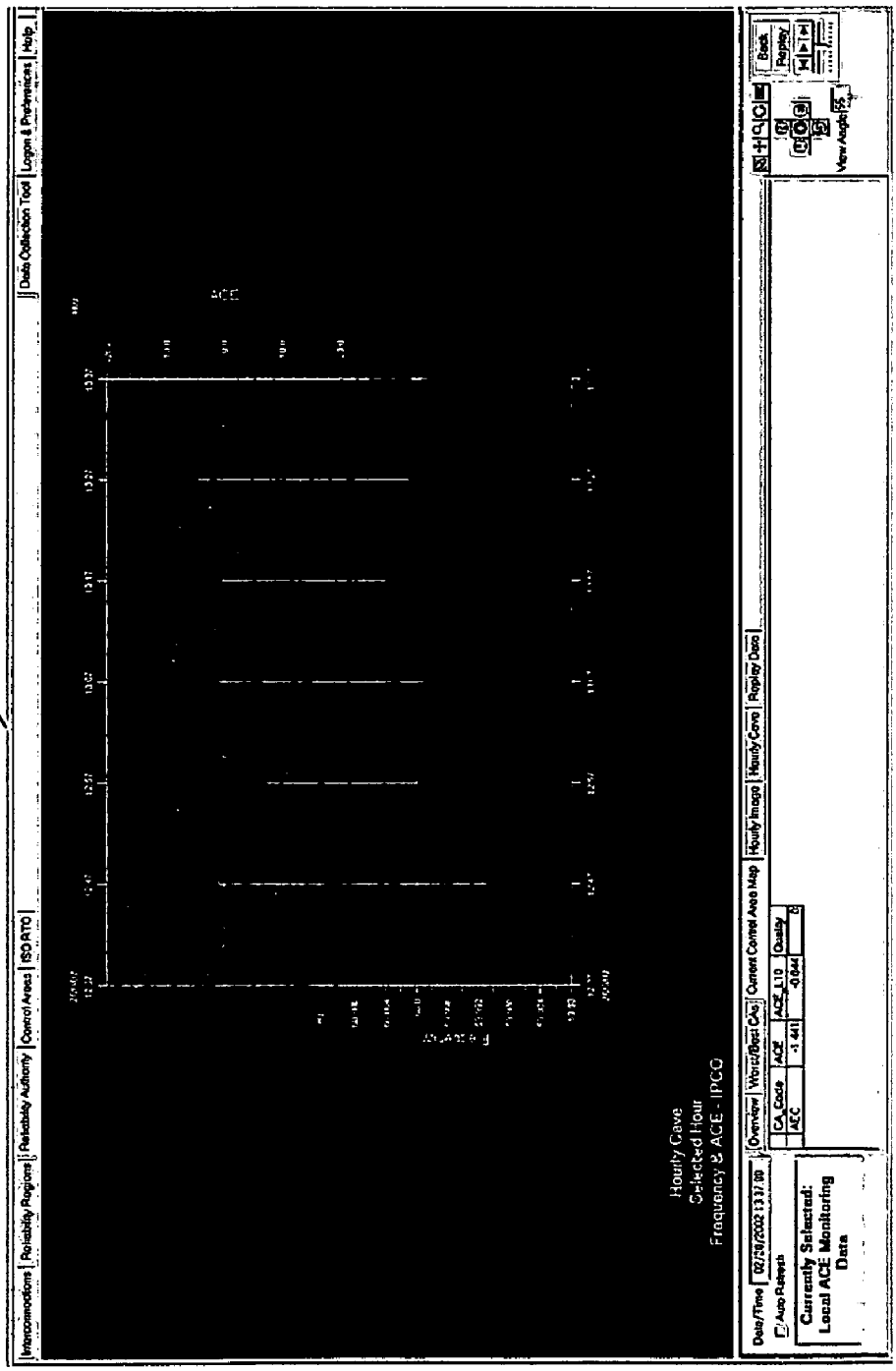
FIG. 17 is screen shot of a Cave diagram that represents a Frequency/ACE diagram in an exemplary embodiment according to the present invention.

The Cave diagram 230 in FIG. 17 represents a Frequency/ACE diagram. Time is displayed on the horizontal axis. The upper graph vertical axis 232 displays the ACE. The lower graph vertical axis 234 displays the frequency. These two elements are used to develop the Cave graph. This type of graph is used as a tool for the review of current data as well as historical data in an exemplary embodiment according to the present invention.

The ACE function allows the user to view data for Epsilon1, ACE, and CPS1. Hence, the user is allowed to view the global, local or tracking data depending on what the user requires can disseminated the data further. The global function may be used to look at one or more of the Epsilon, the local ACE and tracking CPS1.

Referring back to FIG. 11, the CMS receives data from the Control Areas (Data Collection 162) and compares this received data to the submitted compliance data from each Control Area (Standards & Algorithms 166). The results of these comparisons are then displayed graphically (Visualization 164) on a geographical map (Geography 168). The five tiers of display start with the ISO RTO, Control Areas Reliability Authority, Reliability Regions and Interconnections.

Figure 18:
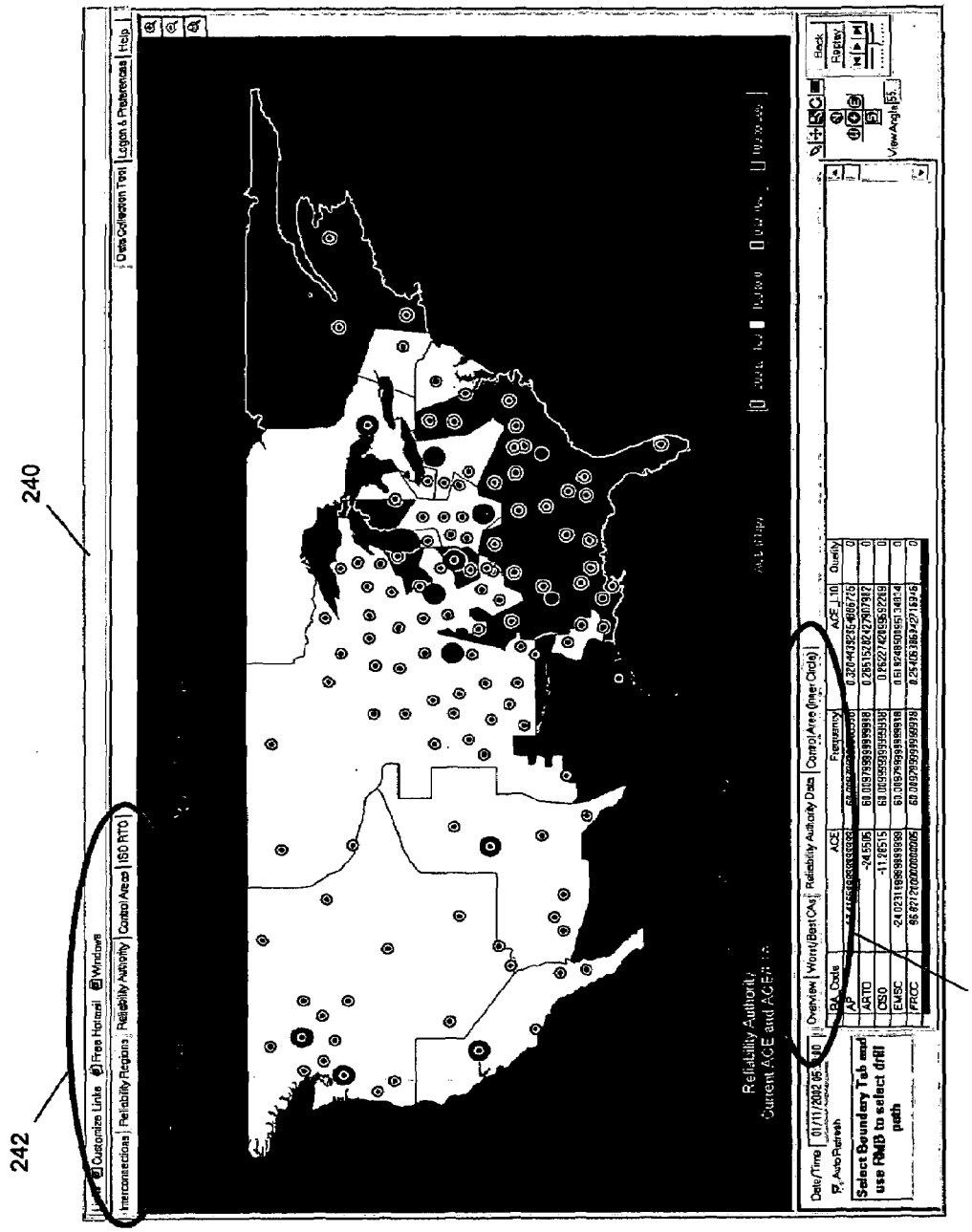
FIG. 18 is a screen shot of a default display for a Reliability Authority in an exemplary embodiment according to the present invention.

FIG. 18 is a screen shot 240 of a default display for a Reliability Authority in an exemplary embodiment according to the present invention. The boundary tabs that appear at the top left side of screen represent the reliability organizations entry points. The five boundary tabs that are used for the CMS in the described exemplary embodiment are as follows: 1) Interconnections; 2) Reliability/Regions; 3) Reliability Authority (default); 4) Control Area; and 5) ISO RTO.

The Interconnection Map is divided into the four (4) NERC Interconnections, West, East, Quebec and Texas. The Reliability Region tab allows the user to view the map in a Region format. The Reliability Authority tab allows the user to view the 20 Reliability Authority areas of responsibility. Further, the Control Areas tab will give the user a map of all the NERC Control Areas. In addition, the ISO RTO map displays the thirteen (13) RTOs. In each of these maps, the Interconnections and/or other areas that do not submit data to the CMS are shown in black. In FIG. 18, for example, Texas is shown in black as it is not currently submitting data to the CMS.

In each of the five boundaries, the current ACE and $ACE/L_{10}$ data is displayed. The corresponding data is presented in a dynamic window 244 that appears at the bottom center of each map. As shown in FIG. 18, the dynamic window has four tabs: 1) Overview; 2) Worst/Best CA's; 3) Reliability Authority Data, which changes to the boundary selected); and 4) Control Area (inner circle).

In the power grid monitoring and management system of the described exemplary embodiment, a 3D map may also be displayed. In addition, the network lines may be generated on the map. Further, the user may also be able to view global Epsilon for the Interconnections. Epsilon is a function of frequency. It is a constant derived yearly from the targeted Interconnection frequency deviations found from the prior year. This constant is used to compare the last hour frequency performance against this constant, and used to assist the Regional Authority on knowing how the Interconnection control has performed. For example, when the constant and measured value equal a number between 0-8 the map may be colored in blue ("good") for that Interconnection. Should the comparison of the Epsilon be greater than 8, but less than 10 then that Interconnection may appear as green ("satisfactory") on the Interconnection map. Similarly, the Interconnection may appear yellow ("warning") between Epsilon of 10-11 and red ("violation") for Epsilon greater than 11.

Figure 19:
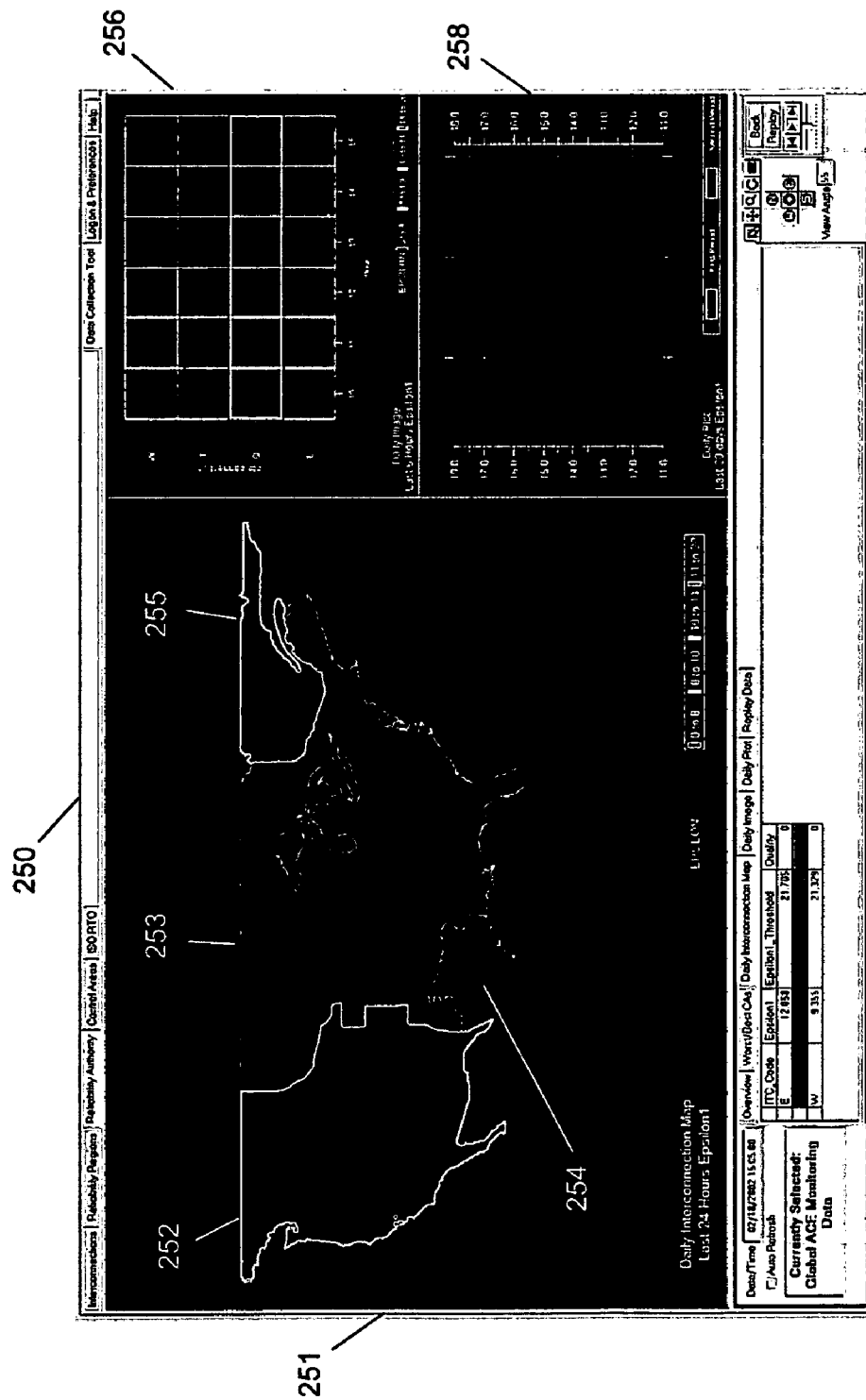
FIG. 19 is a screen shot of an Interconnect-Epsilon map in a three-panel display in an exemplary embodiment according to the present invention.

The Epsilon for the selected one or more Interconnections for the past 24 hours may be viewed, for example. FIG. 19 is a screen shot 250 of an Interconnect-Epsilon map in a three-panel display in an exemplary embodiment according to the present invention. It can be seen in a first panel 251 that the United States is divided into four Interconnections: 1) Western (W) 252; 2) Eastern (E) 253; 3) ERCOT (T or Texas) 254; and 4) Quebec (Q) 255.

The user may select one or more Interconnections for view. In the screen shot 250, the "Daily Interconnection Map—Last 24 Hours Epsilon" 251 occupies the first panel. The "Daily Image Panel" 256 is in the upper right hand corner, and the "Daily Plot Panel" 258 is located in the lower right hand corner of the display. To have any one of the panels viewed as a full screen for better viewing, the desired panel may be right clicked to bring up a pop-up menu. By selecting "Maximize", the Panel may be shown as a full screen. The power grid monitoring and management system also allows for replaying using a replay function, for example. The replay may be up to 24 hours or more, for example. The replay speed may also be controlled to be slower and/or faster.

Figure 20:
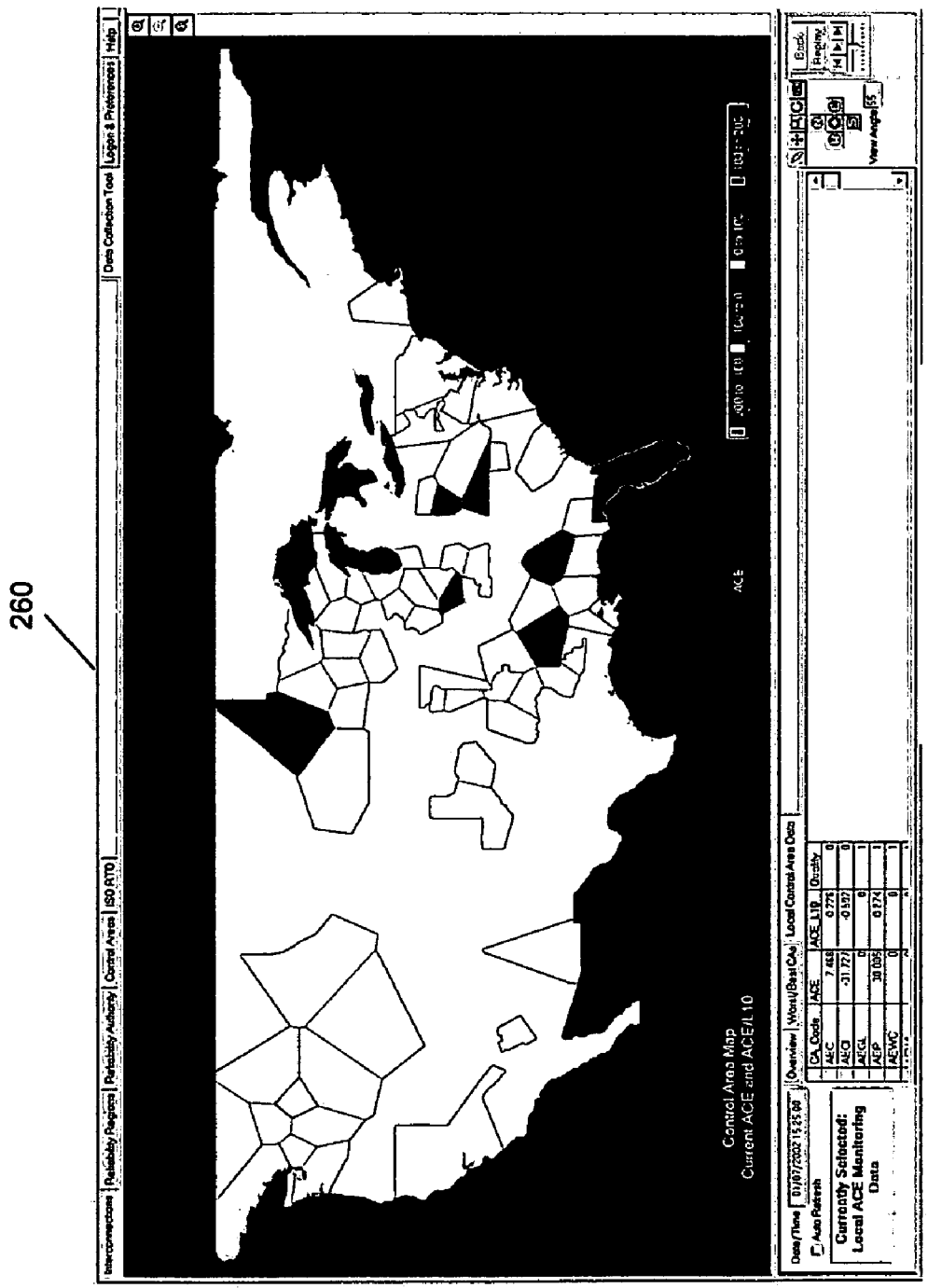
FIG. 20 is a screen shot of a local view for a Control Area map in an exemplary embodiment according to the present invention.

FIG. 20 is a screen shot 260 of a local view for a Control Area map in an exemplary embodiment according to the present invention. The graphic in the view of FIG. 20 shows the ACE and $ACE/L_{10}$. The Control Areas' ACE and/or $ACE/L_{10}$ may be color coded so that as the Control Area's "ACE" changes the colors may be represented for the Control Area. For example, the ACE of −200 to −100 may be represented by red, −100 to 0 by yellow, 0 to 100 by green and 100 to 2000 by blue.

Also for the local view, a three-panel display may be displayed for a specific Control Area. The adjacent Control Areas may be defined as two Control Areas that are interconnected: 1) directly to each other; or 2) via a multi-party agreement (e.g., ISO and Power Pool agreements) or transmission tariff. Selecting Adjacent 0 may show only the Control Area, Adjacent 1 may show adjacent Control Areas, and Adjacent 2 may go out to the second level out away from the selected Control Areas. Selecting All may select all Control Areas. An actual interchange is a metered interchange over a specific interconnection between two physically adjacent Control Areas. An inadvertent interchange is a difference between the Control Area's net actual interchange and a net scheduled interchange.

Figure 21:
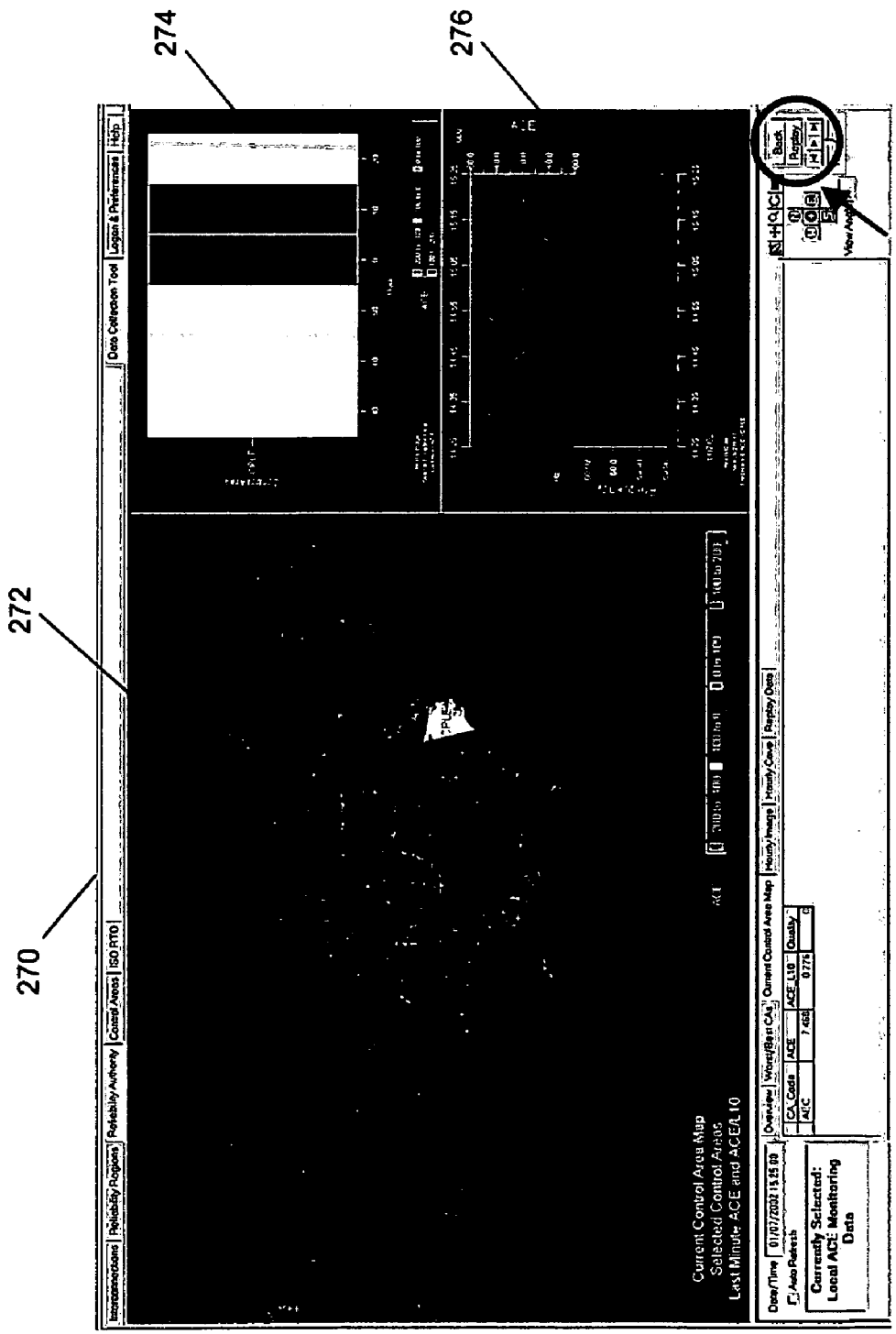
FIG. 21 is a screen shot of a current Control Area map for a selected Control Area in an exemplary embodiment according to the present invention.

For example, FIG. 21 is a screen shot 270 of a current Control Area map for a selected Control Area 272 in an exemplary embodiment according to the present invention. The selected Control Area 272 is shown in yellow on the ACE map. The upper right hand corner shows a last hour ACE 274. This display is broken into 10-minute increments. A Cave graph 276 displays frequency and ACE for the last hour. The last hour ACE and the hourly Cave may also be displayed separately in the full screen. Similar to the global view, the local view ACE may be replayed for last 24 hours or more, during which the replay speed may be adjusted to become faster and/or slower.

Figure 22:
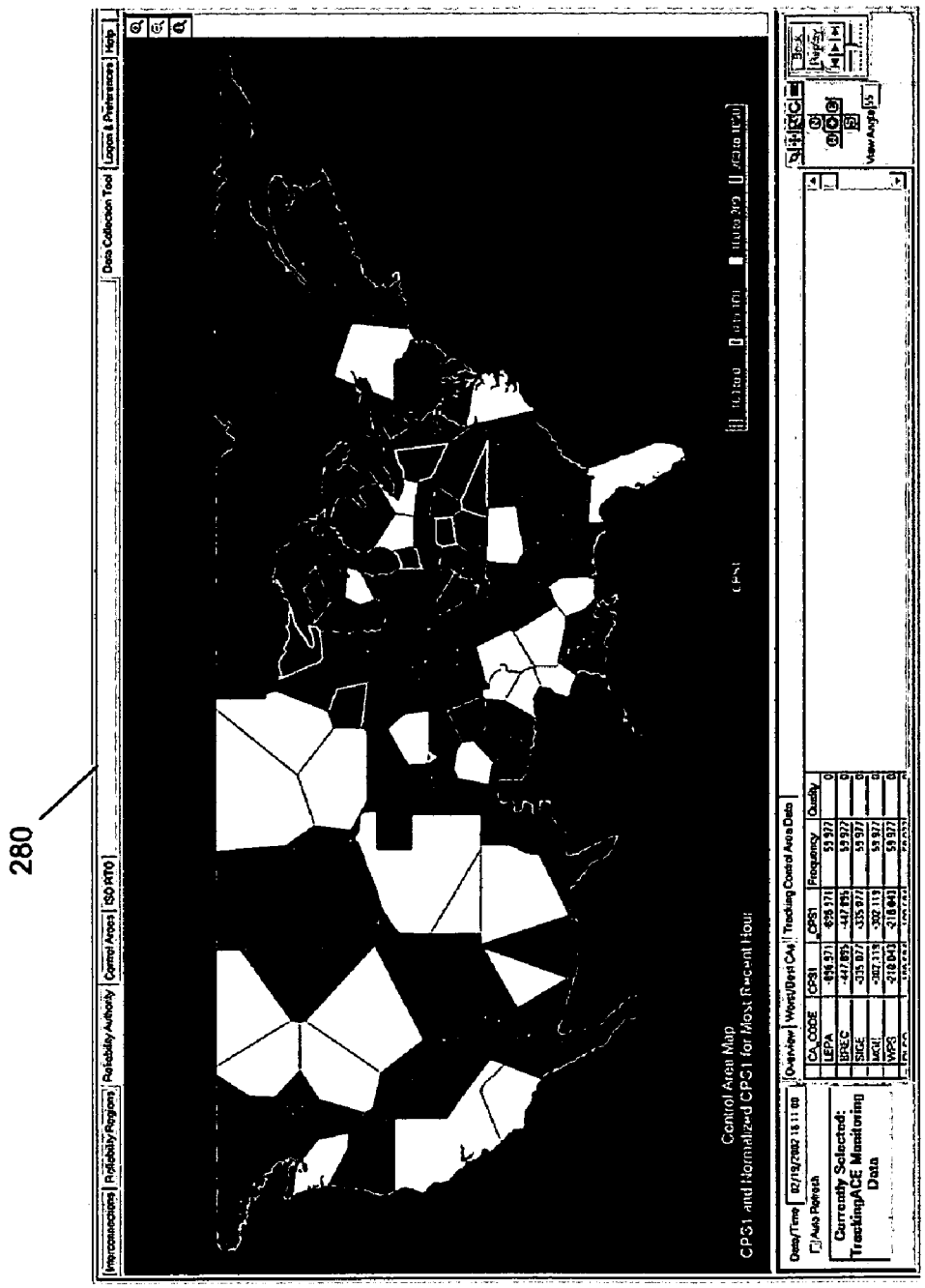
FIG. 22 is screen shot of a CPS map in an exemplary embodiment according to the present invention.

FIG. 22 is screen shot 280 of a CPS map in an exemplary embodiment according to the present invention. The CPS map in the described exemplary embodiment is the same for each of the five boundary tabs. The CPS map may be color coded to visually give the user, for example, a view of the number of items in the ten (10) minute window of CPS1 that the ACE did not cross zero for the last hour when compared to the Control Area's stated CPS1. For example, blue may represent 0 to −100%, green may represent 0 to 100%, yellow may represent 100% to 200%, and red may represent 200% to 1,000%.

Figure 23:
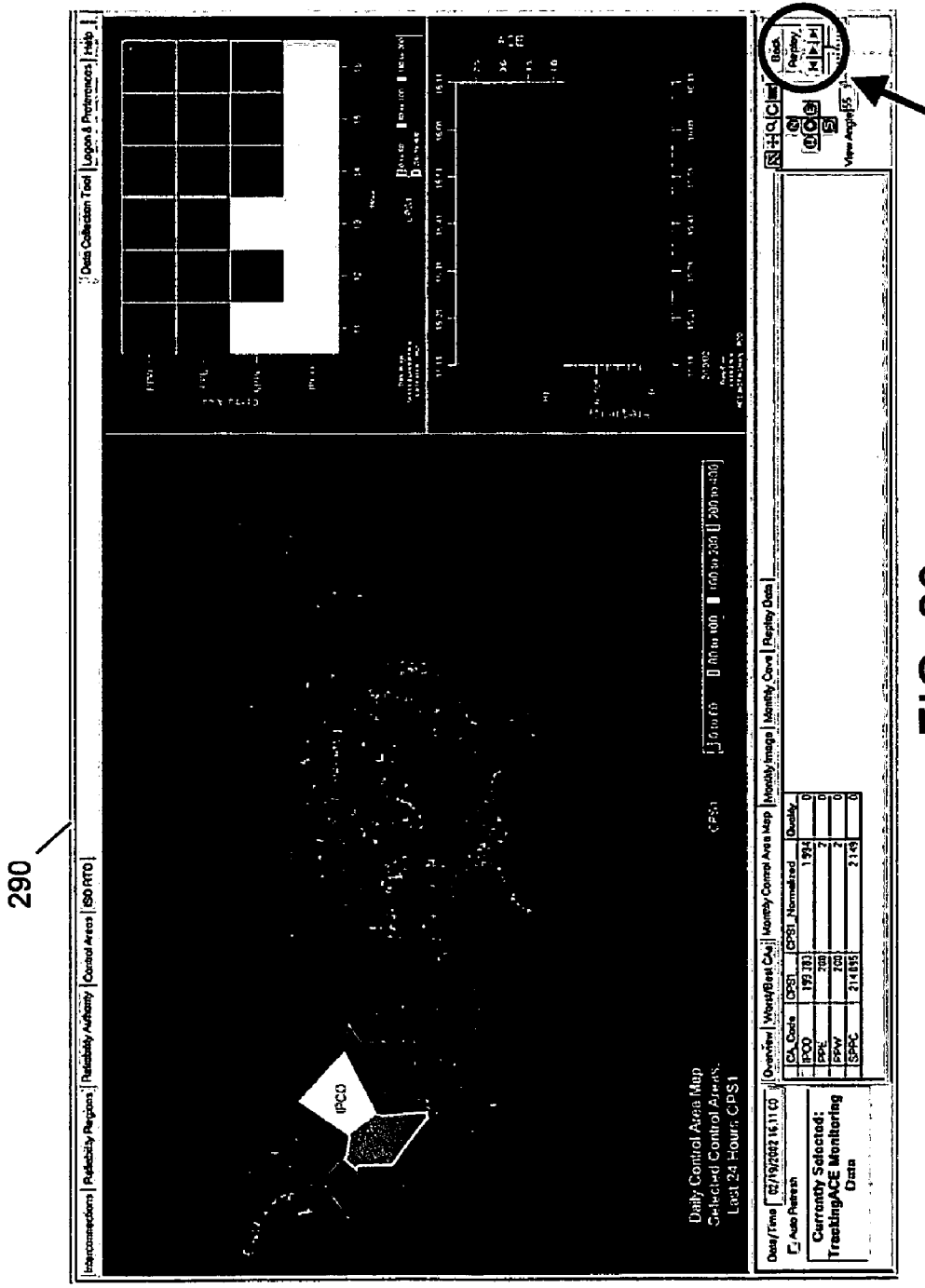
FIG. 23 is a screen shot of a three-panel view in an exemplary embodiment according to the present invention.

By selecting the Control Area, and selecting a daily or monthly view, a three-panel view may be obtained for the Control Area and/or adjacent areas. For example, FIG. 23 is a screen shot 290 of a three-panel view in an exemplary embodiment according to the present invention. This particular map, for example, was generated using Adjacent 1 feature. From this screen, a replay of last 24 hours or more may be obtained. Further, the replay speed may also be controlled to be faster and/or slower.

Figure 24:
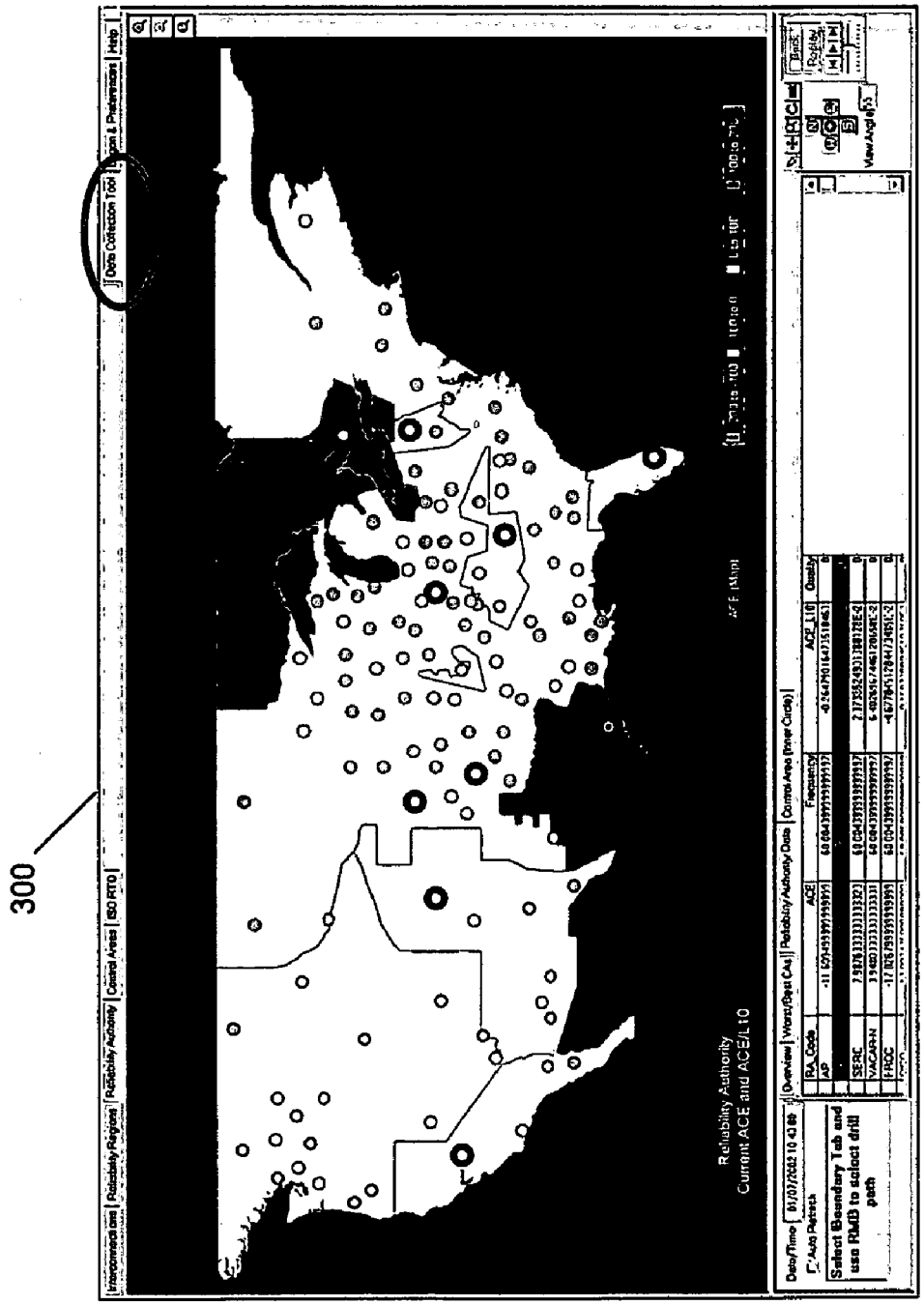
FIG. 24 is a screen shot of a data collection tool in an exemplary embodiment according to the present invention.

FIG. 24 is a screen shot 300 of a data collection tool in an exemplary embodiment according to the present invention. The data collection tool may allow the user to view/extract raw data from the NERC database. This tool may be used to view the data that has been collected for the user to analyze.

Figure 25:
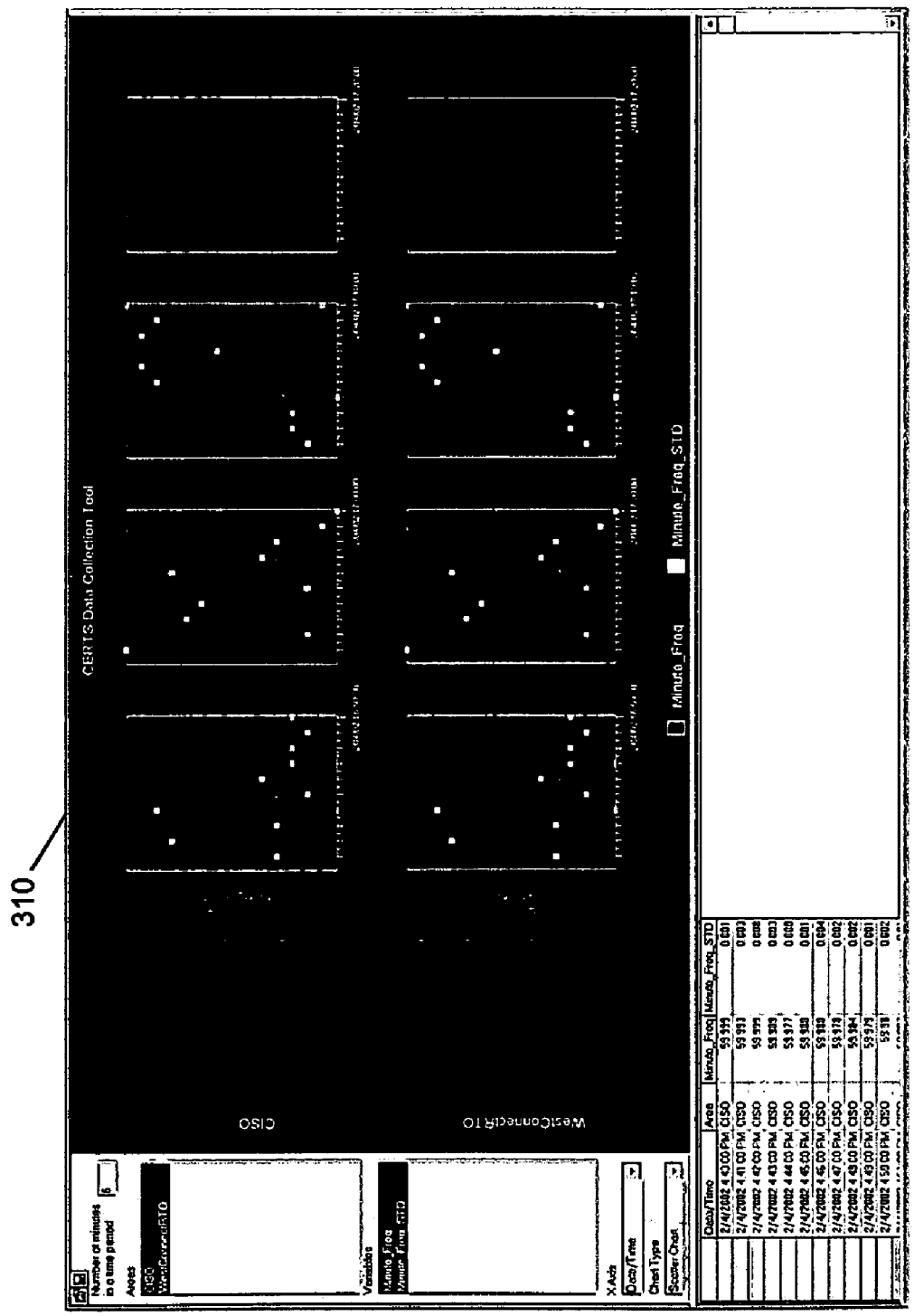
FIG. 25 is a screen shot of charts generated using the data collected using the data collection tool of FIG. 24.

Using the collected data, one or more charts may be generated as shown on a screen shot 310 of FIG. 25, for example.

Figure 26:
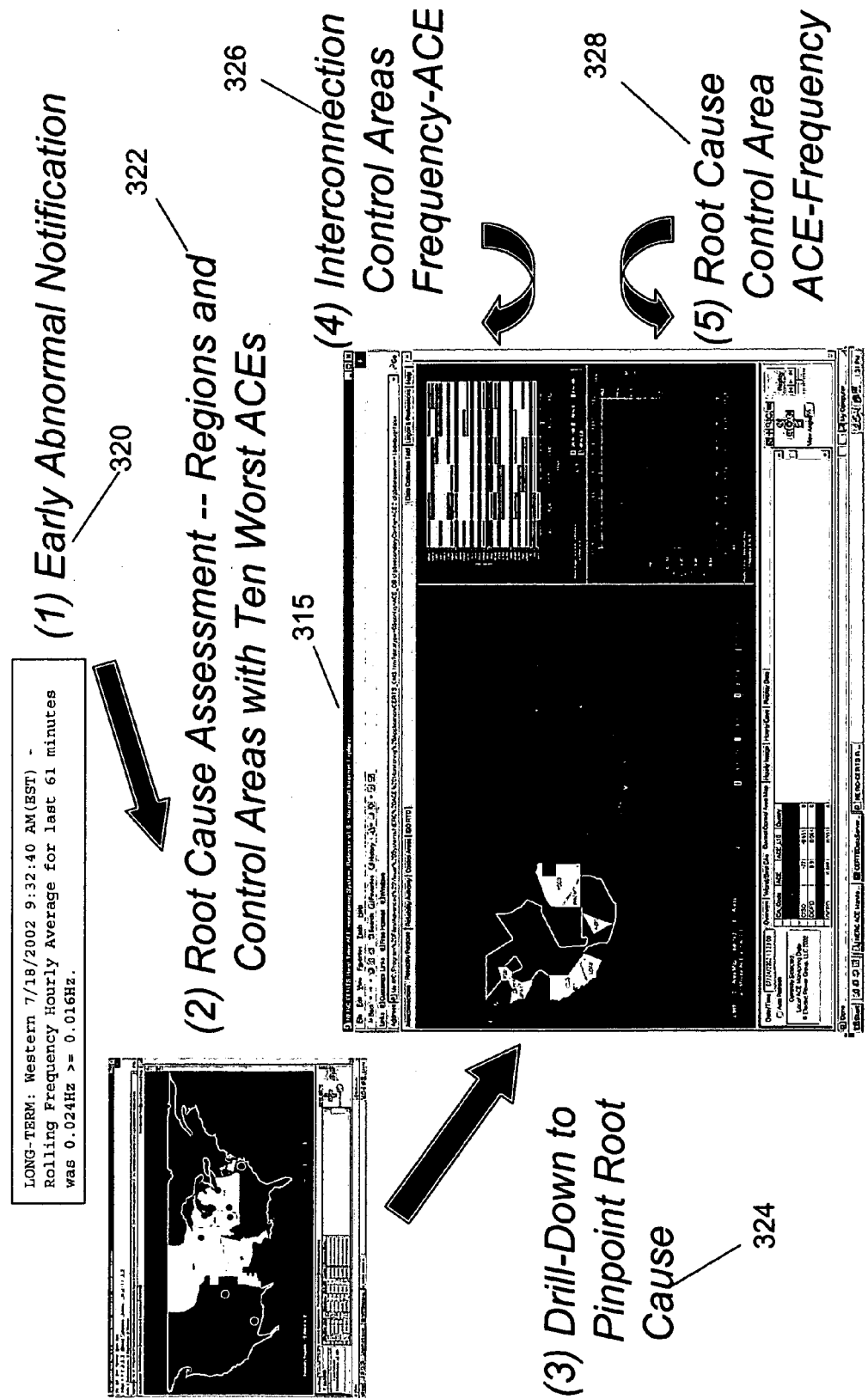
FIG. 26 illustrates utilization of NERC ACE-Frequency monitoring in an exemplary embodiment according to the present invention.

FIG. 26 illustrates utilization of NERC ACE-frequency monitoring 315 in an exemplary embodiment according to the present invention. The power grid monitoring and management system receives an early abnormal notification 320. Then a root cause assessment 322 is performed for Regions and Control Areas with ten (10) worst ACEs, for example. Of these Regions and Control Areas, the root cause is pinpointed (324). Further, the Interconnection Control Areas Frequency-ACE and Root Cause Control Area ACE-Frequency are analyzed (326, 328).

Figure 27:
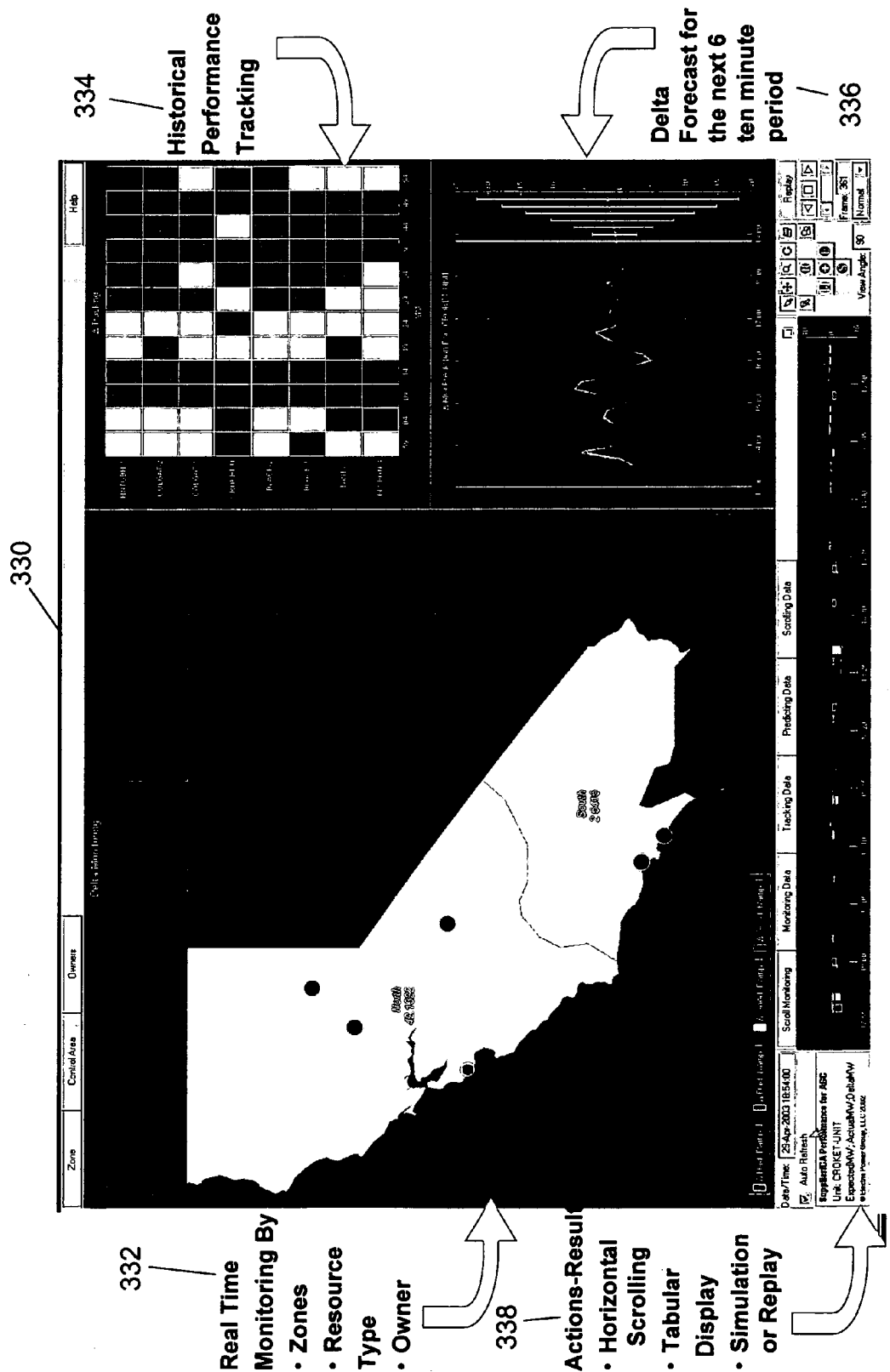
FIG. 27 illustrates a screen shot of a supplier-Control Area performance for AGC and frequency response application in an exemplary embodiment according to the present invention.

FIG. 27 illustrates a screen shot 330 of a supplier-Control Area performance for AGC and frequency response application in an exemplary embodiment according to the present invention. For example, as can be seen in a first panel 332, real-time monitoring can be performed by zones, resource types and/or by owner. Actions/results may be viewed through horizontal scrolling and/or tabular display 338. Further, a simulation or replay may also be performed/displayed. In the other panels 334 and 336 of the three-panel display, a historical performance tracking and delta forecast for the next six (6) ten minute periods, respectively, are also displayed.

Figure 28:
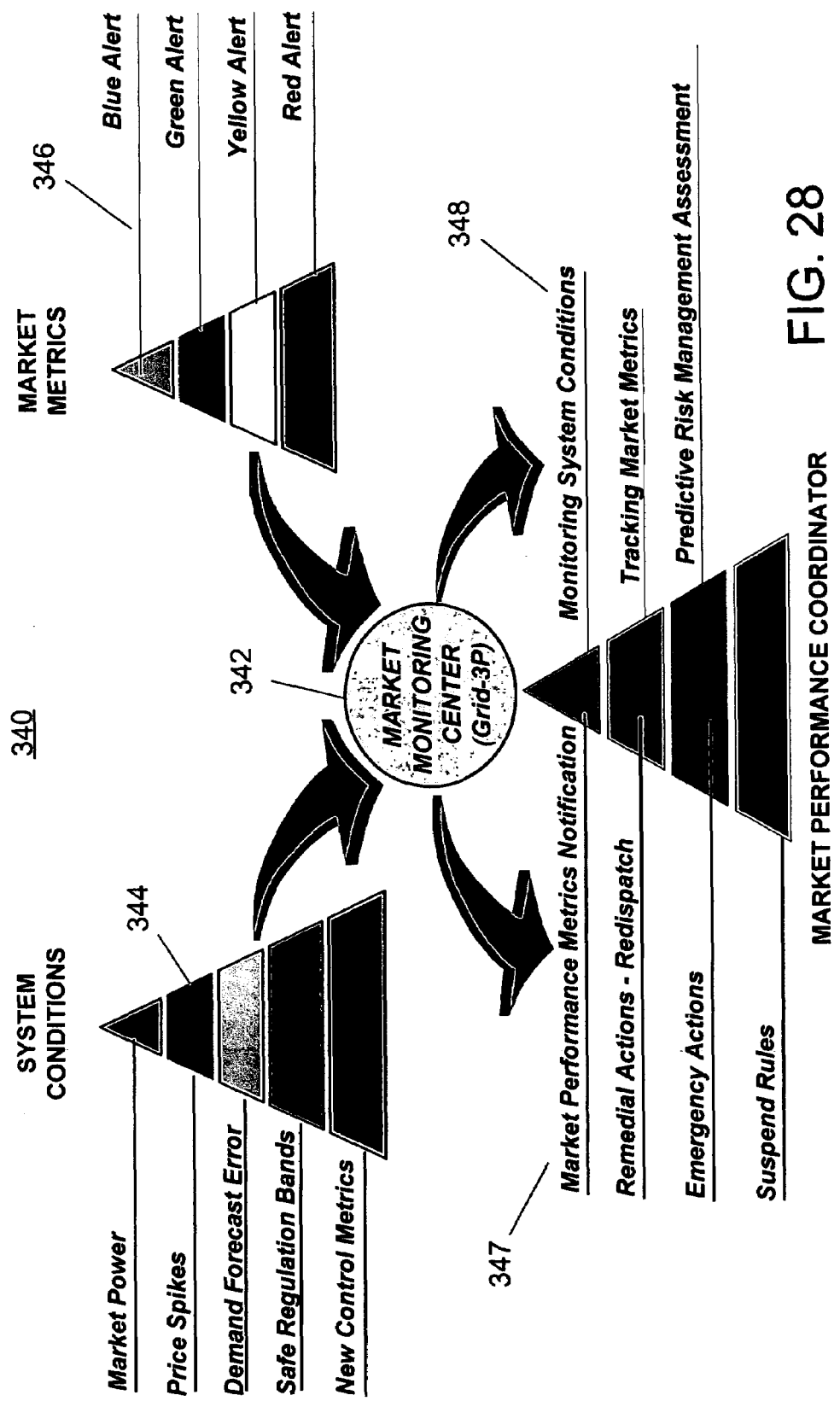
FIG. 28 illustrates a market monitoring system in the power grid monitoring and management system in an exemplary embodiment according to the present invention.

FIG. 28 illustrates a market monitoring system 340 in the power grid monitoring and management system in an exemplary embodiment according to the present invention. In the market monitoring system 340, a market monitoring center 342 (in the power grid monitoring and management system) receives systems conditions 344 such as market power, price spikes, demand forecast error, safe regulation bands and/or new control metrics. Also, the market monitoring center 342 receives market metrics such as blue alert, green alert, yellow alert and/or red alert. Then the market monitoring center performs actions 347 such as market performance metrics notification, remedial actions (e.g., re-dispatch), emergency actions and/or suspend rules. Further, the power grid management system monitors system conditions, track market metrics, assess predictive risk management, and the like (348).

Figure 29:
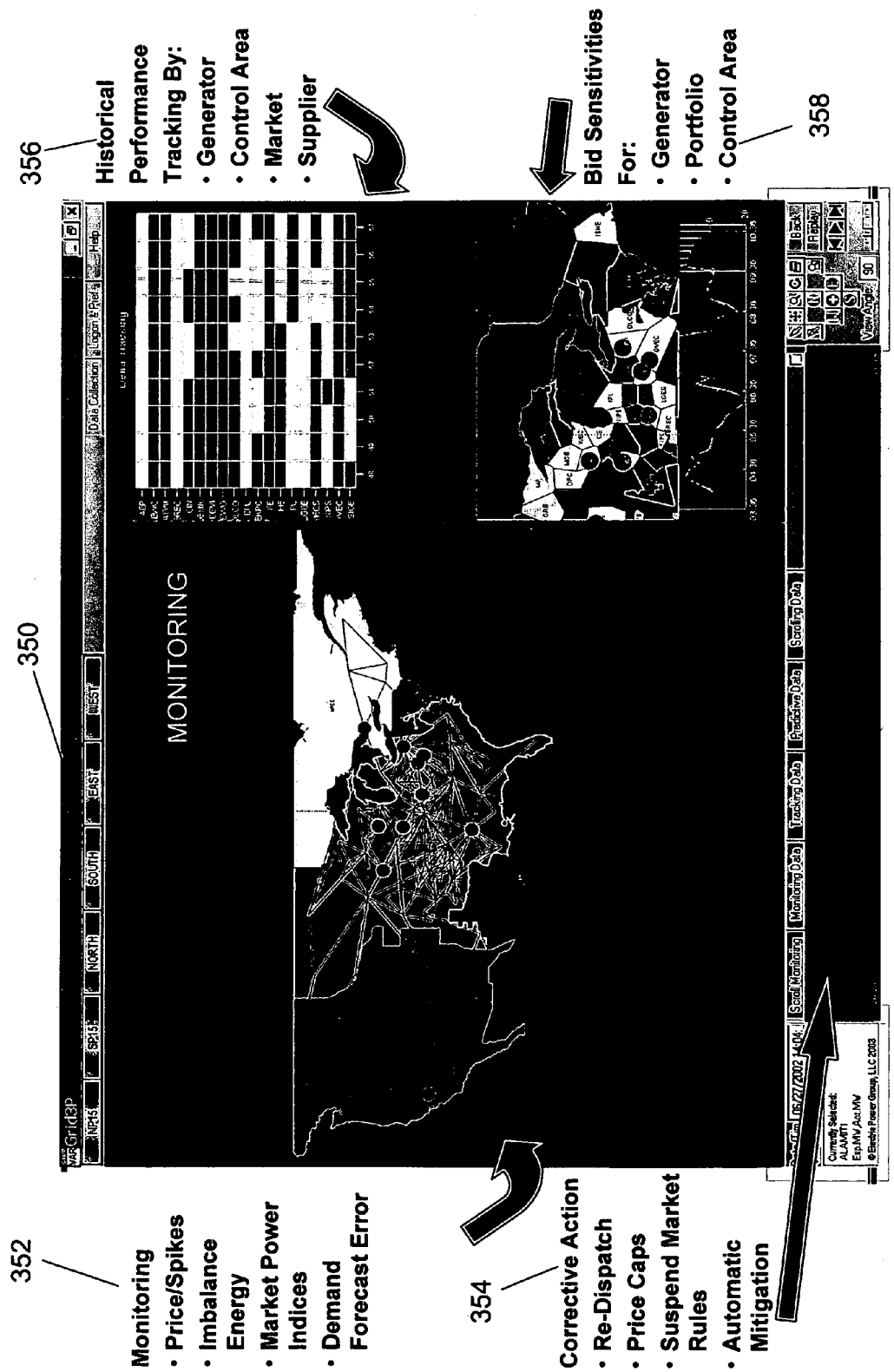
FIG. 29 illustrates a screen shot of a market monitoring application in an exemplary embodiment according to the present invention.

FIG. 29 illustrates a screen shot 350 of a market monitoring application (of the power grid monitoring and management system) in an exemplary embodiment according to the present invention. For example, the system monitors (352) prices/spikes, imbalance energy, market power indices, and/or demand forecast error. Further, the system is used to take corrective actions (354) such as re-dispatch, price caps, suspend market rules and/or automatic mitigation. In two other panels of the three panel view of FIG. 29, the system also tracks (356) historical performance by generator, control area, market and/or supplier, and/or the like, and bid sensitivities (358) for generator, portfolio and/or Control Area.

The power grid monitoring and management system in an exemplary embodiment according to the present invention performs Security Center monitoring. The Security Center operational hierarchy may include one or more of: 1) Security Monitoring Center using current and future synchronized data; 2) NERC 22 Reliability Coordinators; 3) RTOs/ISOs, Control Areas; 4) transmission only providers; 5) generation suppliers; and 6) load serving entry.

Figure 30:
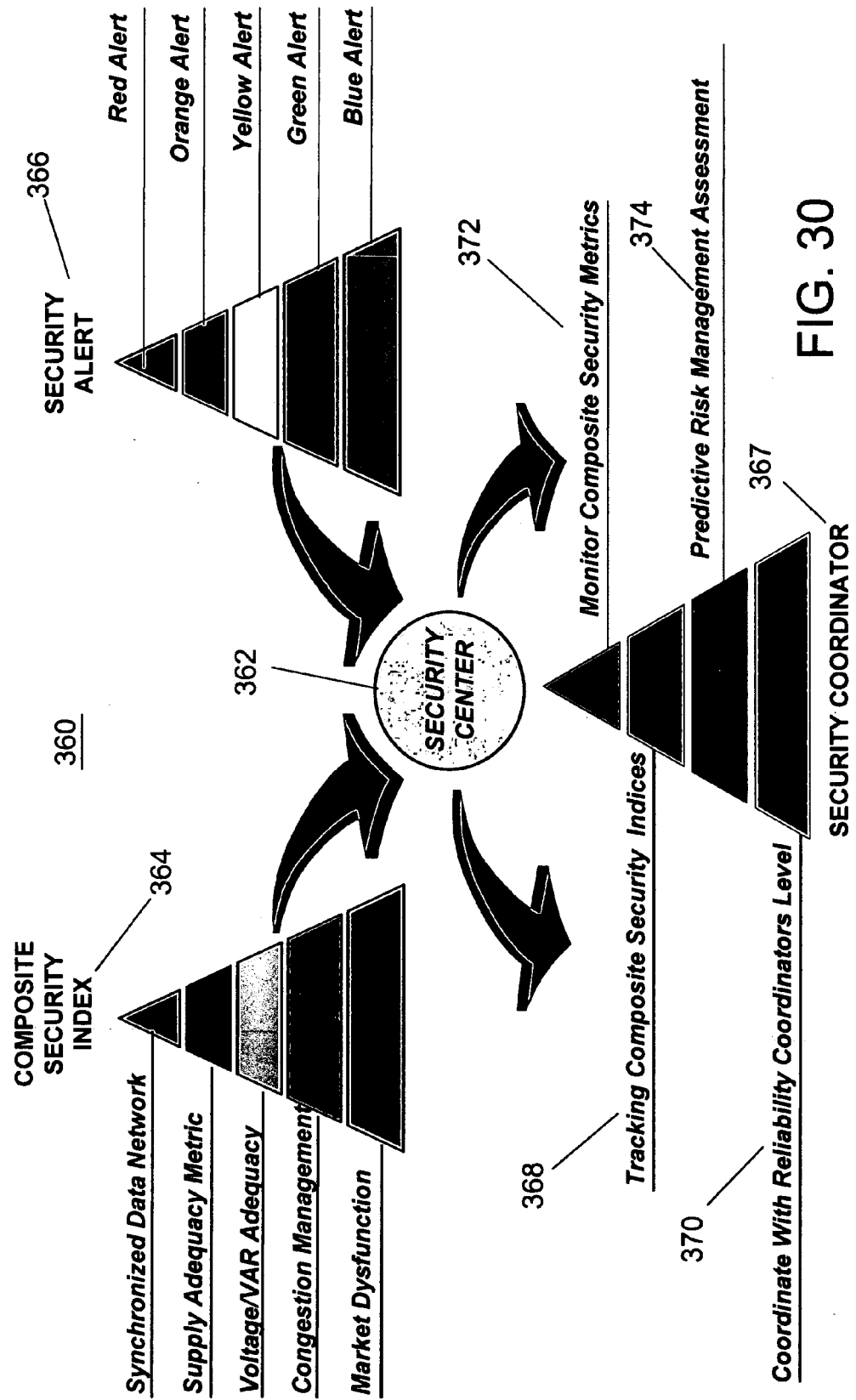
FIG. 30 illustrates a security center monitoring system in an exemplary embodiment according to the present invention.
Figure 31:
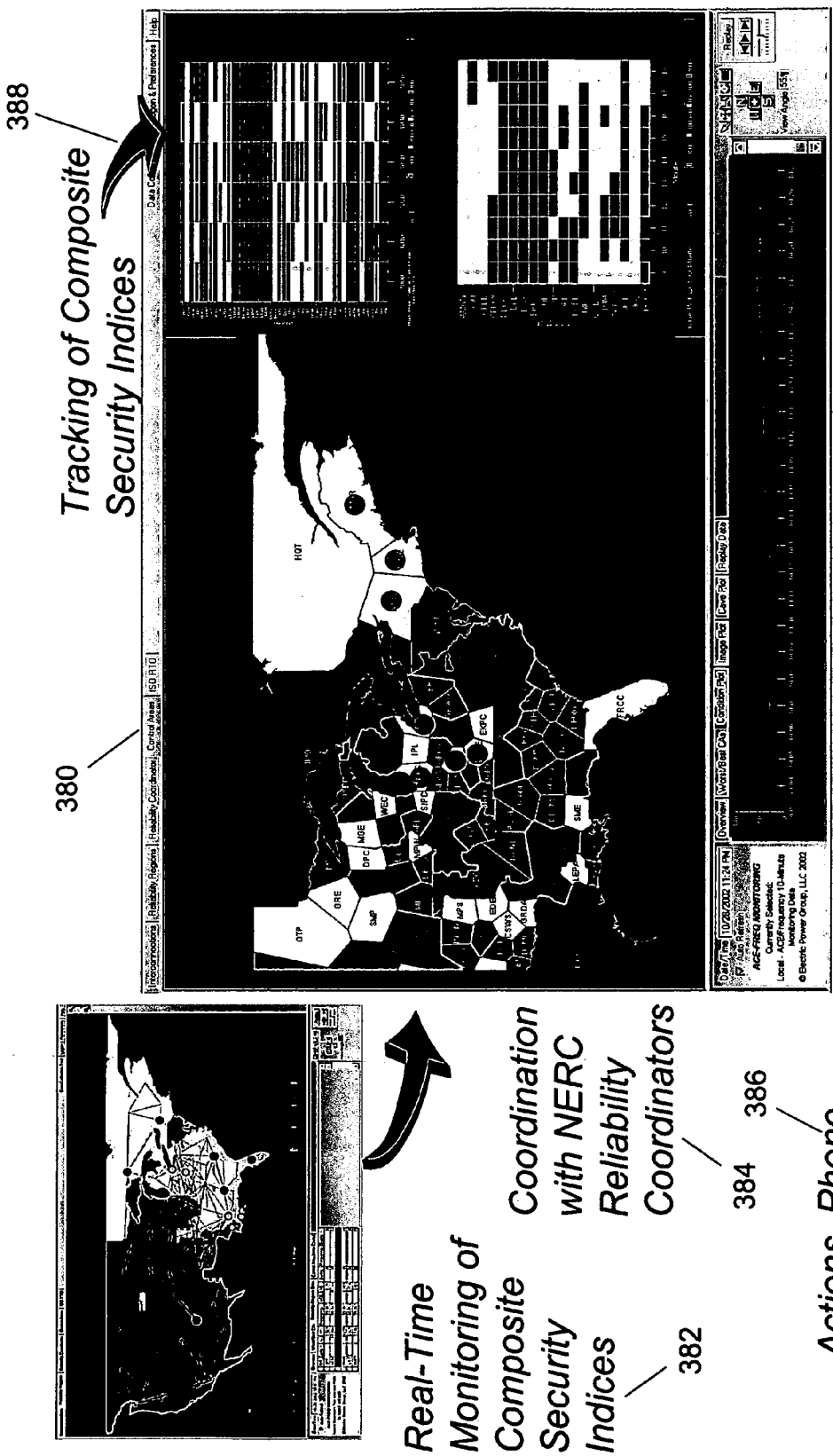
FIG. 31 illustrates a screen shot of a real-time security monitoring application of the power grid monitoring and management system in an exemplary embodiment according to the present invention.

FIG. 30 illustrates a Security Center monitoring system (of the power monitoring and management system) in an exemplary embodiment according to the present invention. A Security Center 362 receives composite security indices 364, which include synchronized data network, supply adequacy metric, voltage/VAR adequacy, congestion management and/or market dysfunction. The Security Center also receives security alerts 366, which include red, orange, yellow, green and/or blue alerts. The Security Center 362 in coordination with a Security Coordinator 367 tracks composite security indices 368, monitors composite security metrics 372, assesses predictive risk management 374, and coordinates with Reliability Coordinators level 370. FIG. 31 illustrates a screen shot 380 of a real-time security monitoring application (of the power grid monitoring and management system) in an exemplary embodiment according to the present invention. The system performs a real-time monitoring of composite security indices (382), and also tracks the composite security indices (388). In addition, the system coordinates with NERC Reliability Coordinators. Further, the system also provides actions, phone numbers and e-mails to facilitate the coordination (386).

Figure 32:
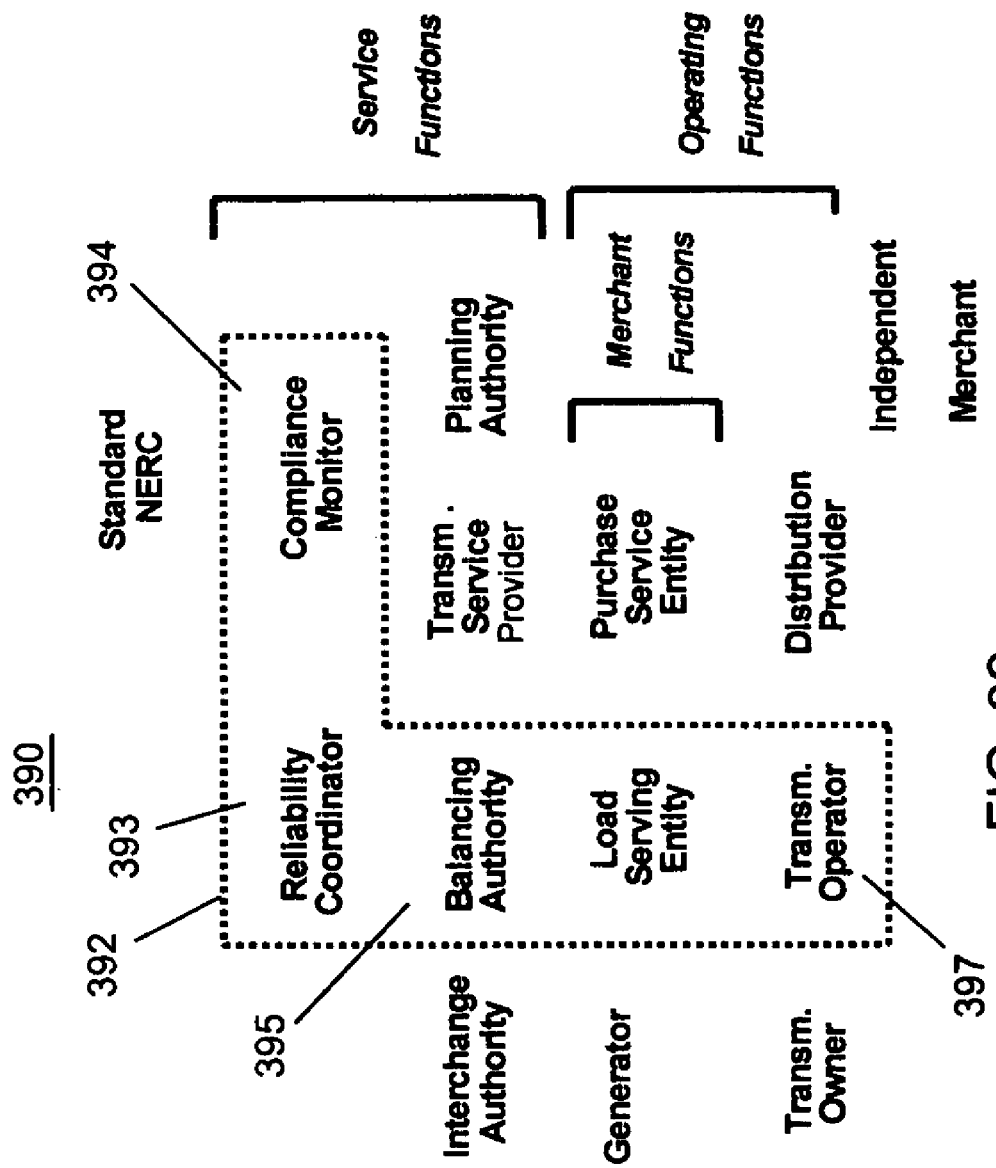
FIG. 32 is a block diagram of a NERC reliability functional model in an exemplary embodiment according to the present invention.

FIG. 32 is a block diagram of a NERC reliability functional model 390 in an exemplary embodiment according to the present invention. The power grid monitoring and management system in exemplary embodiments according to the present invention facilitates the integration process, focusing first on the applications required by the stakeholders within a dotted line 392. Functions within the dotted line include reliability coordination 393 and compliance enforcement 394, balance authority service acquisition 395, load servicing entities procurement 396 and the actual usage of the services by the transmission operators 397.

In an exemplary embodiment according to the present invention, the power grid monitoring and management system is adapted for the monitoring, tracking and short term prediction of CAISO CA and suppliers response to AGC, FRR, and ancillary services (A.S.) regulation performance/requirements. In the described exemplary embodiment, the power grid monitoring and management system will track and predict both the Control Area's and the supplier's performance for the above three services (AGC, FRR and A.S.). The power grid monitoring and management system, for example, may be used by the real-time operators, the operating engineering staff and/or management.

The real-time operators may obtain one or more of the following benefits through the present invention: 1) enhanced ability to monitor and track the CAISO Control Area and Suppliers response to AGC, including the ability to segregate into areas, (e.g., Northern and Southern California) and suppliers; 2) identify Control Area and supplier's actions, their performance and near real time predictions to frequency response; 3) identify and provide information for possible required changes in next hour's scheduled A.S. for Regulation; 4) identify and provide information for possible required changes in next day's scheduled A.S. for Regulation; and 5) one general overview display that show all three functions. More detailed displays may be available for each area.

The operating engineers may reap one or more of the following benefits from the power grid monitoring and management system of the present invention: 1) provides them with unit specific performance information; and 2) provides them with information that allows them to work with plant owners to improve their response to AGC, FRR and A.S. Regulation. Further, the power grid monitoring and management system of the present invention may provide to the management near real-time operational information that allows them to evaluate the effectiveness of market rules and tariffs.

The power grid monitoring and management system may also provide reliability services to the relationships between operational reliability objectives, services required for reliable operations and the roles and responsibilities for the control and operation authorities. For example, the reliability services may be provided to transmission reliability, supply resources and demand balance, and A.S. markets.

Returning now to FIG. 6, the top half of FIG. 6 shows the architectural overview of the application of the power grid monitoring and management system for monitoring real-time control performance at the reliability coordinator level. The applications have been designed, deployed and tested for the NERC Reliability Coordinators. The bottom half of FIG. 6 shows the overview for the Control Area level. The power grid monitoring and management system integrates response to AGC, FRR and A.S. to effectively visualize how the CAISO Control Area and Suppliers are performing for each of the three areas.

A System operator normally has an available range of AGC control, both up and down, displayed on some type of general overview. These values, in today's systems, are normally mapped into these overviews as provided by successful bidders of Regulation A.S. This AGC range & ability governs many decisions made on real time (i.e., magnitude of Control Area Interchange ability, coverage of manually directing on-line generators for various reasons, etc.). In one exemplary embodiment, the AGC module of the power grid monitoring and management system qualifies the accuracy and performance of that AGC range as it happens and records it. For example, the AGC module may display and track how much a generator on AGC control is signaled to move in MW and presents various displays/documentation on how well (or not) that requirement is/was being met.

The user may have the ability to see generator response to AGC in real-time. Aside from over-all aggregate views, the user can display (select or "turn on") a segregation of generators into zones (e.g., Northern California and Southern California) and suppliers, which could aid real-time decisions. As an example, monitoring could show all generators in the north meeting 100% response requirements and only 70% in the south, dictating possible manual intervention for an upcoming large ramp that might leave undesired loadings on constrained paths (e.g., Path 15). Aside from regional segregation ability, the power grid monitoring and management system can also separate displays into types of generators (i.e., 150 Mw, 750 MW, Hydro, etc.).

The displays for tracking may show the response performance of suppliers to AGC for the previous hour, day and week. By utilizing historical response data, the application may predict the response performance of each supplier to AGC for the next 10, 20, 40 and 60 minutes.

In Summary, the AGC module may achieve/produce one or more of the following: 1) a visual representation of the real-time performance of each generator on AGC; 2) various options of displaying aggregate and detailed information on AGC units; 3) provisions for alarm points when established parameters are met; 4) selectable Time Period Displays and Printouts, (Previous Hour, Day, Week) of a generator's performance. They can be used for monetary penalties in billing and for various analysis efforts; and 5) can be used for near real time prediction. (10, 20, 40 and 60 minutes). The system overview visualizations to show the above functionalities will be discussed later.

In an exemplary embodiment according to the present invention, the power grid monitoring and management system provides control area and suppliers response performance monitoring, tracking and prediction to FRR. Historically, having NERC Standards in place has provided adequate assurance that the Control Areas and interconnected generators within each Interconnection, as well as load shedding, were able to effectively respond to contingencies and adequately arrest frequency excursions, thereby meeting design expectations. Within the WECC (i.e., Western Interconnection), the normal and expected change in system frequency for the loss of 1,000 MW of generation has been a 0.1 Hz decay. In recent years, however, it is not unusual to experience a 0.1 Hz decay in system frequency with only a 300 or 400 MW loss of generation. So FRR Monitoring, Performance Tracking and Prediction implementation at CAISO is desirable.

The following example illustrates a frequency decay by 0.2 Hz for a loss of about MW. It appears, for whatever reasons, that the overall frequency response of the interconnected system has changed significantly, in a negative way. The exemplary embodiment implements new standards, specifically addressing the issue of frequency response, and establishing the necessary monitoring and tracking system (s) to evaluate the performance of the frequency responsive resources and the Control Area.

A Control Area's frequency response performance is the result of how good or bad all the Frequency Response resources connected to the transmission system respond and perform. This application will monitor, track, and project Frequency Response Reserves performance in the CAISO Control Area.

Major functions of the FRR module may include one or more of:

1) Performance—monitor the performance of the CAISO's Control Area response to frequency excursions, calculate the MW/0.175 Hz deviation and determine if the Control Area is in compliance with the proposed NERC/WECC FRR standards. In addition, the application may monitor the actual performance of each of the frequency responsive resources that are expected to support the Control Area response to frequency excursions and calculate their contribution per MW/0.175 Hz deviation. This module will provide the answer to the question, "Which resources are contributing to the Control Area's overall compliance with the Frequency Response Reserves (FRR) standards?";

2) Tracking—time tagging and archiving of actual data associated with monitoring performance and MW/0.175 HZ deviation performance of the Control Area to frequency excursions, as well as the performance of the individual frequency responsive resources. Data may be stored in a time series database and used to present the pattern and behavior of specific resources. Historical data may also be used to feed the prediction module. It can also be an ingredient of any required disturbance control standard (DCS refers to the standard which requires the ACE to return either to zero or to its pre-disturbance level within 15 minutes following the start of the disturbance, which is a) any perturbation to the electric system, or b) an unexpected change in ACE that is caused by the sudden loss of generation or interruption of load.);

3) Probabilistic prediction—provide the CAISO staff with a prediction of the expected performance of the frequency response resources to the next frequency excursion. A more accurate forecast of the upcoming performance in meeting the FRR standards may allow the CAISO to maintain and improve system reliability and market efficiencies. If the prediction module of the application determines that the anticipated resource configuration is inadequate in meeting the FRR requirement, it can produce a suggested alternative or additional resource requirements; and 4) Visual Analysis—the power grid monitoring and management system visual analysis layer may facilitate the interpretation of the results from each of the major functions. Taking advantage of the visualization technology available in the power grid management system, it may present past, current and near term future information to the CAISO staff on tabular, graphical and/or geographical displays. The application may provide the ability to segregate suppliers into zones, such as Northern & Southern California, and also of the various "types" of generators.

Load shedding on non-critical loads is another FRR resource that the system operator may have to adjust frequency. For this reason, the performance of load shedding (measured as MW/0.175 Hz) as a frequency control resource may also be determined, tracked and predicted.

The suppliers response performance to AGC previously explained, displayed and recorded what each and all Control Area regulating generators were signaled to move and how they performed, relative to that signal. This application may track and record the delta or difference between what the supplier bid in regulation service for the Hour Ahead Market and its actual response.

Ancillary Service of regulation is normally prescheduled for the hour ahead (and day ahead) via the marketplace. A successful supplier of regulation will normally have an up and down magnitude, although one direction only can occur. In conjunction with that MW range, a ramping (rate of change) magnitude is also provided by the supplier, normally in percentage or MW/minute.

The displays for monitoring of this application will show and record how well a generator is providing regulation, follows control signals sent by CAISO's Energy Management System Computer and will compare it to the parameters (ramp rate) provided by the supplier (Bid, Contract or Plant Information) in the Hour Ahead or Day Ahead Market.

The displays for tracking will show the supplier's historical response performance to the hourly ancillary services market for the last day and week. This information could be shared with the suppliers that provide this service, to improve quality, or even be made inclusive of the payment structure when stipulated non-performance occurs.

The displays for prediction will show the suppliers predictive response performance to hourly ancillary services one, two, three and/or four hours ahead. For example, suppose next hour's Regulation range is displaying a 500 MW upward quantity, with a 25 MW/Min aggregate ramp rate, provided by the marketplace. Utilizing historical performance data, this application will note what sources are providing this regulation range and "quantify" it for the System operator. It could, for example, note that only x-amount is available over a designated time period or that only 15 MW/Min rate of change is achievable. If that reality is unacceptable, the system operator may have the option of utilizing other hourly or 10 minute sources to mitigate adverse balancing and reliability effects. This will apply to either increasing or decreasing load requirements.

A System operator will often have a need to appraise what resources have been planned for some near short term future hours. This can be the result of unplanned outages of generators, internal transmission lines, interconnection transmission lines and other events. This application gives a little longer look than the Hour Ahead program in respect to Ancillary Services Regulation.

Similar to the Hour Ahead function, the monitoring associated with this module is focused on those regulation ancillary services that were attained from the Day Ahead Market only and will display relative comparisons of actual performance vs. market bids in these regulation services.

Historical performance data for the past day and week will be available in the displays of this module. This data could be used in conjunction with the Hour Ahead Performance by comparing records for various validations or determinations between the two markets. They can also be shared with the suppliers for improved quality of service or included in the payment structure for performance penalties. The power grid management system may also allow the user, using historical performance data, to predict the performance of the day ahead committed resources of ancillary services for regulation by choosing the display option of Day Ahead Market.

Based on NERC current reliability guides, drafts standards for NERC and WECC Frequency Response Reserves (FRR) and input from the CAISO's system operators and management, the key functional capabilities for the power grid monitoring and management system for CAISO may include one or more of: 1) performance monitoring of CAISO's CA and suppliers to AGC; 2) performance monitoring of CAISO's CA and suppliers to FRR; and 3) performance monitoring for CAISO's CA and suppliers to Hourly and Day-Ahead Ancillary Service Regulation.

The Control Area's frequency response performance is the result of how good or bad all the frequency responsive resources connected to its transmission system perform. The challenge for the Control Area is how to determine the actual performance of each resource vs. expectations.

Although this application has the ability and will evaluate the Control Area performance to determine compliance with the FRR Standards, the primary focus of the application is to monitor and track the actual performance of the individual frequency responsive resources connected to the grid. As stated above, it is the performance of each and every resource connected to the CAISO's grid that will determine the Control Area's overall frequency regulation performance.

The purpose of the proposed application is to provide sufficient and meaningful information for the CAISO management and staff to: 1) maintain system reliability and ensure compliance with NERC and WECC reliability standards, by monitoring in real time the response performance of CAISO's CA and suppliers to the AGC, FRR and A.S.; and 2) improve the efficiency of the A.S. market. The Table 1 below, for example, shows functionalities in an exemplary embodiment according to the present application.

TABLE 1

Overview of Functionalities

| Function | Service | | |
|---|---|---|---|
| | CA&Suppliers Response to AGC | CA&Suppliers Response to FRR | CA&Suppliers Response to A.S. |
| Monitoring | Scheduled vs actual response in last one-minute interval Performance Indices | Expected vs actual response in last frequency excursion Performance Index | Last Bid vs actual response Performance Index |
| Tracking | Previous hour, day and week scheduled vs actual response | History of Deviations (MW/0.175 Hz) performance to | Last day supplier response to A.S. markets Last week |

TABLE 1-continued

Overview of Functionalities

| Function | Service | | |
|---|---|---|---|
| | CA&Suppliers Response to AGC | CA&Suppliers Response to FRR | CA&Suppliers Response to A.S. |
| | Historical Performance Index | frequency excursions of CA and suppliers Historical Performance Index | supplier response to A.S. markets Historical Performance Index |
| Predictions and Probability bands | 10 Minutes Ahead 20 Minutes Ahead 40 Minutes Ahead 1 hour ahead Probability bands Bad data identification and replacement | Next frequency excursion, twenty and sixty seconds response Probability bands Bad data identification and replacement | 1, 2, 3 and 4 hours ahead for hour market Day ahead market Probability bands Bad data identification and replacement |

It should be noted that the tracking function may serve as a simulation tool.

In monitoring the response performance to AGC of CAISO CA and suppliers, the system operator may first look at the display of the one-minute supplier control error for each resource. A pie graph may be presented for each resource that is being monitored. Part of the pie indicates the expected response, other part the actual response and the last part the difference between the actual and the expected response. The pie will be color coded to indicate the performance of the generator response for the last one-minute period. The cylinder height, also color-coded, represents the performance index. The performance indices are defined herein later on.

For the tracking of the response performance to AGC of CAISO CA and suppliers, the system operator has a chart available with the historical values for the period that he/she specifies. The response prediction may also be offered to the System operator, for the next 10, 20, 40 and/or 60 minutes.

The system operator may then use these three pieces of information to decide how much to rely on each resource for AGC. For example, suppose actual part of the pie is red and the cylinder height is red. This means that the supplier is performing poorly recently. Analysis of the historical performance (tracking function) provides additional information to decide how reliable the supplier is. If the historical performance is poor, the forecast will also be poor. The System operator will integrate all this information to decide on a course of action for the resource under consideration.

Similar functionality will be offered for monitoring, tracking and predicting the response performance of CAISO CA and suppliers to FRR. Instead of one-minute values as in the resource response to AGC, however, the resource response to the historical average to frequency excursions may be displayed. Each supplier may be represented by two color-coded pies and a cylinder. The pie indicates the generator FRR actual response to the last frequency excursion and its expected response. The height of the cylinder may, for example, represent the performance index of the generator.

The functionality offered for monitoring, tracking and predicting the response performance to A.S. markets (hourly and daily) may, once again, be similar to the one of the previous two applications. Each supplier is represented by two color-coded pies and a cylinder. The pie represents the most recent response for the day ahead and hour ahead bids and the bids made by the suppliers in the A.S. markets. The cylinder height represents, as before, the performance index.

Figure 33:
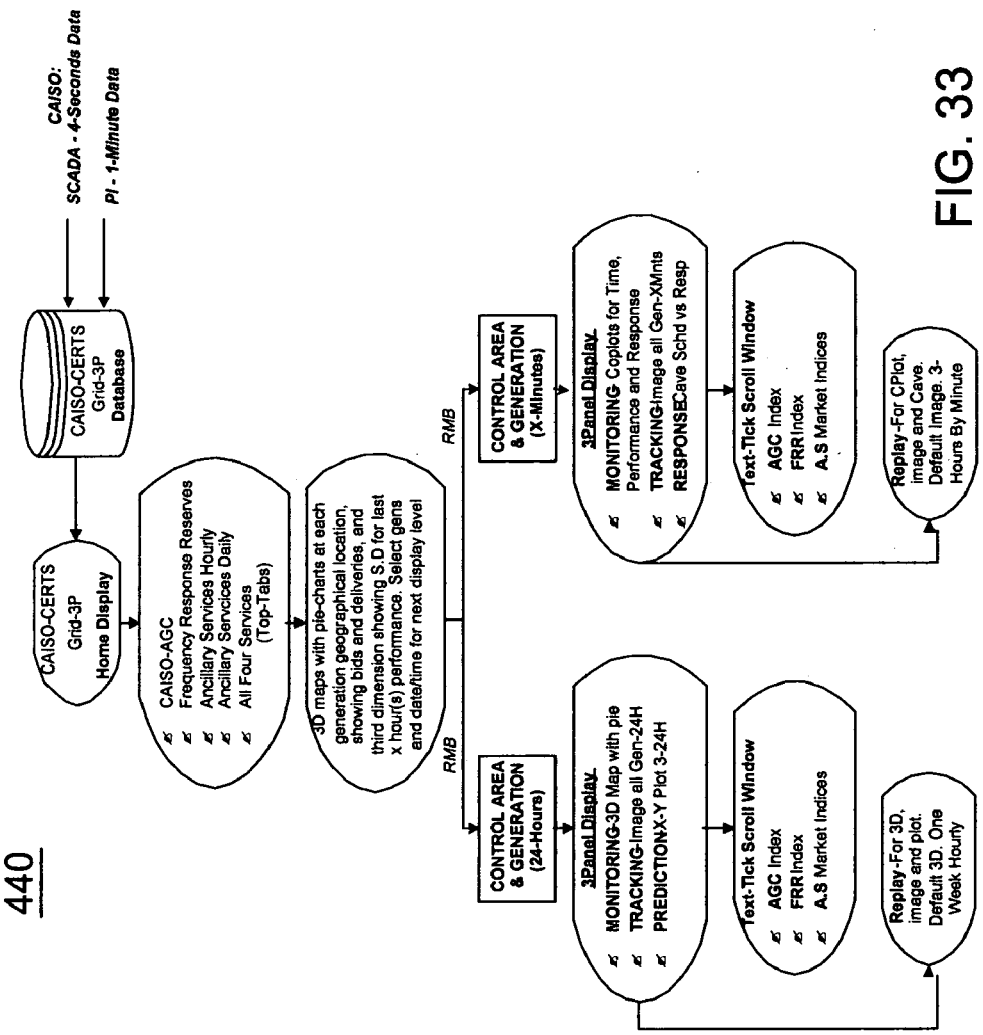
FIG. 33 illustrates a Control Area and suppliers performance monitoring and prediction platform for AGC, FRR and regulation A.S. in an exemplary embodiment according to the present invention.

FIG. 33 illustrates a geographic-graphic visualization overview 440 of a control area and suppliers performance monitoring and prediction platform for AGC, FRR and regulation A.S. in an exemplary embodiment according to the present invention. As shown in FIG. 33, the CAISO System operator will have available displays to monitor for the current time, last 24-hours and last X-minutes (default 10-minutes) both their CA and the individual suppliers response performance, forecast and tracking performance of CAISO AGC, Frequency Response Reserves (FRR), and hourly and daily Regulation Ancillary Services markets. In addition, besides having CA and suppliers performances for each service, CAISO System operators will also have available an integrated window that will show continuously the CA and suppliers performance for all four services simultaneously, and replay capability for displays on either of the panels from the 3-panel displays.

This application of the power grid management system allows the CAISO System operators and management to identify via 3-panel displays the CA and suppliers performance for each service on geographical displays for current time, the last ten minutes on co-plot displays, and for the past 24-hours on image-displays and user selected suppliers predictive performance. The bottom of the 3-panel displays will be user selectable, to switch from tabular text window correlated with the data in the 3 panels, to optionally show to System operators in a continuous horizontally scrollable window, the performance indices for AGC, FRR and regulation ancillary services. The indices will replay continuously for a selectable period of time that will include the prediction period.

Figure 34:
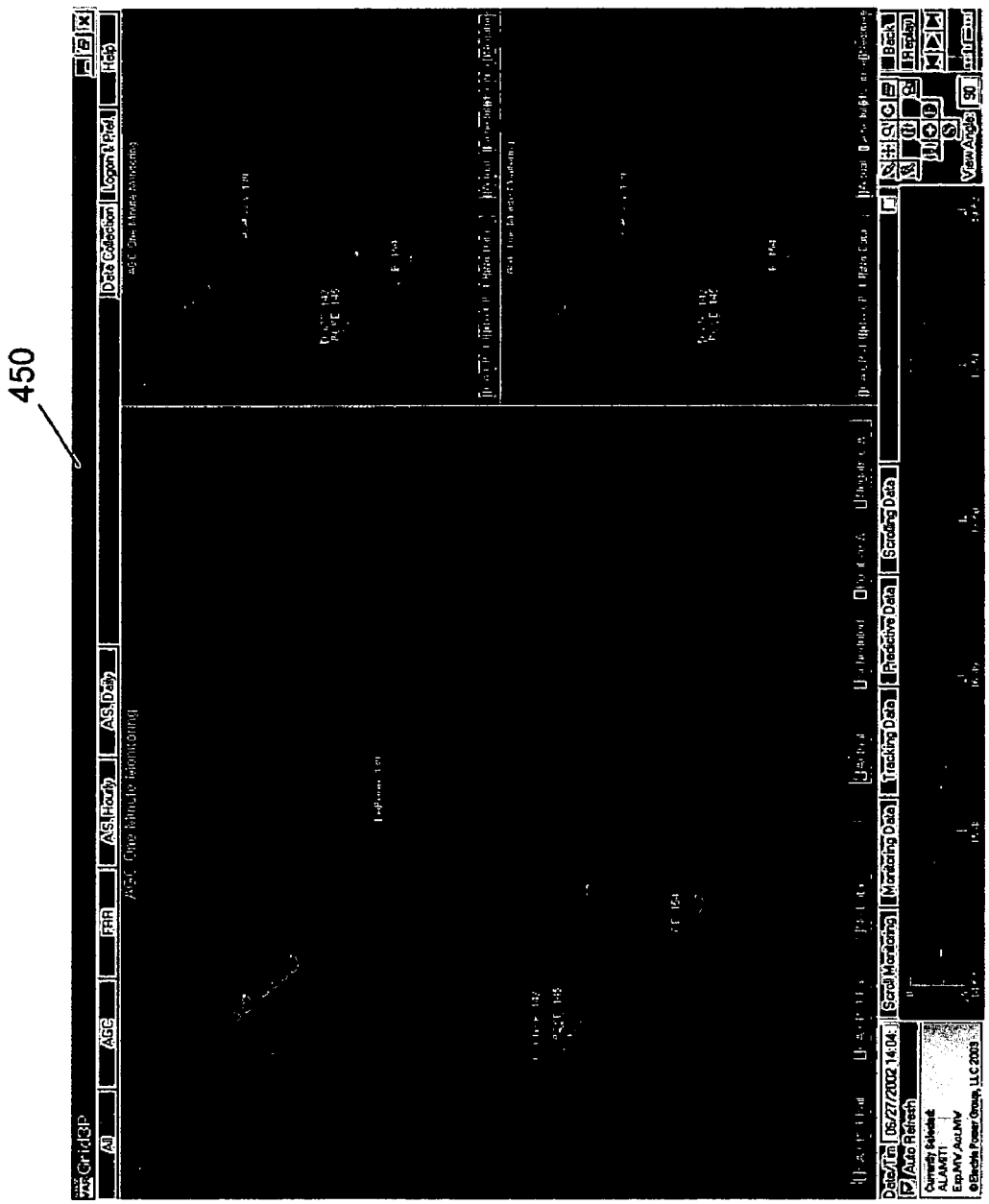
FIG. 34 is a screen shot of a panel view for control area and suppliers performance for, AGC, FRR and A.S. in an exemplary embodiment according to the present invention.

FIG. 34 is a screen shot 450 of a panel view for control area and suppliers performance for, AGC, FRR and A.S. in an exemplary embodiment according to the present invention. Its can be seen in FIG. 34 that there are five tabs at the top-left corner. Each of them presents a 3-panel display with the main panel, showing in a 3D map, the selected suppliers performance for the service selected and the other two panels showing the selected suppliers performance for the other two services. The three tabs at the top-right present the window for username/password, interface for user enterable parameters, and the help displays. The help displays, for example, may be based on Microsoft® PowerPoint® presentations.

The map and the cylinder pie-charts in the main panel display from the 3-panel display in FIG. 34 shows the current response of each supplier, selected from categorical options from a RMB menu, to the service selected from the tab. The other two panels also show the performance of the selected generators for the other two services.

Figure 35:
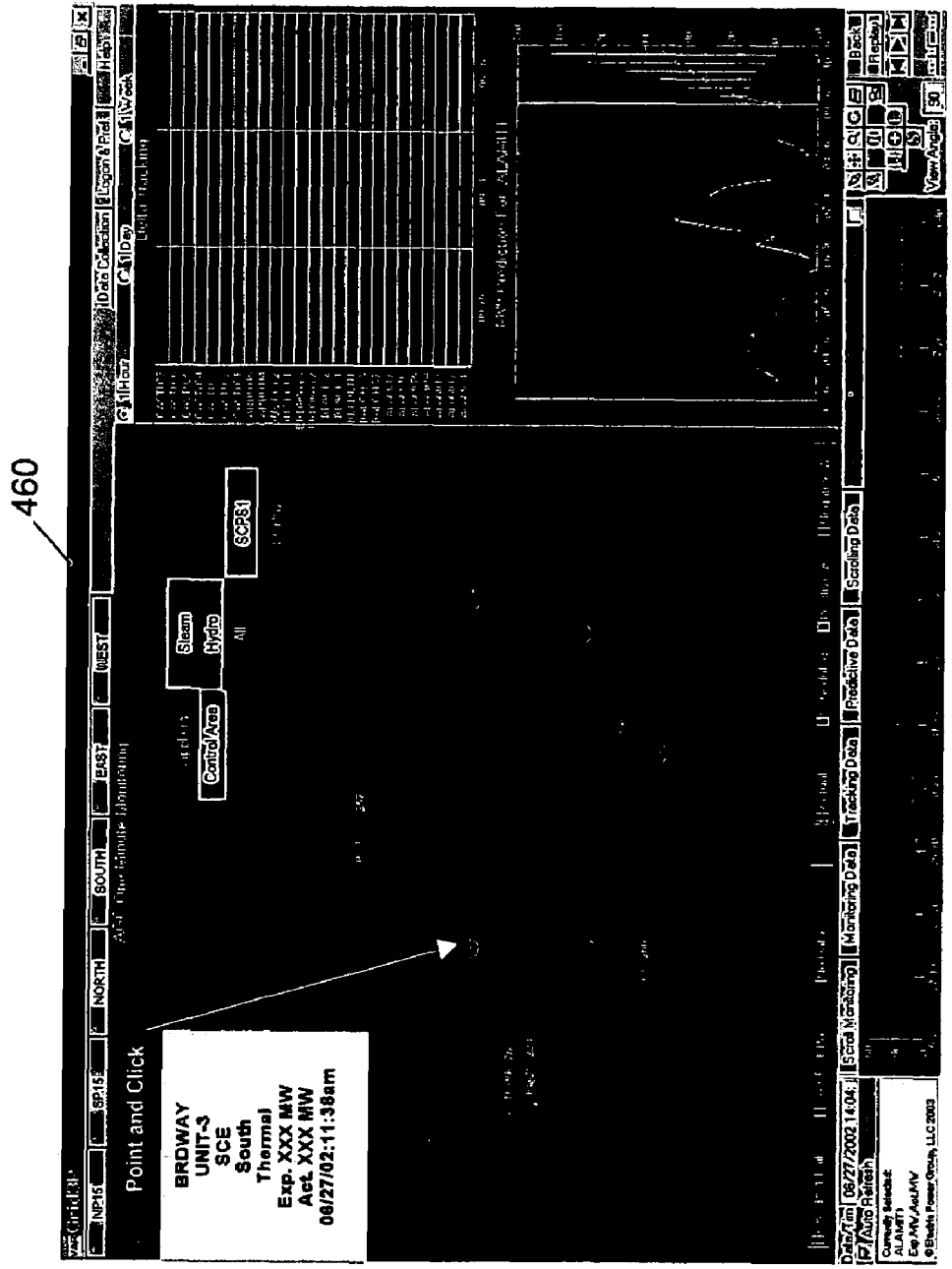
FIG. 35 is a screen shot of a panel view for Control Area and generator response to AGC in an exemplary embodiment according to the present invention.

The center-bottom of the 3-panel displays is user selectable to switch from tabular text window correlated with the data in the 3 panels, to optionally show to System operators continuously in a horizontally scrollable window the performance indices for AGC, FRR and regulation ancillary services. The indices will replay continuously for a selectable period of time that includes the prediction period. The three windows at the left-bottom of the screen contain the date/time for the data being displayed, an option to hold the automatic data refresh, and a yellow window to indicate the current action taken by the user FIG. 35 is a screen shot 460 of a panel view for control area and generator response to AGC in an exemplary embodiment according to the present invention. FIG. 35 shows the 3D map and cylindrical pie-charts in the main panel display from the 3-panel display representing the current response of each generator, selected from categorical options from an RMB menu, to AGC, with the cylinder-height representing each generator performance index. The color of the CAISO control area may represent the response to AGC of all the suppliers providing the control area, represented by the performance indices previously discussed herein.

The image on the top-right panel shows the performance tracking of each of the suppliers online, selected from the RMB option, and may be color coded for the last 24-hours. The plot on the bottom-right panel shows the predictive plot. This plot includes a multi-series, time-based, linear chart. One series represents the recorded values of a variable over time and the second represents the predicted value for the same variable over the time period and for X additional predicted values. The plot also includes a vertical reference-line indicating the current time, relative to the time period being displayed. Multiple instances of this plot are used in the display, as illustrated, and the user selects the values for display via an options dialog.

The center-bottom of the 3-panel displays will be user selectable to switch from tabular text window correlated with the data in the 3 panels, to optionally show to system operators continuously in a horizontally scrollable window the performance indices for AGC, FRR and regulation ancillary services. The indices will replay continuously for a selectable period of time and will include the prediction period.

The three windows at the left-bottom of the screen contain the date/time for the data being displayed, an option to hold the automatic data refresh, and a yellow-window to indicate the current action taken by the user.

The two main windows at the right-bottom of the screen contain the navigation buttons that must be implemented as shown, and the replay bottoms that also must be implemented as shown.

The three tabs at the top-right present the window for username/password, windows for user enterable parameters, and the help displays based on Microsoft® PowerPoint® presentations.

Figure 36:
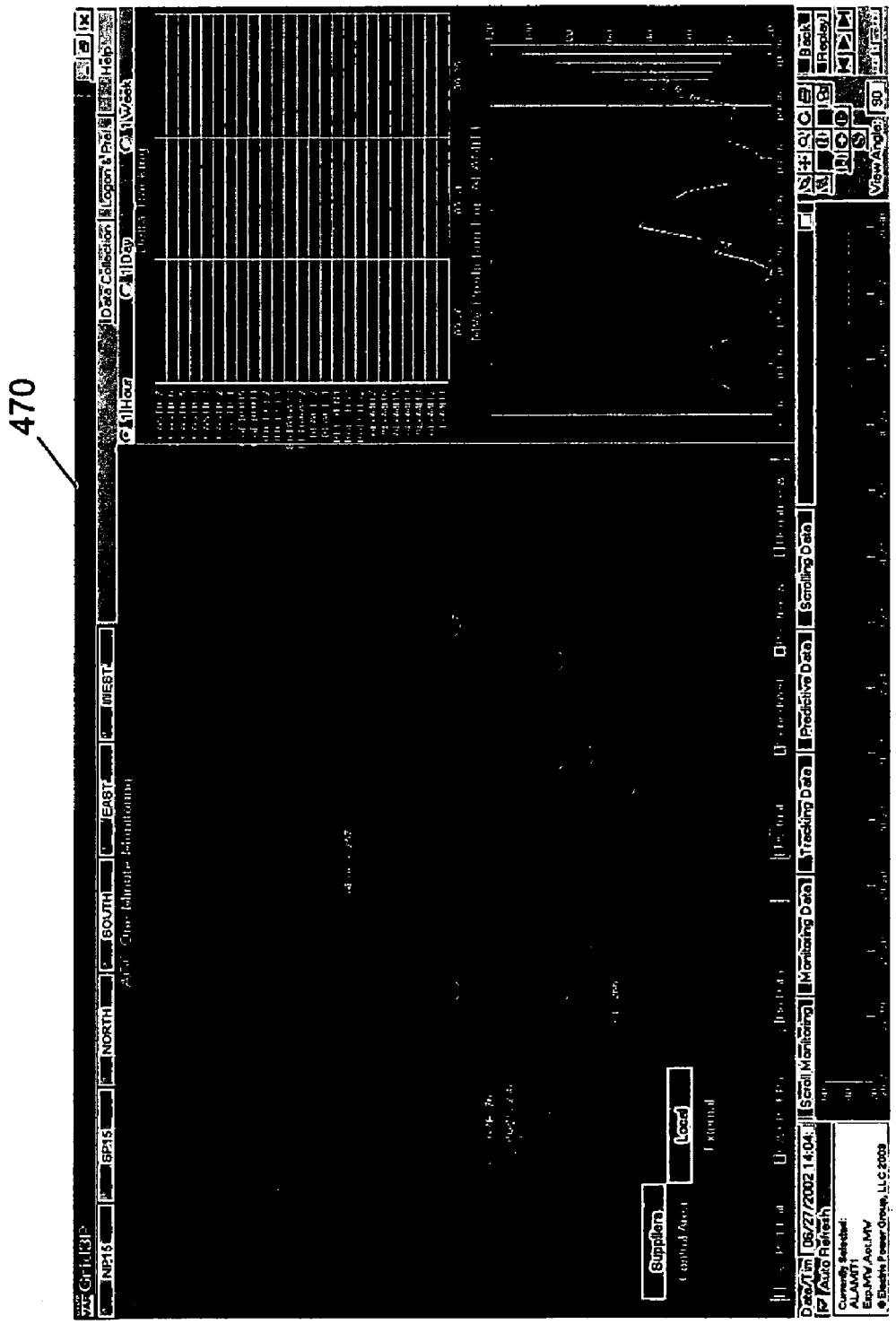
FIG. 36 is a screen shot for a panel view for Control Area and generators response to frequency response in an exemplary embodiment according to the present invention.

FIG. 36 is a screen shot 470 for a panel view for control area and generators response to frequency response in an exemplary embodiment according to the present invention. FIG. 39 above shows the CAISO geographic map and color coded cylindrical pies placed at the geographic location of each selected generator, with part of the pie representing the generator latest FRR response, the other part its expected FRR value and the last part the difference between actual and expected response. The height of the cylinder represents the FRR performance index for each selected generator.

The plot on the top-right panel shows the FRR performance tracking of each of the generators online, selected from the RMB option during the most recent frequency disturbances. The plot on the bottom-right shows the current selected generators FRR performance together with its performance variance for the hour, and the value predicted for the next excursion.

Figure 37:
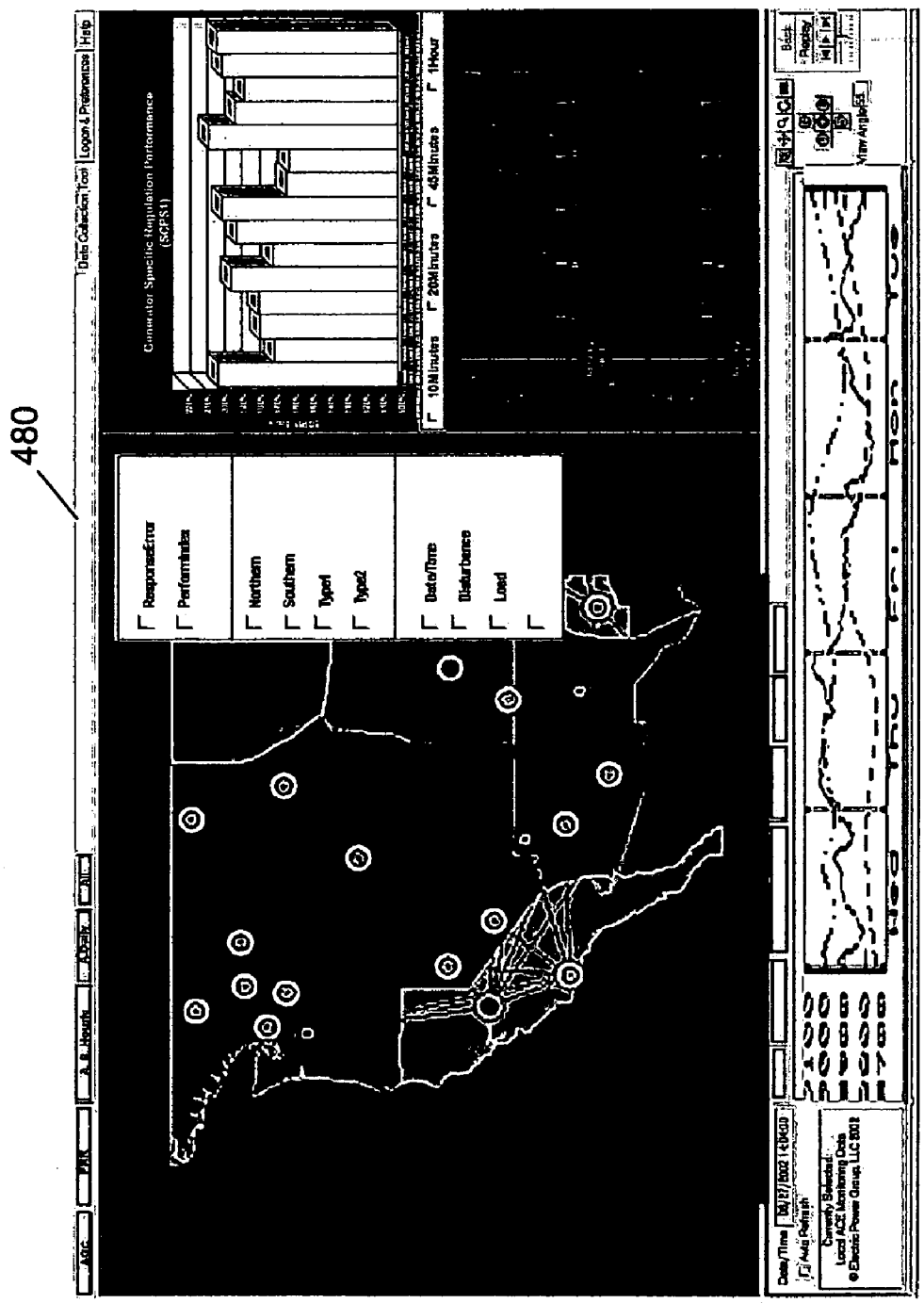
FIG. 37 is a screen shot for a panel view for Control Area and generators response to regulation A.S. in an exemplary embodiment according to the present invention.

FIG. 37 is a screen shot 480 for a panel view for control area and generators response to regulation A.S. in an exemplary embodiment according to the present invention. FIG. 40 shows the CAISO geographic map and two concentric circles located at the geographic location of each selected generator, with the inner most circle representing the generator actual response for both the day-ahead and hour-ahead bids, and the outer most circle representing its Ancillary Service (both day-ahead and hourly-ahead) scheduled values. The height of the cylinder represents the Ancillary Services (day-ahead and hour ahead) performance indices for each selected generator.

The image on the top-right panel shows the Supplier Control Performance System (SCPS) for each of the generators selected, color-coded for the last X-Minutes (default 10-minutes). The plot on the bottom-right panel shows the predictive plot. This plot consists of a multi-series, time-based, linear chart. One series represents the recorded values of a variable over time and the second represents the predicted value for the same variable over the time period and for X additional predicted values. The plot also includes a vertical reference-line indicating the current time, relative to the time period being displayed. Multiple instances of this plot are used in the display, as illustrated, and the user selects the values for display via an options dialog.

Figure 38:
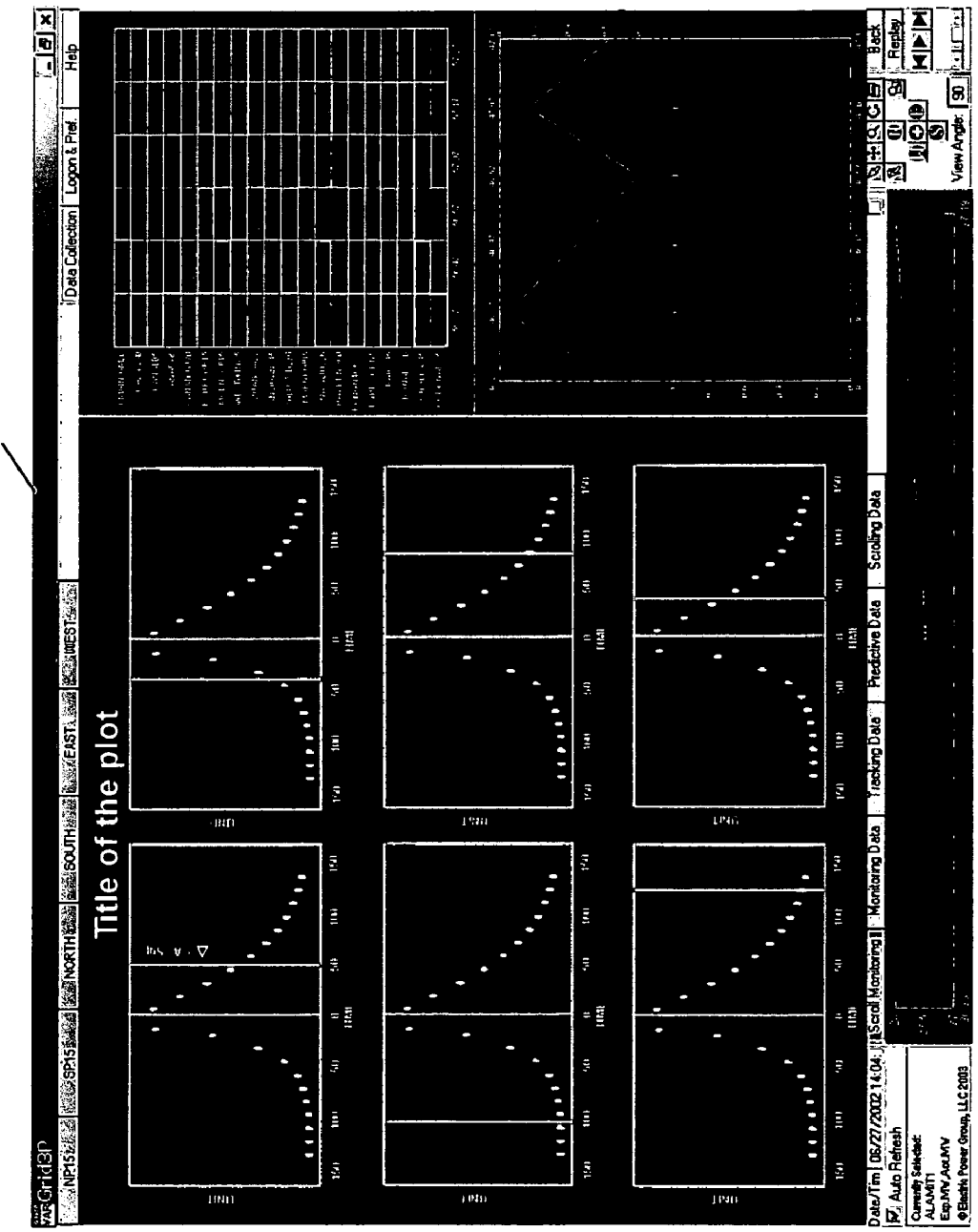
FIG. 38 is a screen shot of a common view for performance of AGC, FRR and X-minutes ancillary services regulation (default 10 minutes) in an exemplary embodiment according to the present invention.

FIG. 38 is a screen shot 490 of a common view for performance of AGC, FRR and X-Minutes Ancillary Services Regulation (Default 10-Minutes) in an exemplary embodiment according to the present invention. The format of FIG. 38 is equivalent for all three services using the corresponding performance data and indices. The main-panel shows the condition plot. It is similar to a scatter plot, created using the variables of one of the three services, the parameters of one of the three services and the names of the selected generators for a configurable, 10 minute time period (at 1 minute sampling frequency).

The following describes how the chart should be created as shown in FIG. 38 in an exemplary embodiment according to the present invention.

1) Run the appropriate database stored procedure.

2) Determine from the user interface the value to perform grouping, by performance, parameter or time.

3) Determine the unique grouping values.

4) Determine the median parameter value for each generator (using the whole dataset) and order the generator list by that value.

5) Create a scatter plot for each unique grouping value, with the data value plotted on the X-axis. Each scatter point is colored according to a color map defined in a configuration file (Red/Yellow/Green).

6) The scatter plots will be arranged on a grid by increasing value, left to right, top to bottom.

The image on the top-right panel shows the performance index for each generator selected, color-coded for the last X-Minutes (default 10-minutes). The cave-plot at the bottom-right shows at the top the response MW of any generator selected from the image-plot, and at the bottom scheduled MW for the selected generator.

It will be appreciated by those of ordinary skill in the art that the invention can be embodied in other specific forms without departing from the spirit or essential character thereof. The present invention is therefore considered in all respects to be illustrative and not restrictive. The scope of the present invention is indicated by the appended claims, and all changes that come within the meaning and range of equivalents thereof are intended to be embraced therein.

What is claimed is:

1. A real-time performance monitoring system for monitoring an electric power grid, comprising:

a monitor computer for monitoring at least one of reliability metrics, power grid operations metrics, generation metrics, transmission metrics, suppliers metrics, grid infrastructure security metrics or markets metrics over a plurality of control areas of the electric power grid operated on a plurality of different platforms by a plurality of different business systems or companies;

a database for storing the metrics being monitored by the monitor computer; and at least one display computer in at least one of said plurality of control areas of the electric power grid, the at least one display computer having a monitor for displaying a visualization of the metrics being monitored by the monitor computer, said at least one display computer in one of said plurality of control areas being adapted to enable an operator located in and responsible for monitoring the one of said plurality of control areas to monitor one or more of said plurality of control areas that are different from the control area in which the operator is located.

2. The real-time performance monitoring system of claim 1, wherein the monitor computer includes an application for monitoring the reliability metrics, and wherein said application performs real-time monitoring of at least one of voltage/VAR (volt-ampere reactive), ACE (area control error)-frequency, AIE (area interchange error) schedule or phasor measurements for the electric power grid or a portion thereof or for one or more of said plurality of control areas, wherein the electric power grid covers a wide area across one or more cities, counties, states or countries.

3. The real-time performance monitoring system of claim 1, wherein the monitor computer includes an application for monitoring the generation metrics, and wherein said application performs real-time monitoring of at least one of suppliers and control area responses to at least one of AGC (automatic generation control), a frequency response, ancillary services or a ramping response.

4. The real-time performance monitoring system of claim 1, wherein the monitor computer includes an application for monitoring the grid infrastructure security metrics, and wherein said application performs real-time monitoring of at least one of system vulnerability including phasor measurements and changes thereof or exposure in terms of at least one of population or cities.

5. The real-time performance monitoring system of claim 1, wherein the monitor computer includes an application for monitoring the markets metrics, wherein said application performs real-time monitoring of at least one of generation market power or price spikes.

6. The real-time performance monitoring system of claim 1, wherein at least one of the monitor computer or said at least one display computer performs at least one of historical tracking, prediction or actions related to the metrics being monitored, wherein the actions related to the metrics being monitored include actions related to one or more violations of one or more predefined thresholds, wherein the one or more violations are communicated in real time through alarms or other communication systems.

7. The real-time performance monitoring system of claim 6, wherein the monitor displays a visualization of data representing said at least one of historical tracking, prediction or actions related to the metrics being monitored.

8. The real-time performance monitoring system of claim 6, wherein the prediction includes at least one of a near real-time forecasting or a "what if" sensitivity analysis.

9. The real-time performance monitoring system of claim 1, wherein the monitor concurrently displays at least one dynamic geographic display and a plurality of data or text panels for at least one of monitoring, tracking, prediction, actions or mitigations.

10. The real-time performance monitoring system of claim 1, wherein the monitoring of the metrics can be performed real-time and/or near real-time.

11. The real-time performance monitoring system of claim 1, wherein the monitoring system utilizes data from or is integrated with at least one of SCADA (Security Control and Data Acquisition), EMS (Energy Management System), PMUs-PDCs (phasor measurement units-phasor data concentrators) or another control power system.

12. The real-time performance monitoring system of claim 1, wherein an operator of at least one of the monitor computer or said at least one display computer can define an application to monitor metrics, which are related to the electric power grid at the local level, control area level, or regional level covering a wide area, which the operator desires to monitor.

13. The real-time performance monitoring system of claim 1, wherein a display format of the visualization on the monitor can be customized by the operator.

14. The real-time performance monitoring system of claim 1, wherein the monitor computer is a server and said at least one display computer comprises a client in a server-client architecture.

15. The real-time performance monitoring system of claim 1, wherein the monitor computer is a dedicated server.

16. The real-time performance monitoring system of claim 1, wherein the monitor computer and said at least one display computer communicate with each other in a web environment or over a secure proprietary network.

17. The real-time performance monitoring system of claim 1, wherein the operator of said at least one display computer can interactively collect historical data and view a visualization of the historical data in tabular, graphics or a customized format.

18. The real-time performance monitoring system of claim 1, wherein the operator of said at least one display computer can interactively create data reports from the metrics stored in the database.

19. The real-time performance monitoring system of claim 1, wherein the monitor computer monitors proximity to potential system faults, and said at least one display computer graphically represents the proximity to potential system faults on the monitor.

20. The real-time performance monitoring system of claim 1, wherein the monitor computer tracks, identifies and saves data on abnormal operating patterns in the database, and the display computer displays a visualization of the abnormal operating patterns on the monitor.

21. The real-time performance monitoring system of claim 1, wherein said at least one display computer enables the operator to define a display level to at least one of the electric power grid, one said control area or multiple said control areas.

22. The real-time performance monitoring system of claim 1, wherein said at least one display computer in one of a plurality of control areas enables the operator in the one of said plurality of control areas to manage at least one grid portion corresponding to a different one of said plurality of control areas.

23. The real-time performance monitoring system of claim 1, wherein the monitor computer performs wide area monitoring of the electric power grid using SCADA (Security Control and Data Acquisition) data and/or time synchronized data from phasors or other sources.

24. The real-time performance monitoring system of claim 1:
  wherein the reliability metrics, power grid operations metrics, generation metrics, transmission metrics, suppliers metrics, grid infrastructure security metrics or markets metrics for the electric power grid are monitored across a wide area covering multiple control areas and utilities;
  wherein each of the plurality of grid portions includes a network of high voltage transmission lines and generators interconnected to the network that is spread out over the multiple control areas across the wide area;
  wherein the plurality of grid portions are subject to power blackouts that spread or cascade over the wide area; and
  wherein the operator is a reliability coordinator having responsibility to:
    monitor the power grid metrics over the wide area for reliability management; and
    prevent power blackouts that spread or cascade over the wide area.

* * * * *